United States Patent
Onuki et al.

(10) Patent No.: US 12,183,415 B2
(45) Date of Patent: Dec. 31, 2024

(54) MEMORY DEVICE

(71) Applicant: SEMICONDUCTOR ENERGY LABORATORY CO., LTD., Atsugi (JP)

(72) Inventors: Tatsuya Onuki, Kanagawa (JP); Shuhei Nagatsuka, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/203,717

(22) Filed: May 31, 2023

(65) Prior Publication Data

US 2023/0307012 A1    Sep. 28, 2023

Related U.S. Application Data

(63) Continuation of application No. 17/505,110, filed on Oct. 19, 2021, now Pat. No. 11,699,465, which is a
(Continued)

(30) Foreign Application Priority Data

Jun. 27, 2017 (JP) .................. 2017-125017
Aug. 1, 2017 (JP) .................. 2017-148839

(51) Int. Cl.
    *G11C 5/06*        (2006.01)
    *G11C 7/10*        (2006.01)
    (Continued)

(52) U.S. Cl.
    CPC ............ *G11C 5/063* (2013.01); *G11C 7/1051* (2013.01); *G11C 11/4074* (2013.01);
    (Continued)

(58) Field of Classification Search
    CPC ... G11C 5/063; G11C 7/1051; G11C 11/4074; G11C 11/4091; H10B 12/30; H10B 12/50; H01L 29/7839
    See application file for complete search history.

(56) References Cited

U.S. PATENT DOCUMENTS 4,264,872 A    4/1981  Suzuki
5,202,854 A    4/1993  Koike
(Continued)

FOREIGN PATENT DOCUMENTS

EP        0474238 A      3/1992
JP        52-108743 A    9/1977
(Continued)

OTHER PUBLICATIONS

International Search Report (Application No. PCT/IB2018/054482) Dated Oct. 9, 2018.
(Continued)

*Primary Examiner* — Son L Mai
(74) *Attorney, Agent, or Firm* — Fish & Richardson P.C.

(57) ABSTRACT

A memory device that operates at high speed is provided. The memory device includes first and second memory cells, first and second bit lines, first and second switches, and a sense amplifier. The sense amplifier comprises a first node and a second node. The first memory cell is electrically connected to the first node through the first bit line and the first switch, and the second memory cell is electrically connected to the second node through the second bit line and the second switch. The sense amplifier amplifies the potential difference between the first node and the second node. The first memory cell and the second memory cell include an oxide semiconductor in a channel formation region.

3 Claims, 24 Drawing Sheets

Related U.S. Application Data continuation of application No. 16/625,826, filed as application No. PCT/IB2018/054482 on Jun. 19, 2018, now Pat. No. 11,205,461.

(51) Int. Cl.
  *G11C 11/4074* (2006.01)
  *G11C 11/4091* (2006.01)
  *H01L 29/786* (2006.01)
  *H10B 12/00* (2023.01)

(52) U.S. Cl.
  CPC ...... *G11C 11/4091* (2013.01); *H01L 29/7869* (2013.01); *H10B 12/30* (2023.02); *H10B 12/50* (2023.02)

(56) References Cited

U.S. PATENT DOCUMENTS

| | | |
|---|---|---|
| 6,426,905 B1 | 7/2002 | Dennard et al. |
| 6,438,042 B1 | 8/2002 | Kang et al. |
| 6,967,883 B2 | 11/2005 | Hira et al. |
| 7,139,187 B2 * | 11/2006 | Suzuki .................. G11C 11/22 365/207 |
| 7,660,184 B2 | 2/2010 | Kobayashi |
| 7,674,650 B2 | 3/2010 | Akimoto et al. |
| 7,692,986 B2 | 4/2010 | Kajigaya |
| 7,760,567 B2 | 7/2010 | Kobayashi |
| 8,045,360 B2 | 10/2011 | Kajigaya |
| 8,116,112 B2 | 2/2012 | Miyakawa et al. |
| 8,310,887 B2 | 11/2012 | Kajigaya |
| 8,462,573 B2 | 6/2013 | Choi |
| 8,472,273 B2 | 6/2013 | Takayama et al. |
| 8,780,664 B2 | 7/2014 | Choi |
| 8,964,478 B2 | 2/2015 | Takayama et al. |
| 9,042,161 B2 | 5/2015 | Koyama et al. |
| 9,263,116 B2 | 2/2016 | Koyama et al. |
| 9,368,501 B2 | 6/2016 | Yamazaki et al. |
| 9,378,781 B1 | 6/2016 | Jung et al. |
| 9,542,977 B2 | 1/2017 | Onuki et al. |
| 9,607,991 B2 | 3/2017 | Aoki |
| 9,627,034 B2 | 4/2017 | Matsuzaki |
| 9,704,562 B2 | 7/2017 | Onuki et al. |
| 10,019,025 B2 | 7/2018 | Yamazaki |
| 10,032,492 B2 | 7/2018 | Onuki |
| 10,236,884 B2 | 3/2019 | Ishizu et al. |
| 10,304,523 B2 | 5/2019 | Kato et al. |
| 11,120,764 B2 * | 9/2021 | Takahashi ............... G09G 5/393 |
| 2007/0153600 A1 | 7/2007 | Yuan et al. |
| 2009/0147596 A1 | 6/2009 | Shiah |
| 2010/0054064 A1 | 3/2010 | Miyakawa et al. |
| 2011/0292709 A1 | 12/2011 | Takayama et al. |
| 2012/0026818 A1 | 2/2012 | Chen et al. |
| 2012/0257448 A1 | 10/2012 | Ong |
| 2016/0163374 A1 | 6/2016 | Koyama et al. |
| 2017/0033109 A1 | 2/2017 | Yamazaki |
| 2017/0084322 A1 | 3/2017 | Wang et al. |

FOREIGN PATENT DOCUMENTS

| | | |
|---|---|---|
| JP | 55-072863 A | 6/1980 |
| JP | 04-114395 A | 4/1992 |
| JP | 11-053884 A | 2/1999 |
| JP | 2002-025268 A | 1/2002 |
| JP | 2004-062940 A | 2/2004 |
| JP | 2007-123861 A | 5/2007 |
| JP | 2009-259379 A | 11/2009 |
| JP | 2010-061734 A | 3/2010 |
| JP | 2011-248971 A | 12/2011 |
| JP | 2013-531860 | 8/2013 |
| JP | 2017-028237 A | 2/2017 |
| JP | 2017-034243 A | 2/2017 |
| KR | 2013-0119421 A | 10/2013 |
| KR | 2017-0015179 A | 2/2017 |
| TW | 201712809 | 4/2017 |
| WO | WO-2007/110933 | 10/2007 |
| WO | WO-2011/153608 | 12/2011 |
| WO | WO-2012/036001 | 3/2012 |

OTHER PUBLICATIONS

Written Opinion (Application No. PCT/IB2018/054482) Dated Oct. 9, 2018.

* cited by examiner

MEMORY DEVICE

CROSS REFERENCE TO RELATED APPLICATIONS

This application is a continuation of U.S. application Ser. No. 17/505,110, filed Oct. 19, 2021, now allowed, which is incorporated by reference and is a continuation of U.S. application Ser. No. 16/625,826, filed Dec. 23, 2019, now U.S. Pat. No. 11,205,461, which is incorporated by reference and is a U.S. National Phase Application under 35 U.S.C. § 371 of International Application PCT/IB2018/054482, filed on Jun. 19, 2018, which is incorporated by reference, and which claims the benefit of foreign priority applications filed in Japan on Jun. 27, 2017, as Application No. 2017-125017, and on Aug. 1, 2017, as Application No. 2017-148839.

TECHNICAL FIELD

One embodiment of the present invention relates to a memory device, a semiconductor device, or electronic devices using these devices.

Furthermore, one embodiment of the present invention relates to an object, a method, or a manufacturing method. One embodiment of the present invention relates to a process, a machine, manufacture, or a composition of matter.

Note that a semiconductor device in this specification and the like refers to every device that can operate by utilizing semiconductor characteristics. A memory device, a display device, a light-emitting apparatus, an electro-optical device, a power storage device, a semiconductor circuit, and an electronic device include a semiconductor device in some cases.

BACKGROUND ART

In recent years, transistors using oxide semiconductors or metal oxides in their regions where a channel is formed (hereinafter referred to as a channel formation region) (Oxide Semiconductor transistors, hereinafter referred to as OS transistors) have attracted attention (Patent Document 1).

Patent Document 2 discloses an example in which an OS transistor is used in a DRAM (Dynamic Random Access Memory). The OS transistor has an extremely low leakage current in an off state (off-state current), and thus enables fabrication of a low-power-consumption memory having long refresh intervals. A DRAM using an OS transistor is referred to as a DOSRAM (registered trademark) in some cases. DOSRAM is an abbreviation of "Dynamic Oxide Semiconductor RAM" and includes a 1T (transistor) 1C (capacitor) memory cell.

PRIOR ART DOCUMENTS

Patent Document

[Patent Document 1] Japanese Published Patent Application No. 2007-123861
[Patent Document 2] Japanese Published Patent Application No. 2017-28237

SUMMARY OF THE INVENTION

Problems to be Solved by the Invention

In the memory device described in Patent Document 2, bit lines are connected to gates of transistors included in sense amplifiers. The transistors used in the sense amplifiers have a large size to inhibit variations; accordingly, gate capacitance is also large. Thus, parasitic capacitance added to the bit lines is large, so that a decrease in operation speed and malfunction of the memory device are caused.

An object of one embodiment of the present invention is to provide a memory device that operates at high speed. Another object of one embodiment of the present invention is to provide a highly reliable memory device. Another object of one embodiment of the present invention is to provide a memory device with low power consumption. Another object of one embodiment of the present invention is to provide a novel semiconductor device.

Note that objects of one embodiment of the present invention are not limited to the objects listed above. The objects listed above do not preclude the existence of other objects. The other objects are objects that are not described in this section and will be described below. The other objects not described in this section will be apparent from and can be derived as appropriate from the descriptions of the specification, the drawings, and the like by those skilled in the art. One embodiment of the present invention achieves at least one of the descriptions given above and other objects. One embodiment of the present invention does not need to solve all the objects of the aforementioned descriptions and the other objects.

Means for Solving the Problems

One embodiment of the present invention is a memory device including a first memory cell, a second memory cell, a first wiring, a second wiring, a first switch, a second switch, and a sense amplifier; the first memory cell includes a first transistor and a first capacitor; one of a source and a drain of the first transistor is electrically connected to the first wiring; the other of the source and the drain of the first transistor is electrically connected to the first capacitor; the second memory cell includes a second transistor and a second capacitor; one of a source and a drain of the second transistor is electrically connected to the second wiring; the other of the source and the drain of the second transistor is electrically connected to the second capacitor; the sense amplifier includes a first node and a second node; the first wiring is electrically connected to the first node through the first switch; the second wiring is electrically connected to the second node through the second switch; and the sense amplifier amplifies a potential difference between the first node and the second node.

In the above embodiment, the first switch and the second switch may include a transistor.

In the above embodiment, the first switch and the second switch may be composed of an n-channel transistor, and the sense amplifier may be composed of a single-polarity circuit using an n-channel transistor.

In the above embodiment, the first transistor and the second transistor may include an oxide semiconductor in a channel formation region.

In the above embodiment, the first memory cell and the second memory cell may be provided above the sense amplifier.

In the above embodiment, a third transistor, a fourth transistor, a fifth transistor, and a sixth transistor may be included; one of a source and a drain of the third transistor may be electrically connected to the first node; the other of the source and the drain of the third transistor may be electrically connected to one of a source and a drain of the fourth transistor; a gate of the third transistor may be electrically connected to the first wiring; one of a source and a drain of the fifth transistor may be electrically connected to the second node; the other of the source and the drain of the fifth transistor may be electrically connected to one of a source and a drain of the sixth transistor; and a gate of the fifth transistor may be electrically connected to the second wiring.

In the above embodiment, a function of setting a potential of the first wiring to a potential corresponding to data retained in the first memory cell and then turning on the fourth transistor and the sixth transistor may be provided.

In the above embodiment, a function of precharging the first wiring and the second wiring and then setting the potential of the first wiring to the potential corresponding to data retained in the first memory cell may be provided.

Another embodiment of the present invention is a memory device including first to fourth memory cells, first to fourth wirings, first to fourth switches, and a sense amplifier; the first memory cell includes a first transistor and a first capacitor; one of a source and a drain of the first transistor is electrically connected to the first wiring; the other of the source and the drain of the first transistor is electrically connected to the first capacitor; the second memory cell includes a second transistor and a second capacitor; one of a source and a drain of the second transistor is electrically connected to the second wiring; the other of the source and the drain of the second transistor is electrically connected to the second capacitor; the third memory cell includes a third transistor and a third capacitor; one of a source and a drain of the third transistor is electrically connected to the third wiring; the other of the source and the drain of the third transistor is electrically connected to the third capacitor; the fourth memory cell includes a fourth transistor and a fourth capacitor; one of a source and a drain of the fourth transistor is electrically connected to the fourth wiring; the other of the source and the drain of the fourth transistor is electrically connected to the fourth capacitor; the sense amplifier includes a first node and a second node; the first wiring is electrically connected to the first node through the first switch; the second wiring is electrically connected to the second node through the second switch; the third wiring is electrically connected to the first node through the third switch; the fourth wiring is electrically connected to the second node through the fourth switch; and the sense amplifier amplifies a potential difference between the first node and the second node.

In the above embodiment, the first to fourth switches may include a transistor.

In the above embodiment, the first to fourth switches may be composed of an re-channel transistor, and the sense amplifier may be composed of a single-polarity circuit using an n-channel transistor.

In the above embodiment, the first to fourth transistors may include an oxide semiconductor in a channel formation region.

In the above embodiment, the first to fourth memory cells may be provided above the sense amplifier.

In the above embodiment, a fifth transistor, a sixth transistor, a seventh transistor, an eighth transistor, a ninth transistor, a tenth transistor, an eleventh transistor, and a twelfth transistor may be included; one of a source and a drain of the fifth transistor may be electrically connected to the first node; the other of the source and the drain of the fifth transistor may be electrically connected to one of a source and a drain of the sixth transistor; a gate of the fifth transistor may be electrically connected to the first wiring; one of a source and a drain of the seventh transistor may be electrically connected to the second node; the other of the source and the drain of the seventh transistor may be electrically connected to one of a source and a drain of the eighth transistor; a gate of the seventh transistor may be electrically connected to the second wiring; one of a source and a drain of the ninth transistor may be electrically connected to the first node; the other of the source and the drain of the ninth transistor may be electrically connected to one of a source and a drain of the tenth transistor; a gate of the ninth transistor may be electrically connected to the third wiring; one of a source and a drain of the eleventh transistor may be electrically connected to the second node; the other of the source and the drain of the eleventh transistor may be electrically connected to one of a source and a drain of the twelfth transistor; and a gate of the eleventh transistor may be electrically connected to the fourth wiring.

In the above embodiment, a function of setting a potential of the first wiring to a potential corresponding to data retained in the first memory cell and then turning on the sixth transistor and the eighth transistor may be provided.

In the above embodiment, a function of precharging the first wiring and the second wiring and then setting the potential of the first wiring to the potential corresponding to data retained in the first memory cell may be provided.

Effect of the Invention

One embodiment of the present invention can provide a memory device that operates at high speed. One embodiment of the present invention can provide a highly reliable memory device. One embodiment of the present invention can provide a memory device with low power consumption. One embodiment of the present invention can provide a novel semiconductor device.

Note that the effects of one embodiment of the present invention are not limited to the effects listed above. The effects listed above do not preclude the existence of other effects. The other effects are effects that are not described in this section and will be described below. The other effects not described in this section will be apparent from and can be derived as appropriate from the descriptions of the specification, the drawings, and the like by those skilled in the art. One embodiment of the present invention has at least one of the effects mentioned above and other effects. Accordingly, depending on the case, one embodiment of the present invention does not have the effects listed above in some cases.

MODE FOR CARRYING OUT THE INVENTION

Figure 1:
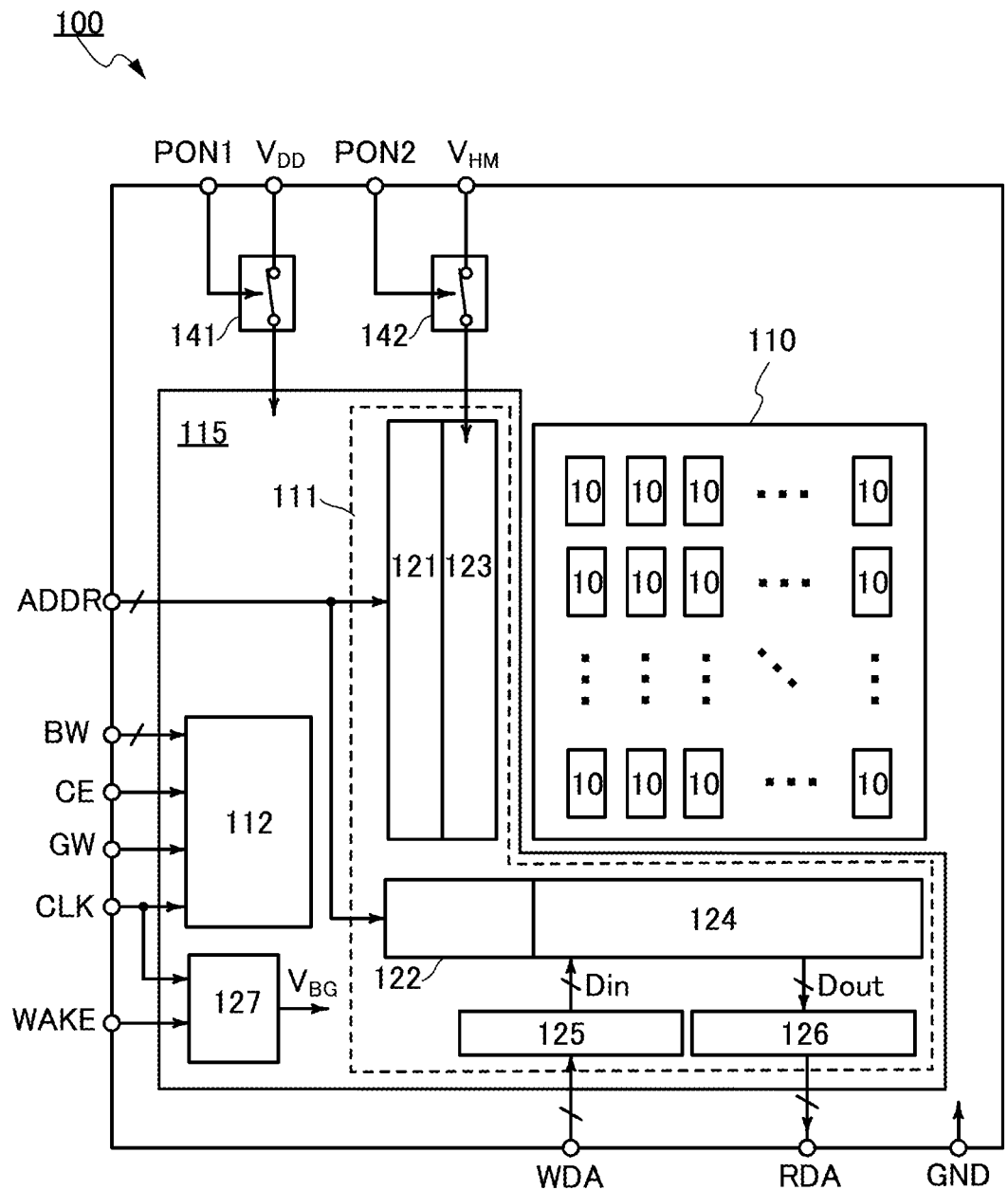
FIG. 1 A block diagram illustrating a configuration example of a memory device.

Embodiments will be described below with reference to drawings. Note that the embodiments can be implemented with various modes, and it will be readily appreciated by those skilled in the art that modes and details thereof can be changed in various ways without departing from the spirit and scope thereof. Thus, the present invention should not be interpreted as being limited to the following description of the embodiments.

In the drawings, the size, the layer thickness, or the region is exaggerated for clarity in some cases. Therefore, the size, the layer thickness, or the region is not necessarily limited to the scale. Note that the drawings are schematic views showing ideal examples, and shapes or values are not limited to those shown in the drawings.

In this specification, the embodiments described below can be combined as appropriate. In addition, in the case where a plurality of structure examples are described in one embodiment, the structure examples can be combined with each other as appropriate.

In this specification, a high power supply potential and a low power supply potential are sometimes referred to as an H level (or $V_{DD}$) and an L level (or GND), respectively.

In this specification, in the case where brackets of an array are omitted, an unspecified one of elements of the array is represented. For example, a memory cell 2a refers to an unspecified one of memory cells 2a[0] to 2a[3].

Embodiment 1

In this embodiment, a memory device using an OS transistor of one embodiment of the present invention will be described.

<Memory Device 100>

FIG. 1 is a block diagram illustrating a configuration example of a memory device. A memory device 100 illustrated in FIG. 1 includes a cell array 110, a peripheral circuit 111, a control circuit 112, a potential generation circuit 127, and power switches (PSWs) 141 and 142.

In the memory device 100, each circuit, each signal, and each potential can be appropriately selected as needed. Another circuit or another signal may be added. Signals BW, CE, GW, CLK, WAKE, ADDR, WDA, PON1, and PON2 are signals input from the outside, and a signal RDA is a signal output to the outside. The signal CLK is a clock signal. The signal CE, the signal GW, and the signal BW are control signals. The signal CE is a chip enable signal, the signal GW is a global write enable signal, and the signal BW is a byte write enable signal. The signal ADDR is an address signal. The signal WDA is write data, and the signal RDA is read data. The signals PON1 and PON2 are power gating control signals. Note that the signals PON1 and PON2 may be generated in the control circuit 112.

The control circuit 112 is a logic circuit having a function of controlling the overall operation of the memory device 100. For example, the control circuit performs a logical operation on the signal CE, the signal GW, and the signal BW to determine an operation mode of the memory device 100 (e.g., write operation or read operation). Alternatively, the control circuit 112 generates a control signal for the peripheral circuit 111 so that the operation mode is executed.

The cell array 110 includes a plurality of cells 10. The plurality of cells 10 are arranged in a matrix.

The potential generation circuit 127 has a function of generating a negative potential (VBG). The $V_{BG}$ is applied to a back gate of an OS transistor that is used for the cell 10 described later. A signal WAKE has a function of controlling the input of the signal CLK to the potential generation circuit 127. For example, when an H-level signal is supplied as the signal WAKE, the signal CLK is input to the potential generation circuit 127, and the potential generation circuit 127 generates the $V_{BG}$.

The peripheral circuit 111 is a circuit having a function of writing and reading out data to/from the cell array 110. The peripheral circuit 111 includes a row decoder 121, a column decoder 122, a row driver 123, a column driver 124, an input circuit 125, and an output circuit 126.

The row decoder 121 and the column decoder 122 have a function of decoding the signal ADDR. The row decoder 121 is a circuit for specifying a row to be accessed, and the column decoder 122 is a circuit for specifying a column to be accessed. The row driver 123 has a function of selecting a word line connected to the cells 10 in the row specified by the row decoder 121. The column driver 124 has a function of writing data to the cell array 110, a function of reading out data from the cell array 110, a function of retaining the read data, and the like.

The input circuit 125 has a function of retaining the signal WDA. Data retained by the input circuit 125 is output to the column driver 124. Data output from the input circuit 125 is data written to the cell array 110. Data (Dout) read from the cell array 110 by the column driver 124 is output to the output circuit 126. The output circuit 126 has a function of retaining Dout. The output circuit 126 outputs the retained data to the outside of the memory device 100. The output data is the signal RDA.

The PSW 141 has a function of controlling the supply of $V_{DD}$ to a circuit other than the cell array 110 (to a peripheral circuit 115). The PSW 142 has a function of controlling the supply of $V_{HM}$ to the row driver 123. Here, in the memory device 100, a high power supply potential is $V_{DD}$ and a low power supply potential is GND (ground potential). In addition, $V_{HM}$ is a high power supply potential used to set the word line to an H level and is higher than $V_{DD}$. The on/off of the PSW 141 is controlled by the signal PON1, and the on/off of the PSW 142 is controlled by the signal PON2. The number of power domains to which $V_{DD}$ is supplied is one in the peripheral circuit 115 in FIG. 1 but can be more than one. In that case, a power switch is provided for each power domain.

Configuration Example of Cell 10

Figure 2:
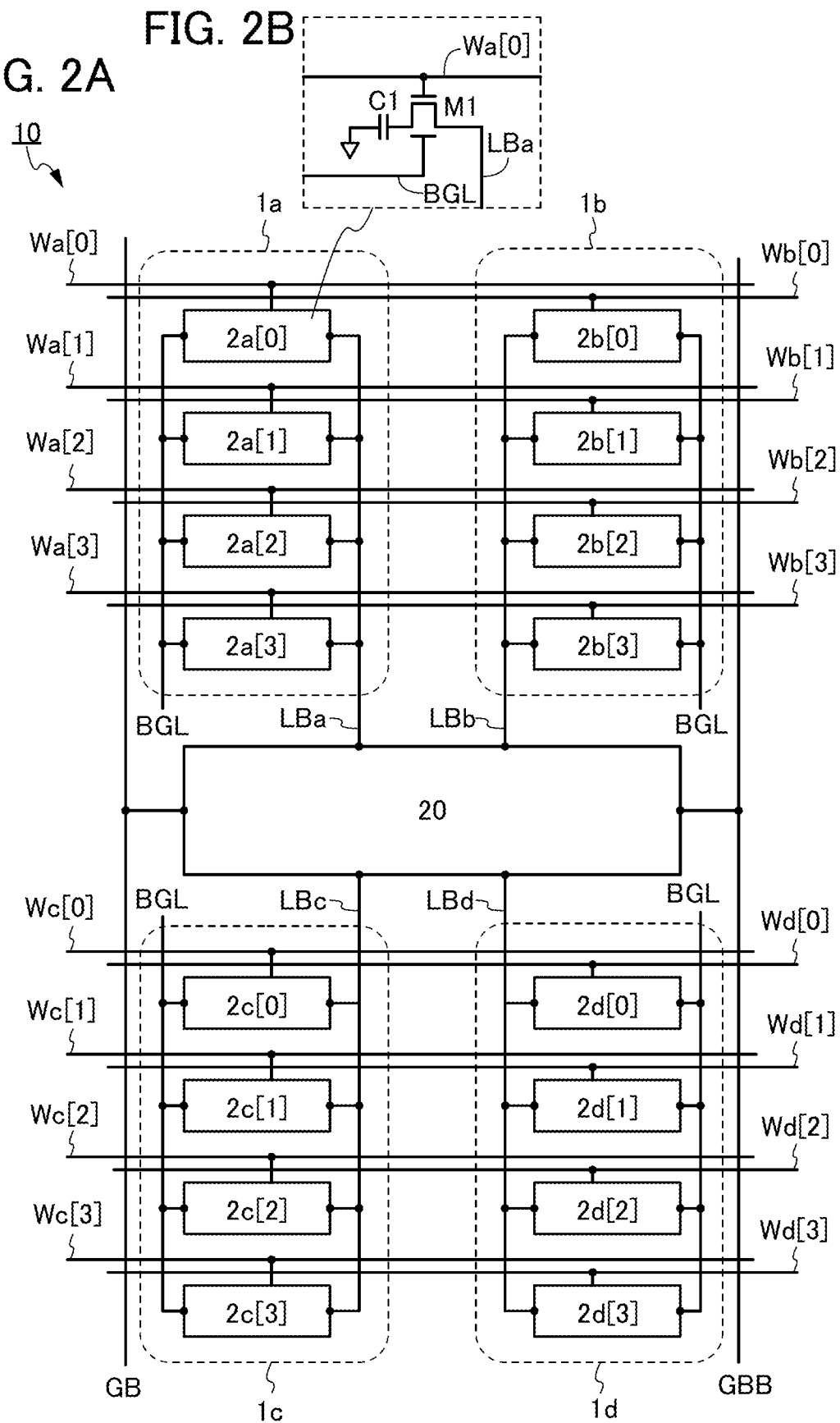
FIGS. 2A and 2B A block diagram illustrating a configuration example of a cell 10 and a circuit diagram illustrating a configuration example of a memory cell included in the cell 10.

FIG. 2(A) is a block diagram illustrating a configuration example of the cell 10. The cell 10 includes a memory cell array 1a, a memory cell array 1b, a memory cell array 1c, a memory cell array 1d, and a circuit 20.

The memory cell array 1a includes memory cells 2a[0] to 2a[3]; the memory cell array 1b includes memory cells 2b[0] to 2b[3]; the memory cell array 1c includes memory cells 2c[0] to 2c[3]; and the memory cell array 1d includes memory cells 2d[0] to 2d[3]. In this specification, the memory cells 2a to 2d may be simply referred to as a memory cell.

The memory cells 2a[0] to 2a[3] are electrically connected to the row driver 123 in FIG. 1 through wirings Wa[0] to Wa[3], respectively; the memory cells 2b[0] to 2b[3] are electrically connected to the row driver 123 in FIG. 1 through wirings Wb[0] to Wb[3], respectively; the memory cells 2c[0] to 2c[3] are electrically connected to the row driver 123 in FIG. 1 through the wirings Wc[0] to Wc[3], respectively; and the memory cells 2d[0] to 2d[3] are electrically connected to the row driver 123 in FIG. 1 through the wirings Wd[0] to Wd[3], respectively.

The memory cells 2a[0] to 2a[3] are electrically connected to the circuit 20 through a wiring LBa; the memory cells 2b[0] to 2b[3] are electrically connected to the circuit 20 through a wiring LBb; the memory cells 2c[0] to 2c[3] are electrically connected to the circuit 20 through a wiring LBc; and the memory cells 2d[0] to 2d[3] are electrically connected to the circuit 20 through a wiring LBd. The circuit 20 is electrically connected to the column driver 124 in FIG. 1 through a wiring GB and a wiring GBB.

The wirings Wa, the wirings Wb, the wirings Wc, and the wirings Wd may be referred to as word lines. Note that the wirings LBa to LBd and the wirings GB and GBB may be referred to as bit lines. To distinguish the functions of the bit lines, the wirings LBa to LBd may be referred to as local bit lines and the wirings GB and GBB may be referred to as global bit lines. The wirings GB and GBB are a bit line pair for transmitting complementary data. Data whose logic is inverted from that of the wiring GB is input to the wiring GBB.

The row driver 123 has a function of selecting a memory cell that reads out data (or writes data) through a word line. The column driver 124 has a function of writing data to the memory cell selected by the row driver 123 (or reading out data from the memory cell) through a global bit line and a local bit line.

The circuit 20 has a function of electrically connecting a global bit line to a local bit line. The circuit 20 includes a sense amplifier and has a function of amplifying the potential of a local bit line and transmitting the amplified potential to a global bit line.

FIG. 2(B) illustrates a circuit configuration example of a memory cell included in the cell 10.

The memory cell 2a[0] illustrated in FIG. 2(B) includes a transistor M1 and a capacitor C1. The transistor M1 includes a first gate and a second gate. In this specification, the first gate and the second gate may be referred to as a front gate and a back gate, respectively.

The front gate of the transistor M1 is electrically connected to the wiring Wa[0], one of a source and a drain of the transistor M1 is electrically connected to the wiring LBa, and the other of the source and the drain of the transistor M1 is electrically connected to the capacitor C1.

A first terminal of the capacitor C1 is electrically connected to the other of the source and the drain of the transistor M1, and a second terminal of the capacitor C1 is electrically connected to a wiring to which GND is supplied.

In the memory cell 2a[0], when the transistor M1 is turned on, data supplied from the wiring LBa can be written to the capacitor C1. When the transistor M1 is turned off, data written to the capacitor C1 can be retained.

The front gate and the back gate of the transistor M1 preferably include regions overlapping with each other with a semiconductor layer therebetween.

The back gate of the transistor M1 is electrically connected to a wiring BGL. The potential VBG is supplied to the wiring BGL. The transistor M1 controls the threshold voltage with the potential $V_{BG}$ supplied to the back gate, thereby being prevented from being normally on.

It is preferable to use a transistor with an extremely low off-state current as the transistor M1. The use of the transistor with an extremely low off-state current enables the memory cell 2a[0] to retain data written to the capacitor C1 for a long time. An extremely off-state current means that, for example, an off-state current per channel width of 1 μm is lower than or equal to 100 zA (zeptoamperes). Note that since the off-state current is preferably as low as possible, the normalized off-state current is preferably lower than or equal to 10 zA/μm or lower than or equal to 1 zA/μm, more preferably lower than or equal to 10 yA (yoctoamperes)/μm. Note that 1 zA is $1 \times 10^{-21}$ A and 1 yA is $1 \times 10^{-24}$ A.

An OS transistor can be given as an example of a transistor having an extremely low off-state current. Note that the details of the OS transistor will be described in Embodiment 4 below.

When the transistor M1 is an OS transistor, the data refresh frequency of the memory cell 2a[0] can be lessened. As a result, the power consumption of the memory device 100 can be reduced.

Moreover, an OS transistor has low temperature dependence of the off-state current characteristics. Thus, the normalized off-state current of an OS transistor can be lower than or equal to 100 zA even at high temperatures (e.g., 100° C. or higher). Thus, when an OS transistor is used as the transistor M1, the memory cell 2a[0] can retain data without losing it even in a high-temperature environment. Therefore, the memory device 100 having high reliability even in a high-temperature environment can be obtained.

Similarly, the circuit illustrated in FIG. 2(B) can be used for other memory cells illustrated in FIG. 2(A) (memory cells 2a[1] to 2a[3], memory cells 2b[0] to 2b[3], memory cells 2c[0] to 2c[3], and memory cells 2d[0] to 2d[3]). Consequently, the power consumption of the memory device 100 can be reduced. The operation speed of the memory device 100 can be increased. Furthermore, the memory device 100 having high reliability even in a high-temperature environment can be obtained.

Although the cell 10 illustrated in FIG. 2(A) includes 16 memory cells (4×4), the number of memory cells is not limited thereto. The number of memory cells included in the cell 10 can be freely set. Specifically, it is preferable that the number of the memory cells be set to a multiple of 8. When the number of the memory cells is a multiple of 8, the cell can handle data in units of, for example, bytes (8 bits), words (32 bits), or half-words (16 bits).

For example, when the cell 10 handles 1-byte data, the memory cell arrays 1a to 1d each include two memories (2×4=8).

For example, when the cell 10 handles 1-word data, the memory cell arrays 1a to 1d each include eight memories (8×4=32).

The speed of writing data to a memory cell is determined by the current drive capability of the transistor M1 and the capacitance of the capacitor C1. In the case where an OS transistor is used as the transistor M1, the current drive capability of the transistor M1 is low compared with the case where a transistor using Si (e.g., single crystal Si) in a channel formation region (hereinafter, a Si transistor) is used. However, when an OS transistor is used, the capacitance of the capacitor C1 can be small, and thus, data writing can be performed at higher speed in a memory cell using an OS transistor than in a memory cell using a Si transistor.

Figure 3:
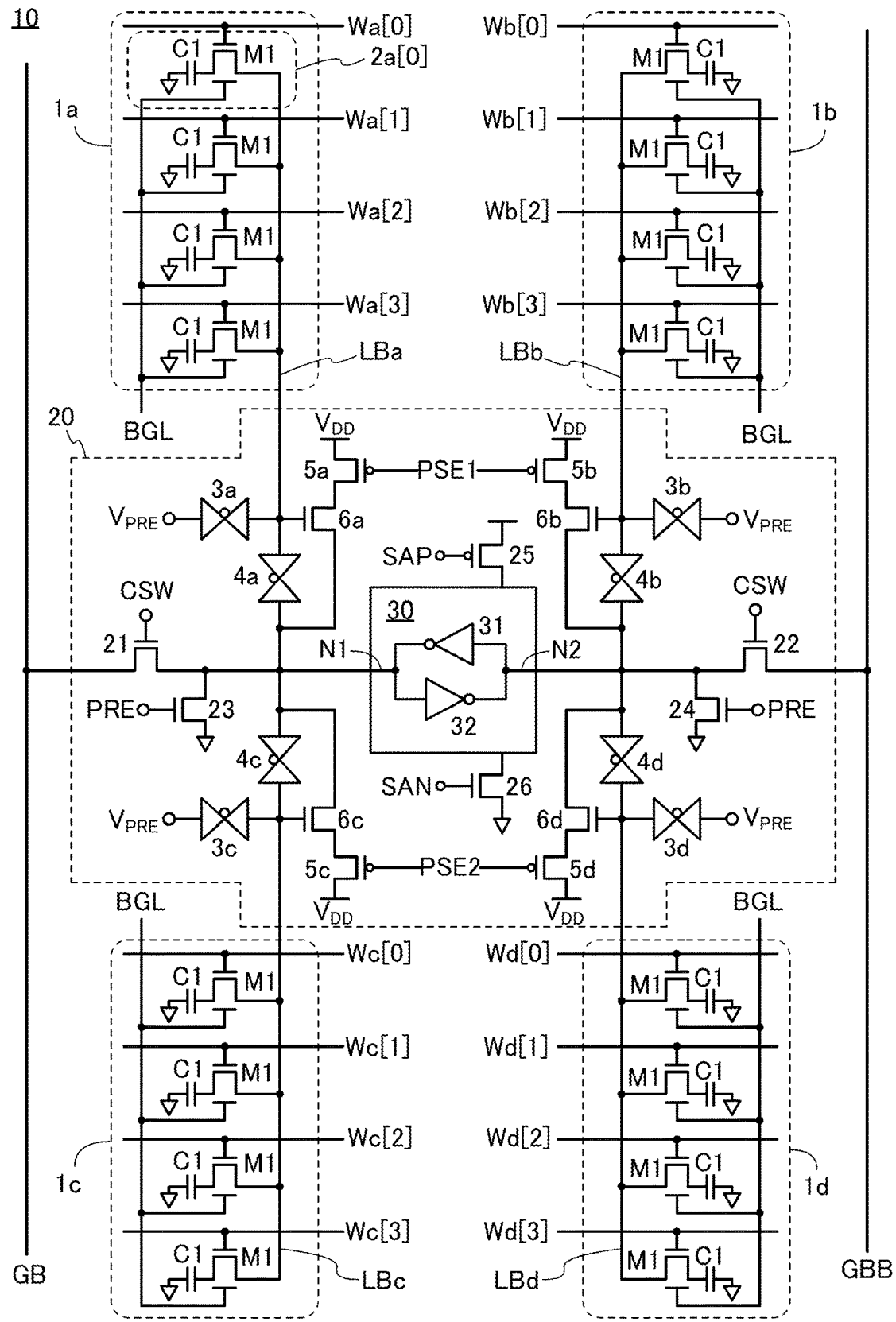
FIG. 3 A circuit diagram illustrating a configuration example of the cell 10.

FIG. 3 is a circuit diagram illustrating a more detailed configuration example of the cell 10. In FIG. 3, the circuit 20 includes switches 3a to 3d, switches 4a to 4d, transistors 5a to 5d, transistors 6a to 6d, a transistor 21, a transistor 22, a transistor 23, a transistor 24, a transistor 25, a transistor 26, and a sense amplifier 30.

The sense amplifier 30 includes an inverter 31 and an inverter 32. Input terminals of these two inverters are electrically connected to each other's output terminals, whereby the inverter 31 and the inverter 32 form a latch circuit. The output terminal of the inverter 31 (the input terminal of the inverter 32) is referred to as a node N1, and the output terminal of the inverter 32 (the input terminal of the inverter 31) is referred to as a node N2. The sense amplifier 30 has a function of amplifying and holding the potential difference between the node N1 and the node N2.

The transistor 25 and the transistor 26 are each a transistor which supplies power to the sense amplifier 30. A signal SAP is input to a gate of the transistor 25, and a signal SAN is input to a gate of the transistor 26. Turning off the transistors 25 and 26 stops the operation of the sense amplifier 30, and turning on the transistors 25 and 26 starts the operation of the sense amplifier 30.

When the switch 3a is on, a potential $V_{PRE}$ is supplied to the wiring LBa, and when the switch 3a is off, the supply of the potential $V_{PRE}$ is stopped. When the switch 3b is on, $V_{PRE}$ is supplied to the wiring LBb, and when the switch 3b is off, the supply of $V_{PRE}$ is stopped. When the switch 3c is on, $V_{PRE}$ is supplied to the wiring LBc, and when the switch 3c is off, the supply of $V_{PRE}$ is stopped. When the switch 3d is on, $V_{PRE}$ is supplied to the wiring LBd, and when the switch 3d is off, the supply of $V_{PRE}$ is stopped.

The switch 4a has a function of controlling electrical continuity between the wiring LBa and the node N1. The switch 4b has a function of controlling electrical continuity between the wiring LBb and the node N2. The switch 4c has a function of controlling electrical continuity between the wiring LBc and the node N1. The switch 4d has a function of controlling electrical continuity between the wiring LBd and the node N2.

Transistors are preferably used as the switches 3a to 3d and the switches 4a to 4d. It is particularly preferable to use switches in which n-channel transistors and p-channel transistors connected in parallel.

The high power supply potential ($V_{DD}$) is supplied to a source of the transistor 5a, and a drain of the transistor 5a is electrically connected to one of a source and a drain of the transistor 6a. A signal PSE1 is input to a gate of the transistor 5a. A gate of the transistor 6a is electrically connected to the wiring LBa, and the other of the source and the drain of the transistor 6a is electrically connected to the node N1.

A source of the transistor 5b is supplied with $V_{DD}$, and a drain of the transistor 5b is electrically connected to one of a source and a drain of the transistor 6b. The signal PSE1 is input to a gate of the transistor 5b. A gate of the transistor 6b is electrically connected to the wiring LBb, and the other of the source and the drain of the transistor 6b is electrically connected to the node N2.

A source of the transistor 5c is supplied with $V_{DD}$, and a drain of the transistor 5c is electrically connected to one of a source and a drain of the transistor 6c. A signal PSE2 is input to a gate of the transistor 5c. A gate of the transistor 6c is electrically connected to the wiring LBc, and the other of the source and the drain of the transistor 6c is electrically connected to the node N1.

A source of the transistor 5d is supplied with $V_{DD}$, and a drain of the transistor 5d is electrically connected to one of a source and a drain of the transistor 6d. The signal PSE2 is input to a gate of the transistor 5d. A gate of the transistor 6d is electrically connected to the wiring LBd, and the other of the source and the drain of the transistor 6d is electrically connected to the node N2.

A signal CSW is input to a gate of the transistor 21. The transistor 21 has a function of controlling electrical continuity between the node N1 and the wiring GB in response to the signal CSW.

The signal CSW is input to a gate of the transistor 22. The transistor 22 has a function of controlling electrical continuity between the node N2 and the wiring GBB in response to the signal CSW.

The signal PRE is input to a gate of the transistor 23. The transistor 23 has a function of setting the node N1 to GND in response to the signal PRE.

The signal PRE is input to a gate of the transistor 24. The transistor 24 has a function of setting the node N2 to GND in response to the signal PRE.

Operation Example of Cell 10

Next, the operation of the cell 10 will be described with reference to FIG. 4 and FIG. 5.

Figure 4:
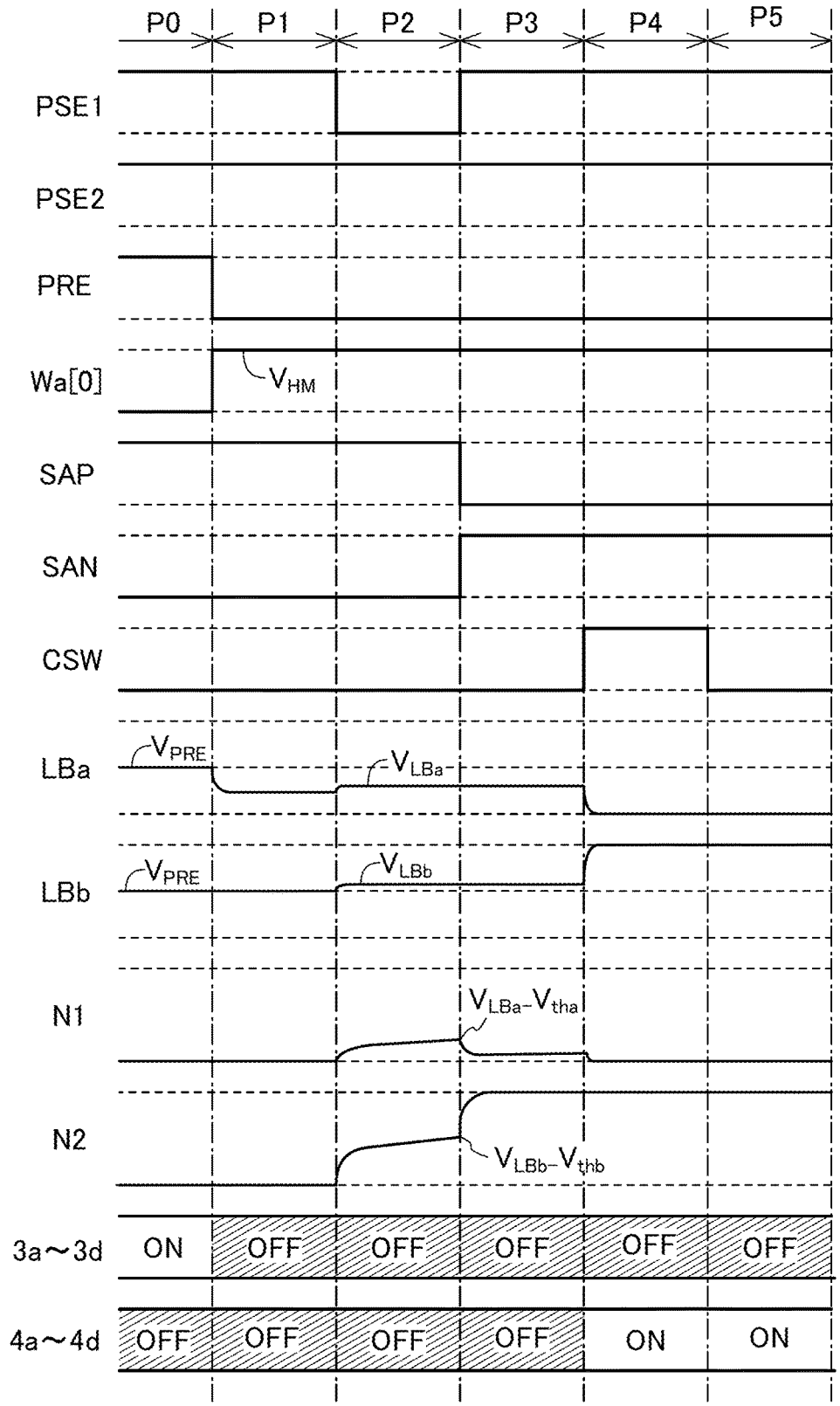
FIG. 4 A timing chart showing an operation example of the cell 10.
Figure 5:
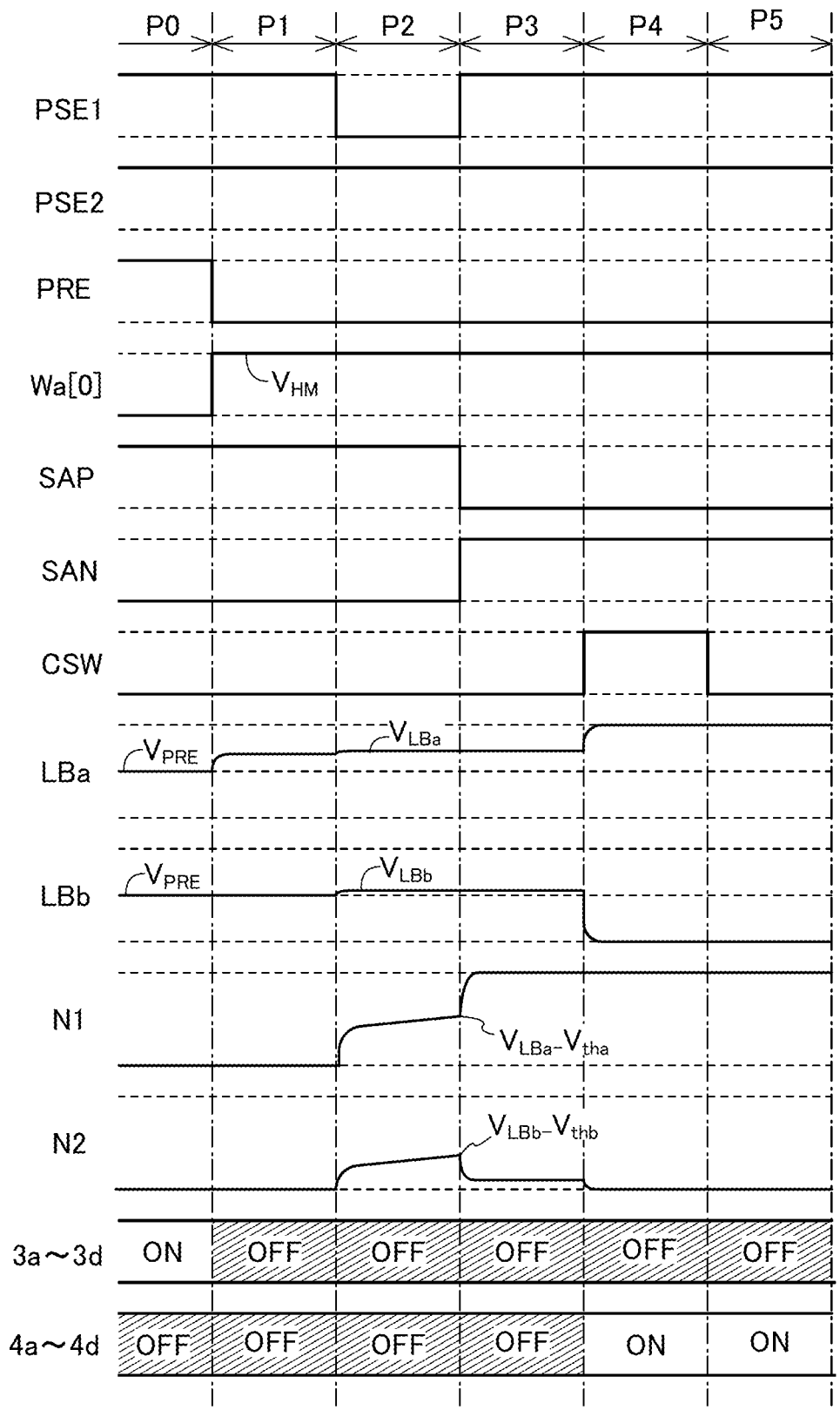
FIG. 5 A timing chart showing an operation example of the cell 10.

FIG. 4 and FIG. 5 are timing charts for explaining the operation of the cell 10. The potentials of the signal PSE1, the signal PSE2, the signal PRE, the wiring Wa[0], the signal SAP, the signal SAN, the signal CSW, the wiring LBa, the wiring LBb, the node N1, and the node N2 are shown in this order from the top. The timing charts are each sectioned into a period P0 to a period P5 according to the timing of an operation. In the timing charts, the on/off states of the switches 3a to 3d and the switches 4a to 4d in each period are shown.

FIG. 4 is the timing chart of the case where data "0" written to the memory cell 2a[0] is read out, and FIG. 5 is the timing chart of the case where data "1" written to the memory cell 2a[0] is read out.

First, FIG. 4 will be described.

In the period P0, the cell 10 retains the data "0" written to the memory cell 2a[0]. The wiring Wa[0] is supplied with an L level, and the transistor M1 in the memory cell 2a[0] is kept off.

In the period P0, the switches 3a to 3d are on and the switches 4a to 4d are off. The wirings LBa to LBd are each precharged to $V_{PRE}$.

In the period P0, the signal PRE is at an H level, and the transistors 23 and 24 are on. Consequently, the nodes N1 and N2 are precharged to an L level.

In the period P0, the signal SAP is at an H level and the signal SAN is at an L level. The transistors 25 and 26 are off, and the operation of the sense amplifier 30 is suspended.

In the period P0, the signals PSE1 and PSE2 are each at an H level and the signal CSW is at an L level.

Next, in the period P1, the switches 3a to 3d are off. The signal PRE is at an L level, and the transistor 23 and the transistor 24 are off. Consequently, the wirings LBa to LBd and the nodes N1 and N2 are in an electrically floating state.

In addition, in the period P1, the wiring Wa[0] is at $V_{HM}$, so that the transistor M1 in the memory cell 2a[0] is on. The data "0", i.e., an L-level potential, is written to the capacitor C1; thus, the potential of the wiring LBa is decreased. All the word lines other than the wiring Wa[0] remain at an L level, and the wirings LBb to LBd are kept at $V_{PRE}$.

In the period P2, the signal PSE1 is at an L level. The transistors 5a and 5b are turned on. Current flows through the transistor 6a, and the potential of the node N1 is increased. Finally, the potential of the node N1 is increased to $V_{LBa}-V_{tha}$. Note that $V_{LBa}$ is the potential of the wiring LBa in the period P2, and $V_{tha}$ is the threshold voltage of the transistor 6a. Similarly, the potential of the node N2 is increased to $V_{LBb}-V_{thb}$. Note that $V_{LBb}$ is the potential of the wiring LBb in the period P2, and $V_{thb}$ is the threshold voltage of the transistor 6b.

Assuming that the threshold voltages of the transistor 6a and the transistor 6b are equal to each other ($V_{tha}=V_{thb}$) because $V_{LBa}<V_{LBb}$, the node N2 has a higher potential than the node N1.

Next, in the period P3, the signal PSE1 is set to an H level to turn off the transistors 5a and 5b. The signal SAP is set to an L level and the signal SAN is set to an H level so that the power of the sense amplifier 30 is turned on. The sense amplifier 30 starts to operate, and the potential difference between the node N1 and the node N2 is amplified.

Next, in the period P4, the switches 4a to 4d are on. The node N1 is at an L level, and the node N2 is at an H level. At this time, the signal CSW is set to an H level to turn on the transistors 21 and 22. Electrical continuity between the wiring GB and the node N1 is established, and electrical continuity between the wiring GBB and the node N2 is established. The potentials of the wiring GB and the wiring GBB are read out at this time, whereby data written to the memory cell 2a[0] can be determined.

Next, in the period P5, the signal CSW is set to an L level. The potential of the node N1 is written to the memory cell 2a[0]. In other words, data retained in the period P0 is written back to the memory cell 2a[0].

Next, the operation when the data "1" written to the memory cell 2a[0] is read out will be described with reference to FIG. 5. Note that differences from FIG. 4 will be mainly described below, and description of portions overlapping with those in FIG. 4 is omitted.

In the period P0, the cell 10 retains the data "1" written to the memory cell 2a[0]. For other details in the period P0, the description of FIG. 4 can be referred to.

In the period P1, the transistor M1 in the memory cell 2a[0] is on. The data "1", i.e., an H-level potential is written to the capacitor C1; thus, the potential of the wiring LBa is increased. All the word lines other than the wiring Wa[0] remain at an L level, and the wirings LBb to LBd are kept at $V_{PRE}$.

Then, in the period P2, the potential of the node N1 is increased to $V_{LBa}-V_{tha}$. Note that $V_{LBa}$ is the potential of the wiring LBa in the period P2, and $V_{tha}$ is the threshold voltage of the transistor 6a. Similarly, the potential of the node N2 is increased to $V_{LBb}-V_{thb}$. Note that $V_{LBb}$ is the potential of the wiring LBb in the period P2, and $V_{thb}$ is the threshold voltage of the transistor 6b.

Assuming that the threshold voltages of the transistor 6a and the transistor 6b are equal to each other ($V_{tha}=V_{thb}$) because $V_{LBa}>V_{LBb}$, the node N1 has a higher potential than the node N2.

Next, in the period P3, the sense amplifier 30 starts to operate, and the potential difference between the node N1 and the node N2 is amplified.

Then, in the period P4, the node N1 is at an H level, and the node N2 is at an L level. At this time, electrical continuity between the wiring GB and the node N1 is established, and electrical continuity between the wiring GBB and the node N2 is established. The potentials of the wiring GB and the wiring GBB are read out, whereby data written to the memory cell 2a[0] can be determined.

Then, in the period P5, the potential of the node N1 is written to the memory cell 2a[0]. In other words, data retained in the period P0 is written back to the memory cell 2a[0].

As described above, the use of the above method enables the memory device 100 to read out data written to a memory cell.

In the case where local bit lines are directly connected to a sense amplifier as in the memory device described in Patent Document 2, parasitic capacitance added to the local bit lines is increased; however, in the cell 10 described in this embodiment, the local bit lines (LBa to LBd) are not directly connected to the sense amplifier 30 (connected to the sense amplifier 30 through switches). Thus, parasitic capacitance added to the local bit lines is small, which can increase the operation speed of the memory device 100. Furthermore, a highly reliable memory device that allows malfunction of the memory device 100 to be prevented can be provided.

Other Configuration Examples of Cell 10

Figure 6:
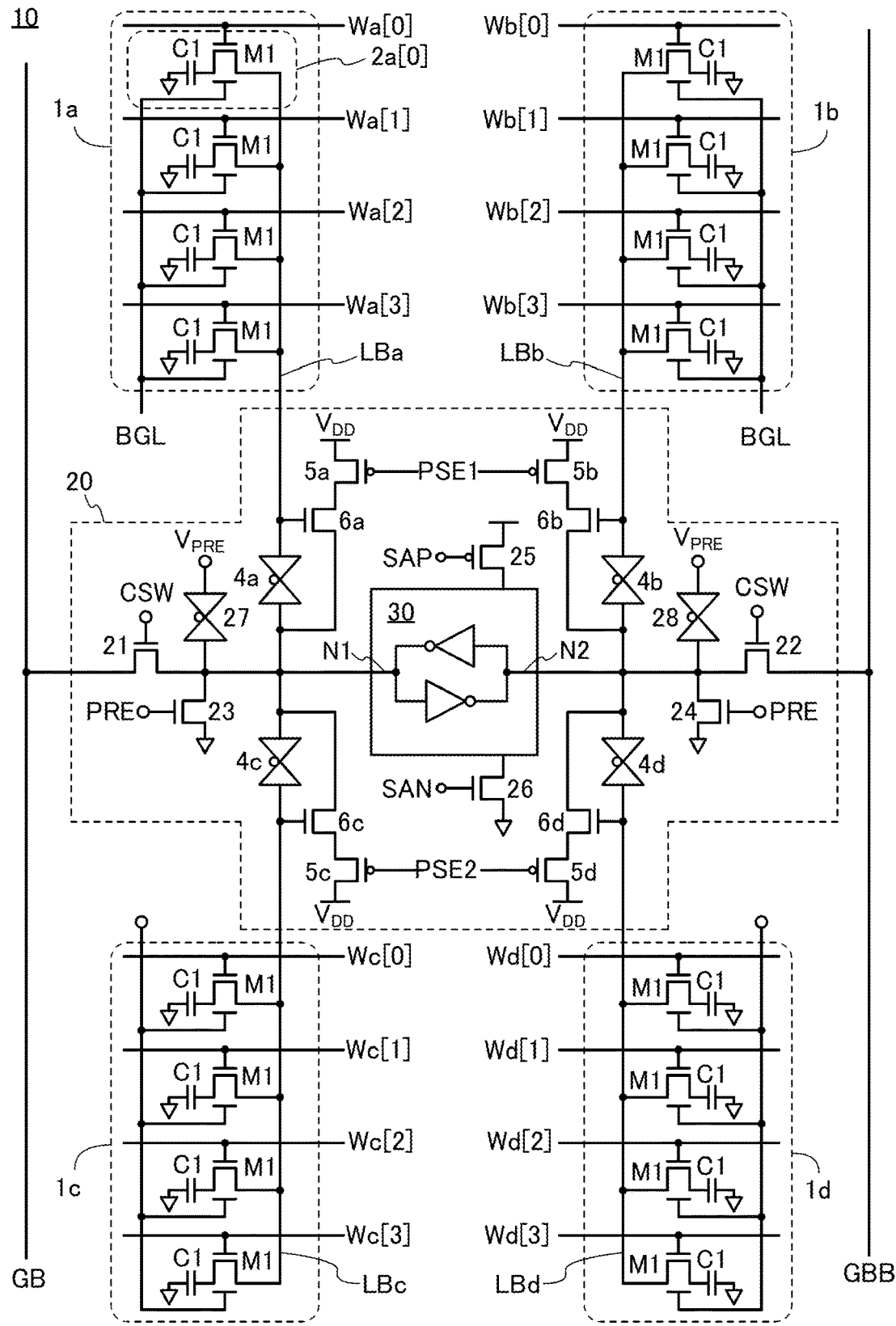
FIG. 6 A circuit diagram illustrating a configuration example of the cell 10.

In the cell 10 illustrated in FIG. 3, the node N1 and the node N2 may be precharged to $V_{PRE}$. FIG. 6 shows a circuit diagram of that case. The cell 10 illustrated in FIG. 6 is different from the cell 10 illustrated in FIG. 3 in that the switches 3a to 3d included in the circuit 20 are omitted and the switch 27 and the switch 28 are added instead.

In FIG. 6, when the switch 27 is on, the potential $V_{PRE}$ is supplied to the node N1, and when the switch 27 is off, the supply of the potential $V_{PRE}$ is stopped. When the switch 28 is on, $V_{PRE}$ is supplied to the node N2, and when the switch 28 is off, the supply of $V_{PRE}$ is stopped. $V_{PRE}$ is supplied to the wiring LBa through the switch 4a, to the wiring LBb through the switch 4b, to the wiring LBc through the switch 4c, and to the wiring LBd through the switch 4d.

Figure 7:
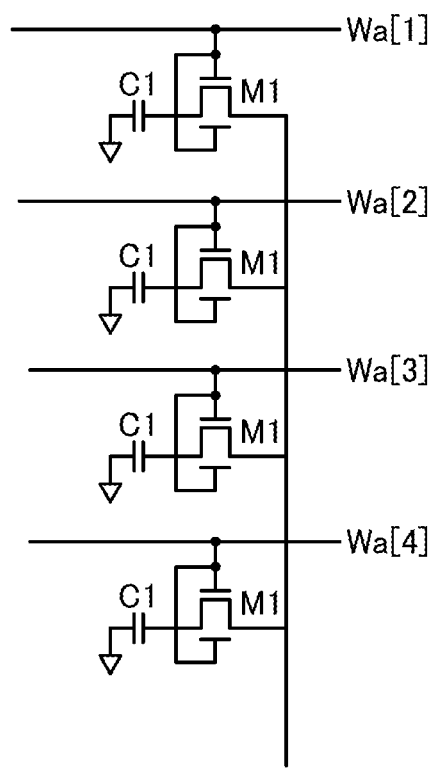
FIG. 7 A circuit diagram illustrating a configuration example of transistors M1.

In the above-described cell 10, the back gate of the transistor M1 may be electrically connected to the front gate thereof. FIG. 7 shows a circuit diagram of that case. When the transistor M1 has a configuration shown in FIG. 7, an on-state current can be increased. As a result, the operation speed of a memory cell can be increased.

In the above cell 10, two local bit lines (LBa and LBc) are electrically connected to the node N1 through a switch and two local bit lines (LBb and LBd) are electrically connected to the node N2 through a switch; however, the number of local bit lines electrically connected to the corresponding node is not limited thereto. For example, one local bit line may be electrically connected to one node, or three or more local bit lines may be electrically connected to one node. The nodes N1 and N2 are each electrically connected to one or more local bit lines through a switch.

<Three-Dimensional Structure>

Figure 8:
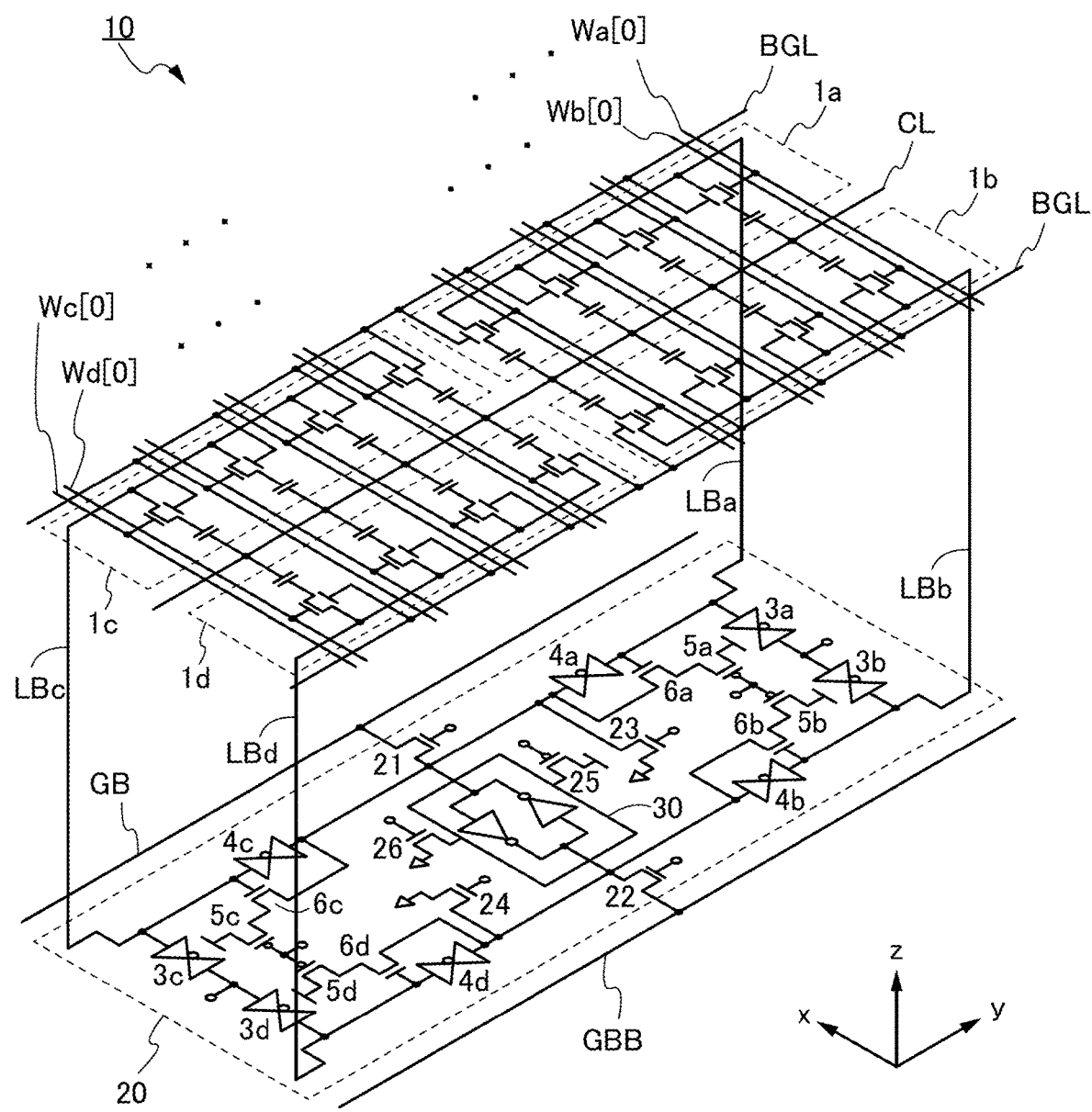
FIG. 8 A circuit diagram illustrating a configuration example of the cell 10.

The circuit diagram of the cell 10 illustrated in FIG. 3 is three-dimensionally shown in FIG. 8. In FIG. 8, the wiring CL is electrically connected to the second electrode of the capacitor C1, and is supplied with GND.

As shown in FIG. 8, the cell 10 can be formed in such a manner that the memory cell arrays 1a to 1d are provided in an upper layer and the circuit 20 is provided in a lower layer.

An OS transistor can be stacked above the Si transistor. For example, when the circuit 20 is formed with Si transistors and the memory cell arrays 1a to 1d are formed with OS transistors, the memory cell arrays 1a to 1d can be provided above the circuit 20 as illustrated in FIG. 8. As a result, the occupation area of the circuit in the memory device 100 can be small, which can reduce the manufacturing cost of the memory device 100.

Although the memory cell arrays 1a to 1d are formed in one layer in FIG. 8, the memory cell arrays 1a to 1d are not limited thereto and may be formed in a plurality of layers. For example, a structure may be employed in which a first layer including the circuit 20, a second layer including the memory cell array 1a and the memory cell array 1c, and a third layer including the memory cell array 1b and the memory cell array 1d are stacked in this order from the bottom. For example, another structure may be employed in which a first layer including the circuit 20, a second layer including the memory cell array 1a and the memory cell array 1b, and a third layer including the memory cell array 1c and the memory cell array 1d are stacked in this order from the bottom.

Figure 9:
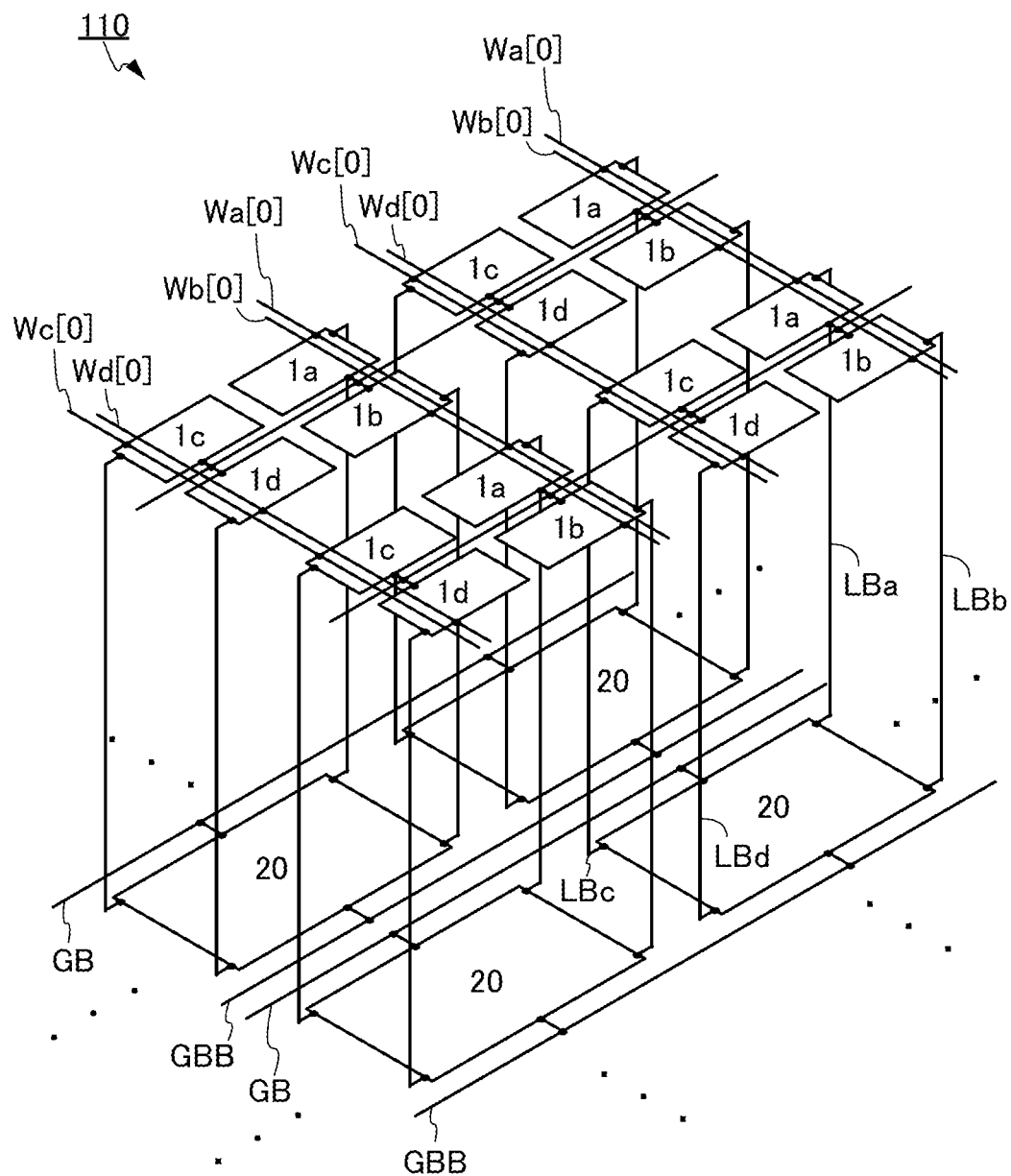
FIG. 9 A circuit diagram illustrating a configuration example of a cell array 110.

FIG. 9 is a circuit diagram illustrating a configuration example of the cell array 110. The cells 10 illustrated in FIG. 8 are arranged in an array. As illustrated in FIG. 9, the plurality of cells 10 arranged in the x direction share the word lines (Wa, Wb, Wc, and Wd), and the plurality of cells 10 arranged in the y direction share the global bit lines (GB and GBB).

The cell array 110 is formed as illustrated in FIG. 9, whereby a highly integrated memory device can be provided.

Figure 10:
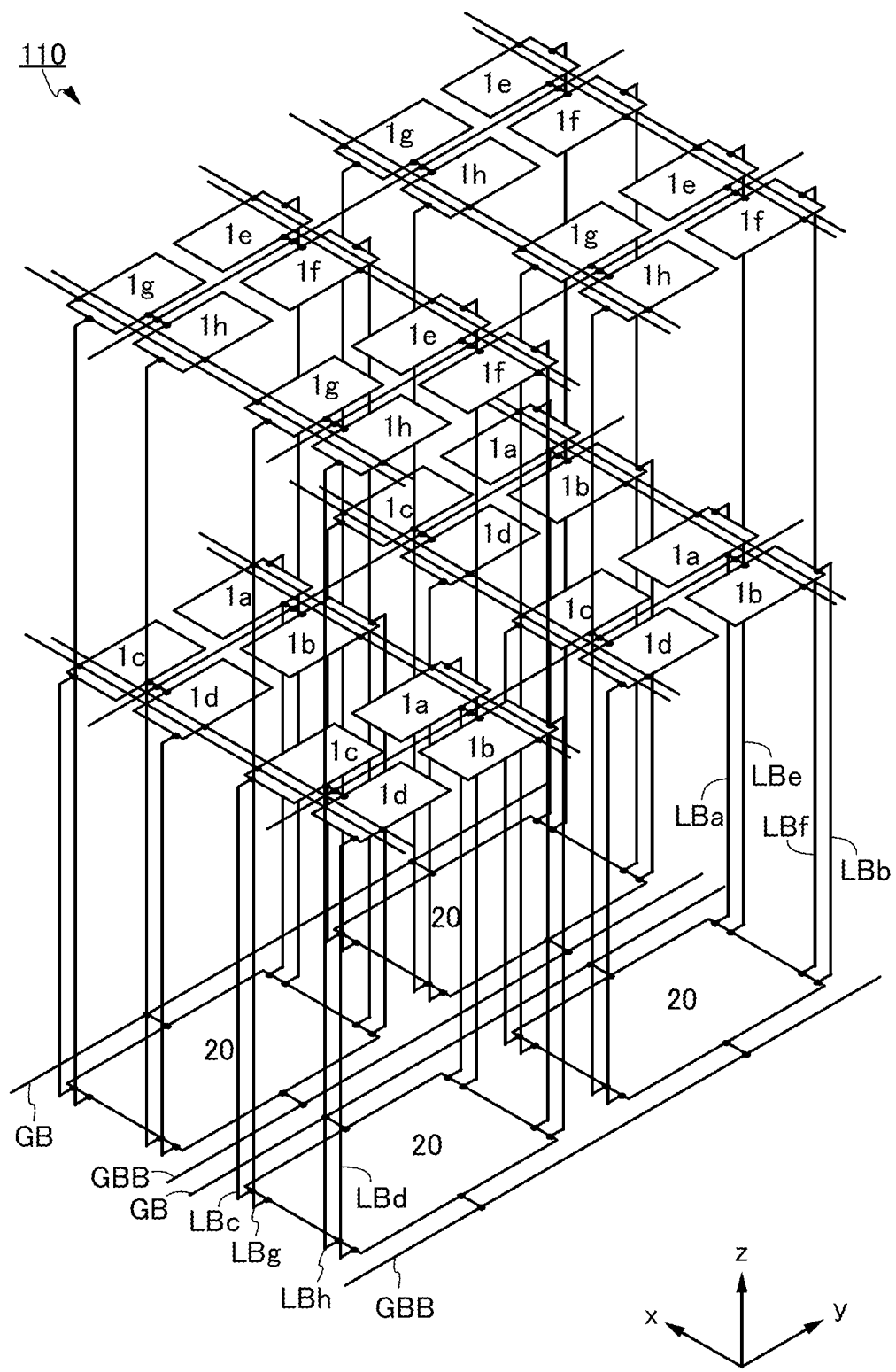
FIG. 10 A circuit diagram illustrating a configuration example of the cell array 110.

FIG. 10 is an example where a memory cell array 1e, a memory cell array 1f, a memory cell array 1g, and a memory cell array 1h are provided above the memory cell arrays 1a to 1d. The memory cell array 1e is electrically connected to the circuit 20 through a wiring LBe (local bit line). The memory cell array 1f is electrically connected to the circuit through a wiring LBf (local bit line). The memory cell array 1g is electrically connected to the circuit 20 through a wiring LBg (local bit line). The memory cell array 1h is electrically connected to the circuit 20 through a wiring LBh (local bit line). Although not illustrated, the wirings LBa, LBc, LBe, and LBg are electrically connected to the node N1 through switches, and the wirings LBb, LBd, LBf, and LBh are electrically connected to the node N2 through switches.

The cell array 110 is formed as illustrated in FIG. 10, whereby the storage capacity can be increased without increasing the chip area of the memory device 100.

As described above, when the memory device described in this embodiment is used, a memory device in which the parasitic capacitance of bit lines is reduced can be provided. Furthermore, a memory device that can operate at high speed can be provided. Furthermore, a memory device with high reliability can be provided. Furthermore, a memory device with low power consumption can be provided.

Embodiment 2

In this embodiment, a modification example of the memory device described in the above embodiment will be described.

Although FIG. 3 and FIG. 6 illustrate examples of the cell 10 composed of a circuit (CMOS circuit) using both of an n-channel transistor and a p-channel transistor, the cell 10 can be formed using transistors having a single polarity. Hereinafter, a circuit formed using transistors having a single polarity is also referred to as a single-polarity circuit.

Configuration Example of Cell 10

Figure 11:
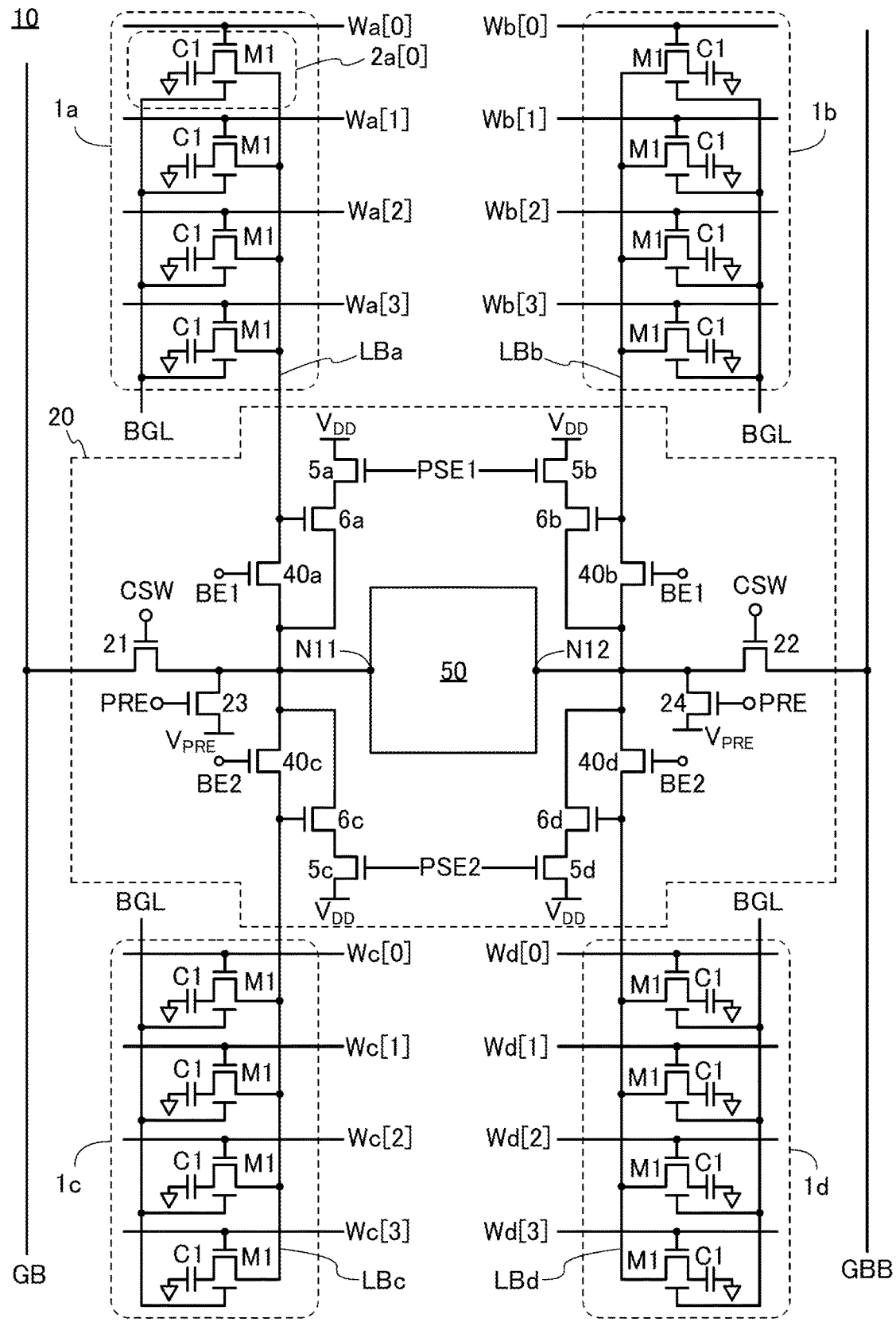
FIG. 11 A circuit diagram illustrating a configuration example of the cell 10.

FIG. 11 illustrates a configuration example of the cell 10 composed of n-channel single-polarity circuits. In the circuit 20 illustrated in FIG. 11, n-channel transistors 40a to 40d are used as the switches 4a to 4d illustrated in FIG. 3. A signal BE1 is input to gates of the transistors 40a and 40b, and a signal BE2 is input to gates of the transistors 40c and 40d. As the transistors 5a to 5d, n-channel transistors are used. One of a source and a drain of the transistor 23 and one of a source and a drain of the transistor 24 are electrically connected to a wiring to which the potential $V_{PRE}$ is supplied.

As the potential $V_{PRE}$ in FIG. 11, a potential between a high power supply potential and a low power supply potential can be used. For example, the potential $V_{PRE}$ can be $V_{DD}/2$.

The circuit 20 illustrated in FIG. 11 includes a sense amplifier 50 composed of a single-polarity circuit, instead of the sense amplifier 30. A node electrically connected to the sense amplifier 50 and the transistor 21 is referred to as a node N11, and a node electrically connected to the sense amplifier 50 and the transistor 22 is referred to as a node N12. The sense amplifier 50 has a function of amplifying and holding the potential difference between the node N11 and the node N12.

Figure 12:
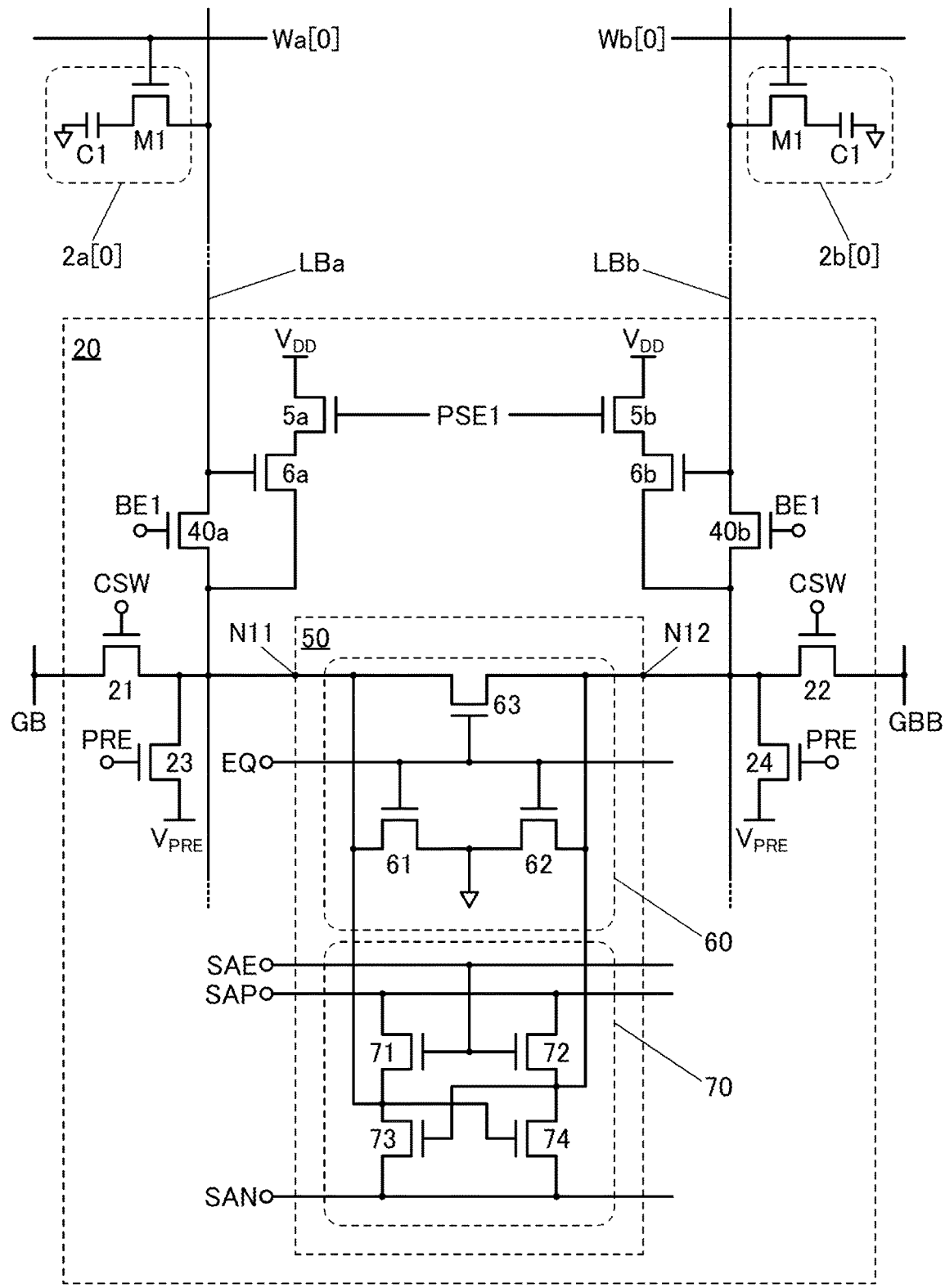
FIG. 12 A circuit diagram illustrating a configuration example of the cell 10.

Next, a specific configuration example of the sense amplifier 50 will be described. FIG. 12 illustrates part of the circuit 20 including the sense amplifier 50, and the memory cell 2a[0] and the memory cell 2b[0]. The sense amplifier 50 illustrated in FIG. 12 includes a precharge circuit 60 and an amplifier circuit 70. The precharge circuit 60 has a function of precharging the node N11 and the node N12. The amplifier circuit 70 has a function of amplifying the potential difference between the node N11 and the node N12.

The precharge circuit 60 includes transistors 61 to 63. Gates of the transistors 61 to 63 are electrically connected to a wiring to which a signal EQ is supplied. One of a source and a drain of the transistor 61 is electrically connected to the node N11, and one of a source and a drain of the transistor 62 is electrically connected to the node N12. The other of the source and the drain of the transistor 61 and the other of the source and the drain of the transistor 62 are electrically connected to a wiring to which a low power supply potential is supplied. One of a source and a drain of the transistor 63 is electrically connected to the node N11, and the other of the source and the drain of the transistor 63 is electrically connected to the node N12.

When the signal EQ becomes an H level and the transistors 61 to 63 are turned on, the node N11 and the node N12 are precharged to a low power supply potential. Here, n-channel transistors are used as the transistors 61 to 63. Thus, the precharge circuit 60 is composed of a single-polarity circuit.

The amplifier circuit 70 includes transistors 71 and 74. Gates of the transistors 71 and 72 are electrically connected to a wiring to which a signal SAE is supplied, and one of a source and a drain of each of the transistors 71 and 72 is electrically connected to a wiring to which the signal SAP is supplied. The other of the source and the drain of the transistor 71 is electrically connected to one of a source and a drain of the transistor 73, a gate of the transistor 74, and the node N11. The other of the source and the drain of the transistor 72 is electrically connected to one of a source and a drain of the transistor 74, a gate of the transistor 73, and the node N12. The other of the source and the drain of each of the transistors 73 and 74 is electrically connected to a wiring to which the signal SAN is supplied.

When the signal SAE and the signal SAP each become an H level and the signal SAN becomes an L level, the amplifier circuit 70 is brought into an operating state, and the potential difference between the node N11 and the node N12 is amplified. Accordingly, one of the node N11 and the node N12 comes to be at an L level and the other comes to be at an H level. Here, n-channel transistors are used as the transistors 71 to 74. Thus, the amplifier circuit 70 is composed of a single-polarity circuit.

When the circuit 20 is composed of single-polarity circuits as described above, the manufacturing process can be simplified and the manufacturing cost can be reduced. When the circuit 20 is composed of single-polarity circuits using Si transistors, well separation is unnecessary; thus, the layout area can be small compared with the case where CMOS circuits are used.

The circuit 20 can also be composed of single-polarity circuits using n-channel OS transistors. In that case, the circuit 20 can be provided in the same layer as memory cells; the OS transistors included in the circuit 20 and the OS transistors included in the memory cells can be formed in the same process. Thus, the manufacturing process can be simplified and the manufacturing cost can be reduced.

As illustrated in FIG. 8 and FIG. 9, memory cells using OS transistors can also be stacked over the circuit 20 composed of single-polarity circuits using Si transistors or OS transistors. Consequently, area reduction can be achieved. As illustrated in FIG. 10, memory cells can also be stacked.

Operation Example of Cell 10

Figure 13:
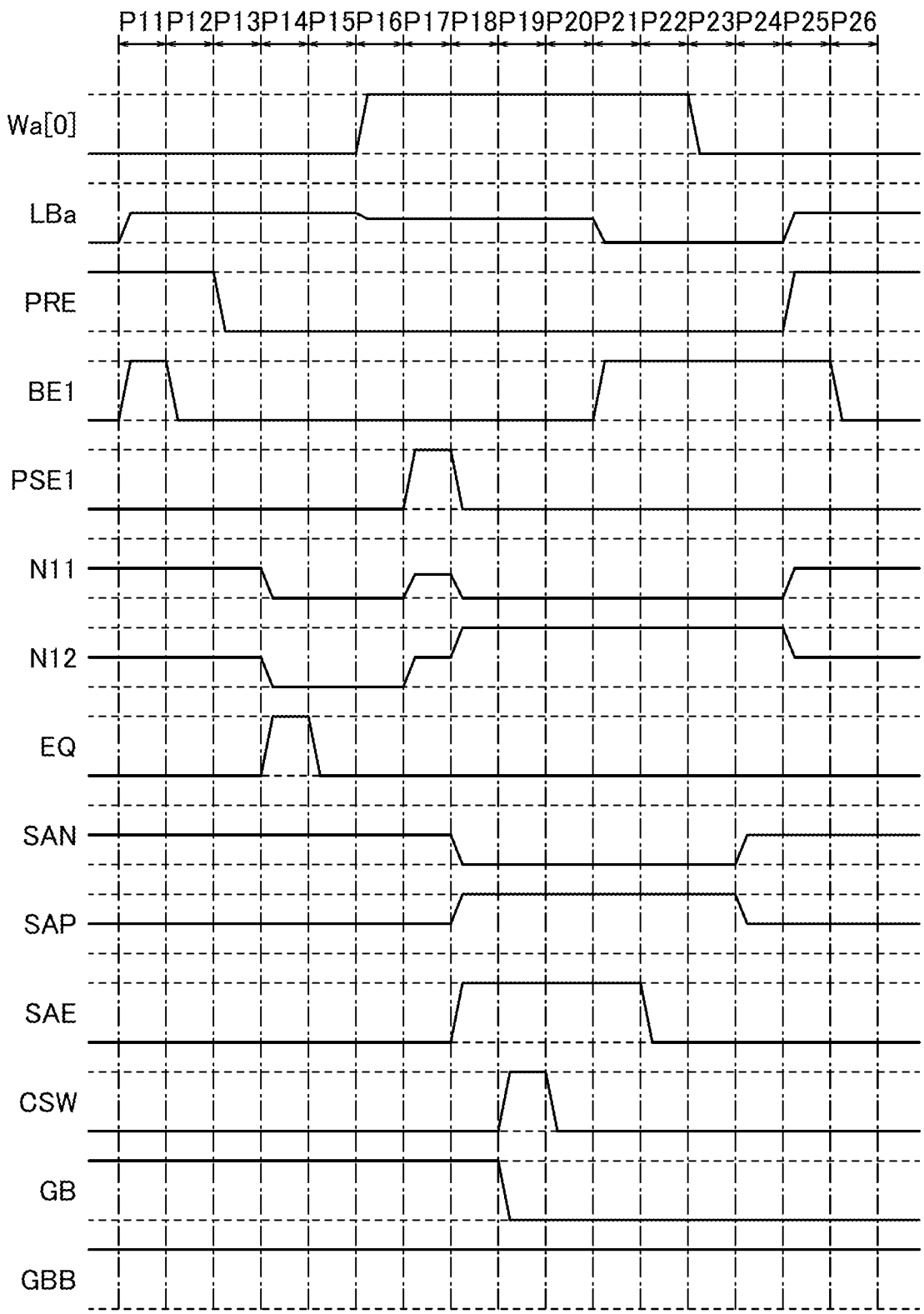
FIG. 13 A timing chart showing an operation example of the cell 10.
Figure 14:
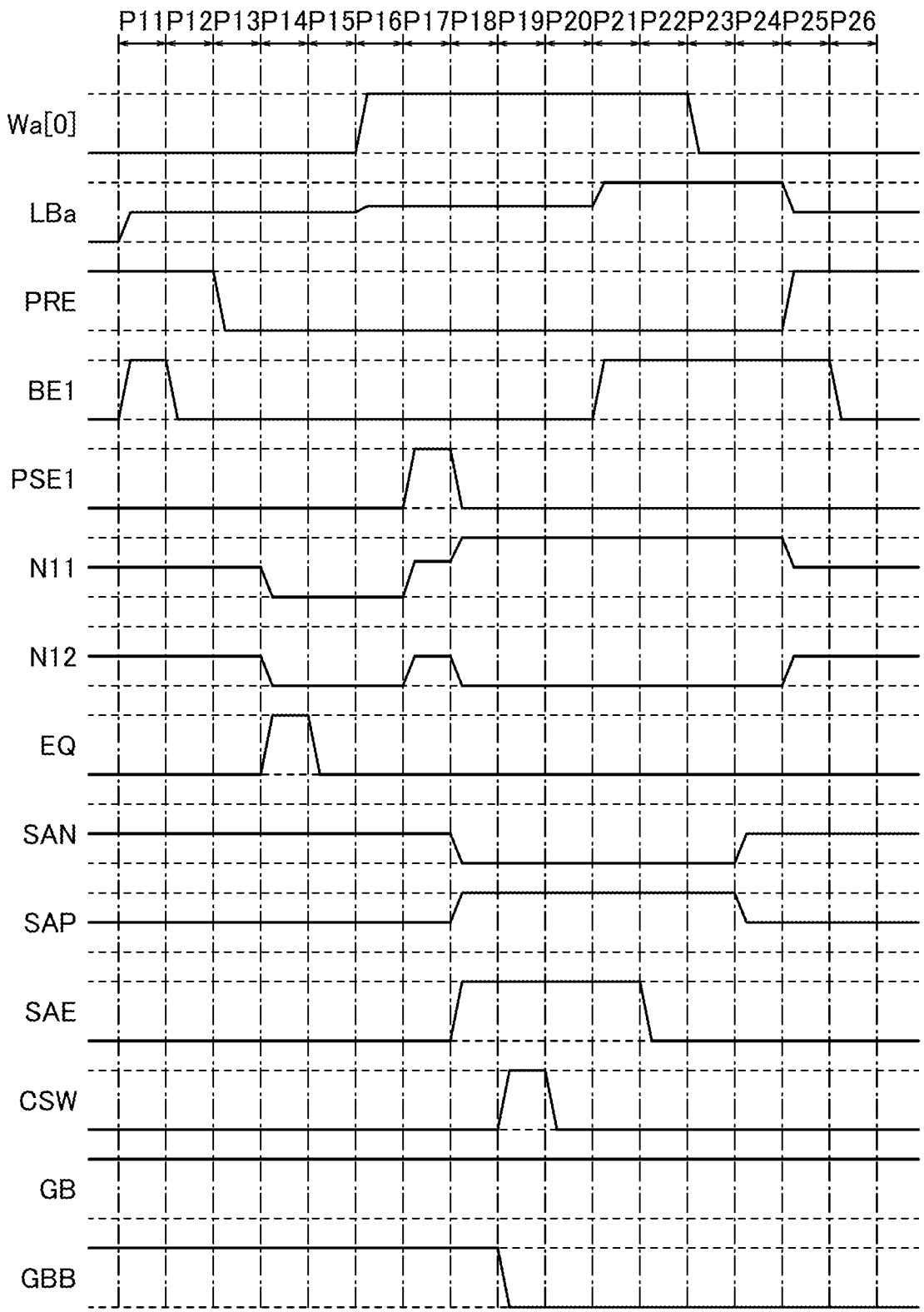
FIG. 14 A timing chart showing an operation example of the cell 10.
Figure 15:
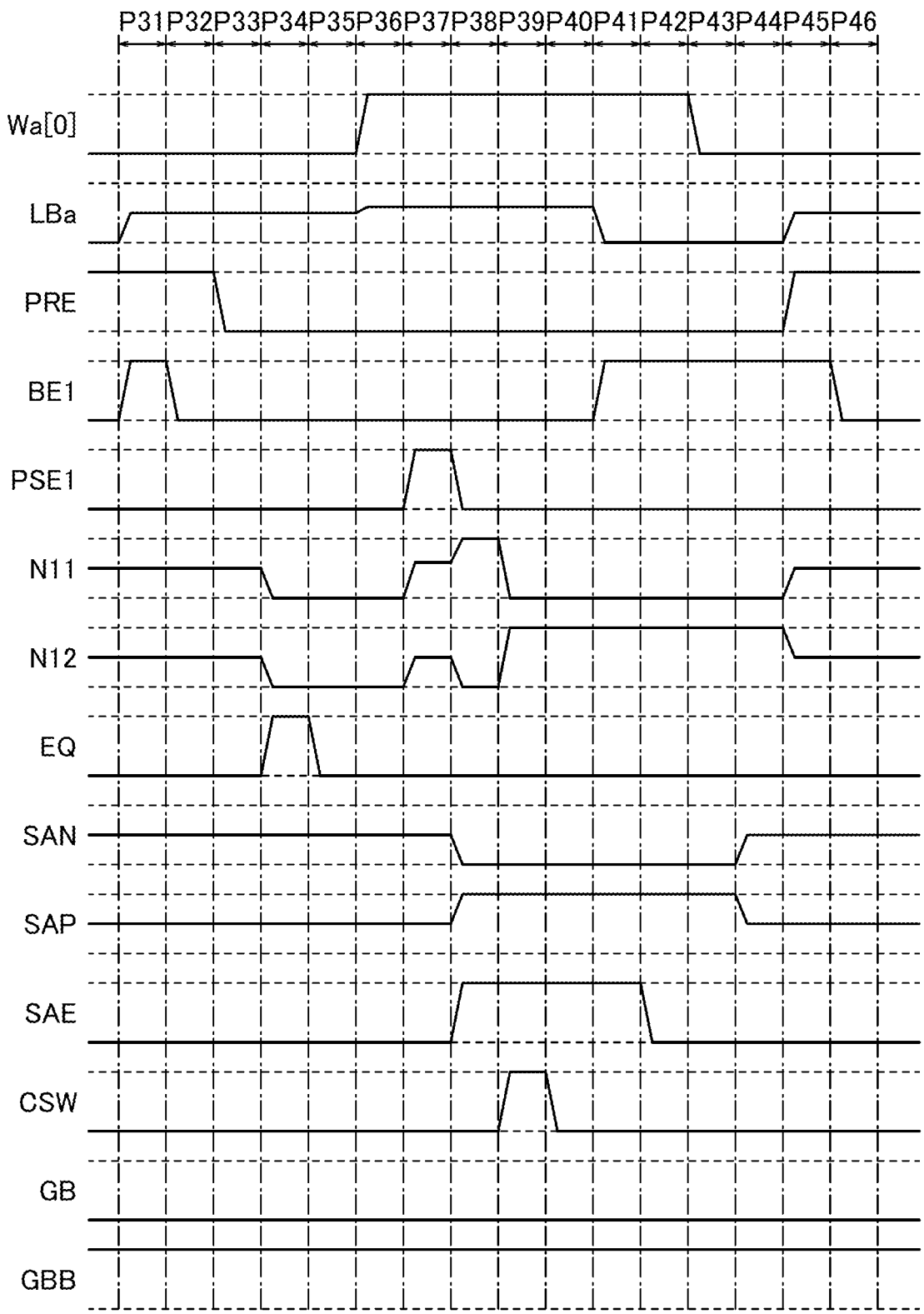
FIG. 15 A timing chart showing an operation example of the cell 10.
Figure 16:
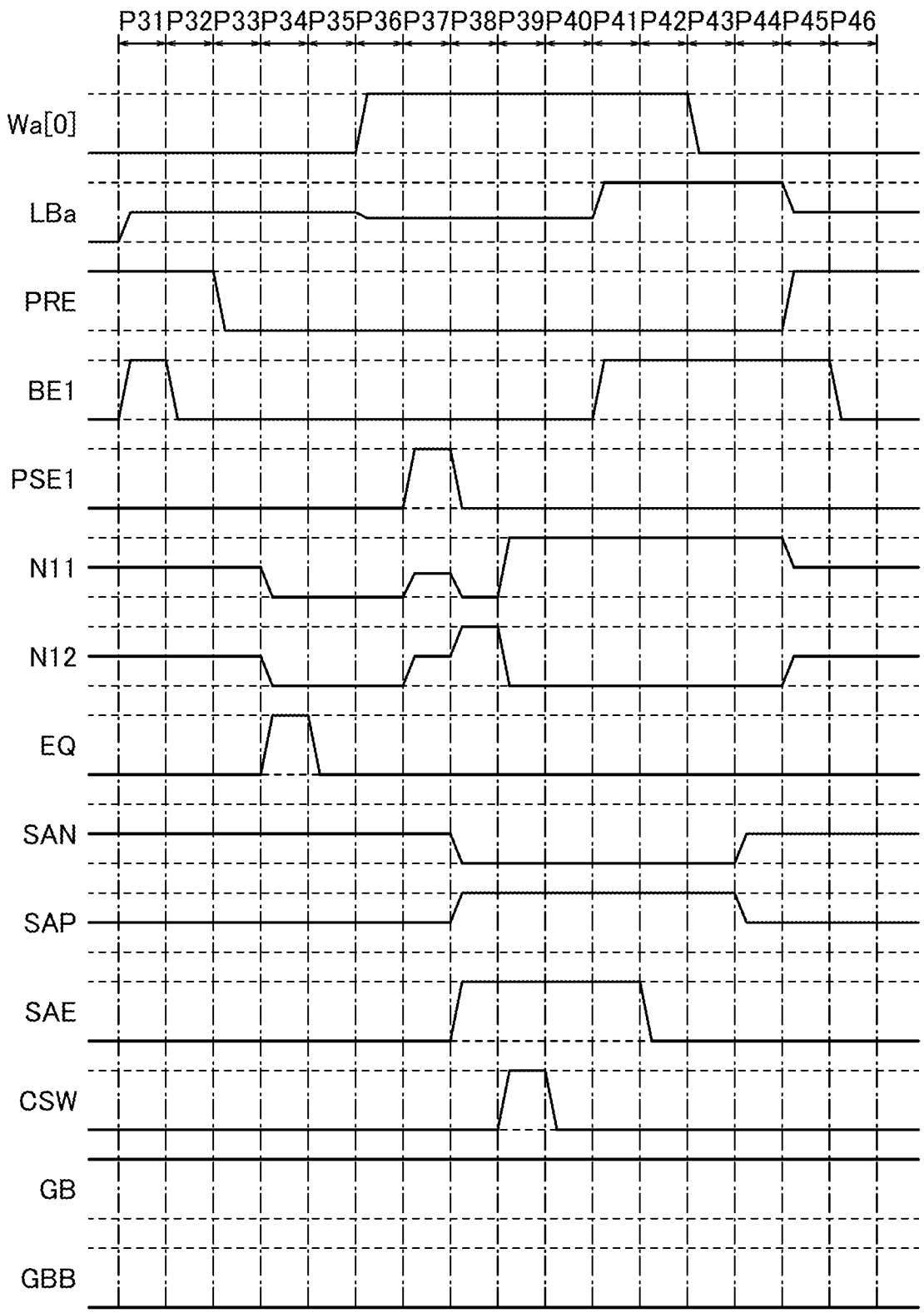
FIG. 16 A timing chart showing an operation example of the cell 10.

Next, an operation example of the cell 10 illustrated in FIG. 12 will be described. FIG. 13 to FIG. 16 are timing charts showing operation examples of the cell 10 illustrated in FIG. 12. FIG. 13 and FIG. 14 show operations in reading out data stored in a memory cell, and FIG. 15 and FIG. 16 show operations in writing data to a memory cell.

[Reading Operation]

Operations in reading out data stored in a memory cell will be described with reference to FIG. 13. Here, the operations when the data "L" stored in the memory cell 2a[0] is read out will be described in detail as a specific example.

First, in a period P11, the signal BE1 is at an H level, so that the transistors 40a and 40b are on. At this time, the signal PRE is at an H level and the transistors 23 and 24 are on; thus, the potential $V_{PRE}$ is supplied to the wirings LBa and LBb.

Next, in a period P12, the signal BE1 is at an L level, so that the transistors 40a and 40b are off. Thus, the wirings LBa and LBb are in an electrically floating state. After that, in a period P13, the signal PRE is at an L level, so that the transistors 23 and 24 are off.

Then, in a period P14, the signal EQ is at an H level, so that the transistors 61 to 63 are on. Thus, the nodes N11 and N12 are precharged to an L level. Then, in a period P15, the signal EQ is at an L level, so that the transistors 61 to 63 are off.

Then, in a period P16, the potential of the wiring Wa[0] is an H level, so that the transistor M1 of the memory cell 2a[0] is on. At this time, the data "L" is stored in the memory cell 2a[0], and thus, the potential of the wiring LBa is decreased owing to charge distribution. Meanwhile, the memory cell 2b[0] is in a non-selected state, and the potential of the wiring LBb is not changed.

Then, in a period P17, the signal PSE1 is at an H level, so that the transistors 5a and 5b are on. Accordingly, current flows through the transistors 6a and 6b, and the potentials of the nodes N11 and N12 are increased. Here, the wiring LBa has a lower potential than the wiring LBb; thus, the final potential of the node N11 is lower than that of the node N12.

Then, in a period P18, the signal SAE and the signal SAP are each at an H level and the signal SAN is at an L level, so that the sense amplifier 50 is in an operating state and the potential difference between the node N11 and the node N12 is amplified. As a result, the node N11 comes to be at an L level and the node N12 comes to be at an H level.

Then, in a period P19, the signal CSW is at an H level, so that the transistors 21 and 22 are on. Accordingly, the potential of the node N11 is output to the wiring GB and the potential of the node N12 is output to the wiring GBB. By determining the potential of the wiring GB at this time, data stored in the memory cell 2a[0] can be read out. Then, in a period P20, the signal CSW is at an L level, so that the transistors 21 and 22 are off.

Then, in a period P21, a wiring BE1 is at an H level, so that the transistor 40a is on. Then, in a period P22, the signal SAE is at an L level, so that the transistors 71 and 72 are off. Thus, current flowing through the transistor 71 can be stopped, so that the potential of the node N11 can be surely set to an L level. In this manner, the potential (L level) of the node N11 is supplied to the memory cell 2a[0], and the data "L" is written back to the memory cell 2a[0].

Then, in a period P23, the potential of the wiring Wa[0] is at an L level, so that the transistor M1 in the memory cell 2a[0] is off. Thus, the data "L" is retained in the memory cell 2a[0]. Then, in a period P24, the signal SAE and the signal SAP are each at an L level and the signal SAN is at an H level, and the sense amplifier 50 is in a halting state.

Then, in a period P25, the signal PRE is at an H level, so that the transistors 23 and 24 are on. Thus, the potential $V_{PRE}$ is supplied to the nodes N11 and N12. This causes the potentials of the wiring LBa and the wiring LBb to also become the potential $V_{PRE}$. After that, in a period P26, the signal BE1 is at an L level and the transistors 40a and 40b are off thus, the wiring LBa and the wiring LBb are in an electrically floating state. Thus, the cell is in the same state as that in the period P12.

Although the case where data stored in the memory cell 2a[0] is "L" is described here, data can also be read out by similar operations when data stored in the memory cell 2a[0] is "H". FIG. 14 shows a timing chart showing operations in reading out the data "H" from the memory cell 2a[0].

Since the data "H" is stored in the memory cell 2a[0], the potential of the wiring LBa is increased in the period P16. Thus, in the period P17, the potential of the node N11 is higher than that of the node N12. When the sense amplifier 50 is operated in this state in the period P18, the potential difference between the node N11 and the node N12 is amplified, and the node N11 comes to be at an H level and the node N12 comes to be at an L level. Then, in the period P19, these potentials are read out to the wiring GB and the wiring GBB. After that, in the period P21, the data "H" is written back to the memory cell 2a[0].

Through the above operations, the data stored in the memory cell 2a[0] can be read out.

[Write Operation]

Next, operations in writing data to a memory cell will be described with reference to FIG. 15. Here, operations when the data "L" is rewritten to the memory cell 2a[0] in which the data "H" is stored will be described in detail as a specific example.

Data can be written by operating the cell 10 in a manner similar to that when data is read out. Specifically, signals other than the potentials of the wiring LBa, the node N11, the node N12, the wiring GB, and the wiring GBB in FIG. 15 are controlled in the same manner as that in FIG. 13 and FIG. 14. Therefore, operations different from those in FIG. 13 and FIG. 14 will be mainly described below.

First, in a period P31, the potential of the wiring GB is an L level. The potential of the wiring GB corresponds to the data "L" written to the memory cell 2a[0]. An H-level potential is supplied to the wiring GBB.

After that, in a period P39, the signal CSW is at an H level, so that the transistors 21 and 22 are on. Accordingly, the potential of the wiring GB is supplied to the node N11 and the potential of the wiring GBB is supplied to the node N12. The potential difference between the node N11 and the node N12 is amplified by the sense amplifier 50. Then, in a period P40, the signal CSW is at an L level, so that the transistors 21 and 22 are off.

Then, in a period P41, the wiring BE1 is at an H level, so that the transistor 40a is on. Thus, the potential (L level) of the node N11 is supplied to the memory cell 2a[0], and the data "L" is written to the memory cell 2a[0]. Then, in a period P43, the potential of the wiring Wa[0] is an L level, so that the transistor M1 in the memory cell 2a[0] is off Thus, the data "L" is retained in the memory cell 2a[0].

Although the case where the data "L" is written to the memory cell 2a[0] is described here, the data "H" can be written to the memory cell 2a[0] by similar operations. FIG. 16 shows a timing chart showing operations in writing the data "H" to the memory cell 2a[0].

First, in the period P31, the potential of the wiring GB is an H level, and the potential of the wiring GBB is an L level. After that, in the period P39, the signal CSW is at an H level, and the potential of the wiring GB is supplied to the node N11 and the potential of the wiring GBB is supplied to the node N12. The potential difference between the node N11 and the node N12 is amplified by the sense amplifier 50.

In the period P41, the wiring BE1 is at an H level, so that the transistor 40a is on. Thus, the potential (H level) of the node N11 is supplied to the memory cell 2a[0], and the data "H" is written to the memory cell 2a[0]. Then, in the period P43, the potential of the wiring Wa[0] is an L level, so that the transistor M1 in the memory cell 2a[0] is off. Thus, the data "H" is retained in the memory cell 2a[0].

Through the above operations, data can be written to the memory cell 2a[0].

As described in this embodiment, the cell 10 can be composed of single-polarity circuits. This allows manufacturing cost reduction or area reduction.

The structure, composition, method, and the like described above in this embodiment can be used in appropriate combination with the structures, compositions, methods, and the like described in the other embodiments.

Embodiment 3

Figure 17:
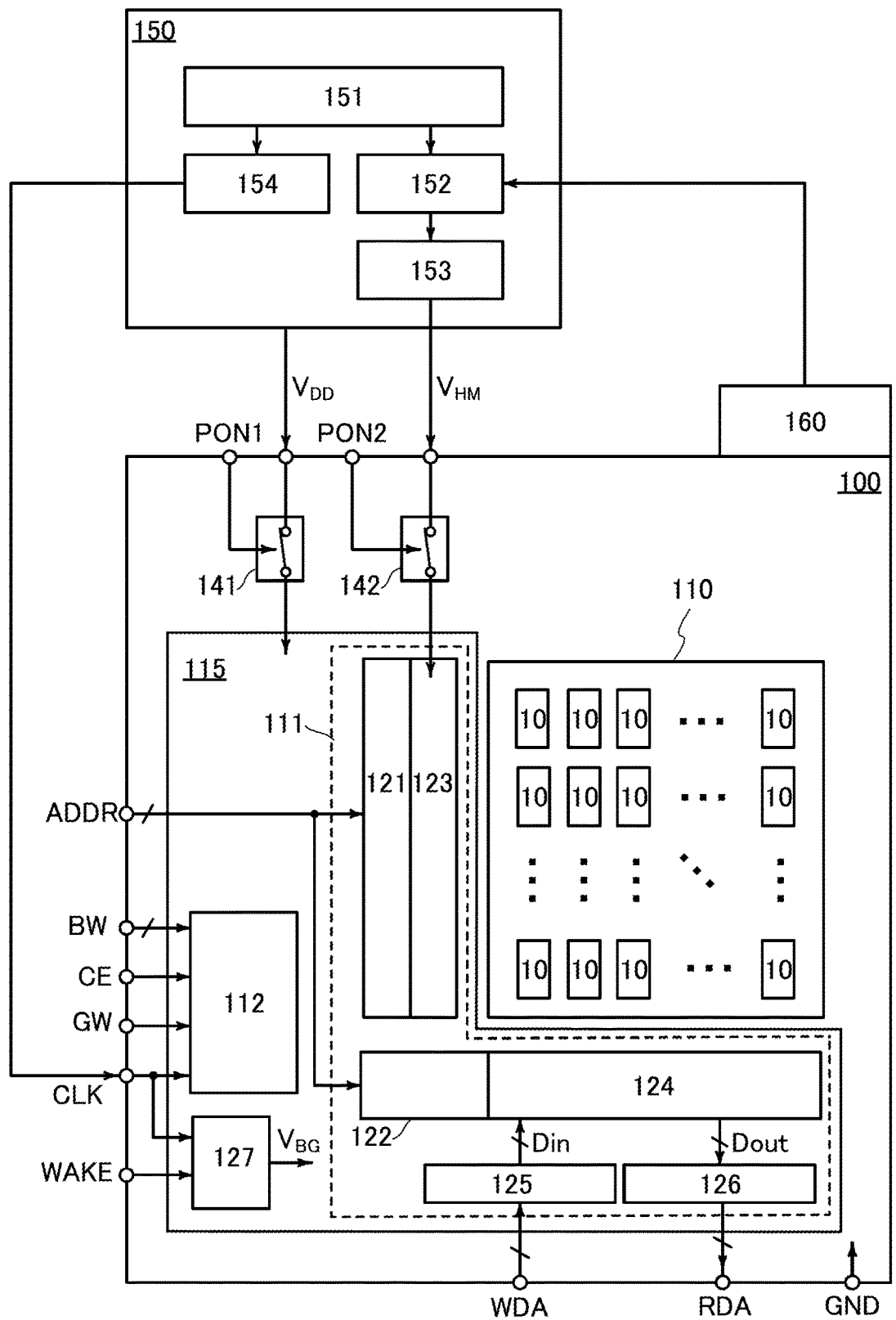
FIG. 17 A block diagram illustrating a configuration example of a power supply control portion.

In this embodiment, a structure example of a power supply control portion having a function of controlling power to be supplied to the memory device described in the above embodiment will be described with reference to FIG. 17.

Transistors (e.g., the transistor M1 illustrated in FIG. 2) used in the cell 10 of the memory device 100 tend to have an increased on-state current and a threshold voltage shifted in the negative direction at high temperature. Thus, in operating the memory device 100 in a high-temperature environment, data reading and data writing can be normally performed even when the potential of a signal (hereinafter, a selection signal) supplied to the cell 10 from the row driver 123 through the word lines (the wirings Wa, Wb, Wc, and Wd illustrated in FIG. 2) is low. Voltage stress easily degrade the transistors at high temperature. Therefore, in view of prevention of degradation of the transistors, the potential of the selection signal is preferably low in a high-temperature environment.

The potential of a required selection signal differs depending on the operating frequency of the memory device 100 in the case where the operating frequency is controlled using DVFS (Dynamic Voltage and Frequency Scaling). Specifically, in the case where the operating frequency is low, the operation of the memory device 100 can be maintained even when the potential of the selection signal is lowered. Power consumption can be reduced by decreasing the potential of the selection signal.

Thus, the potential of the selection signal is preferably controlled appropriately depending on the temperature or the operating frequency of the memory device 100. FIG. 17 illustrates a configuration example of a power supply control portion 150 having a function of controlling a power supply potential to be supplied to the memory device 100, according to the temperature and the operating frequency of the memory device 100.

The power supply control portion 150 has a function of supplying the power supply potentials ($V_{DD}$ and $V_{HM}$) and a clock signal CLK to the memory device 100. The power supply control portion 150 includes a DVFS control circuit 151, a regulator control circuit 152, a regulator 153, and an oscillator circuit 154. The power supply control portion 150 is connected to a sensing circuit 160.

The sensing circuit 160 has a function of sensing temperature. Specifically, the sensing circuit 160 has a function of sensing the temperature of the memory device 100 and outputting a signal corresponding to the temperature to the regulator control circuit 152. The power supply control portion 150 generates the potential $V_{HM}$ in accordance with the temperature sensed by the sensing circuit 160.

There is no particular limitation on the configuration of the circuit 160. For example, an on-chip temperature sensor formed with a diode or the like or a sensor IC can be used. The sensing circuit 160 can also be provided inside the memory device 100.

The DVFS control circuit 151 has a function of controlling the power supply potential and the operating frequency of the memory device 100. The potential $V_{DD}$ and the frequency of a clock signal CLK supplied to the memory device 100 can be controlled by the DVFS control circuit 151. Specifically, the DVFS control circuit 151 has a function of outputting a signal for controlling the power supply potential of the memory device 100 to the regulator control circuit 152. The DVFS control circuit 151 also has a function of outputting a signal for controlling the operating frequency of the memory device 100 to the oscillator circuit 154.

The regulator control circuit 152 has a function of controlling the potential $V_{HM}$ generated by the regulator 153. Specifically, the regulator control circuit 152 has a function of controlling the potential $V_{HM}$ in response to a signal input from the sensing circuit 160 and a signal input from the DVFS control circuit 151.

Specifically, the regulator control circuit 152 has a function of changing the potential $V_{HM}$ generated by the regulator 153, when the temperature of the memory device 100 sensed by the sensing circuit 160 becomes higher than or lower than a reference value. For example, the regulator control circuit 152 has a function of classifying the temperature of the memory device 100 sensed by the sensing circuit 160 into three stages of low temperature, medium temperature, and high temperature with the use of a comparator or the like, and making the regulator 153 generate the potential $V_{HM}$ according to the classification result (the higher the temperature of the memory device 100, the lower the potential).

The regulator control circuit 152 has a function of changing the potential $V_{HM}$ generated by the regulator 153, when the operating frequency set by the DVFS control circuit 151 becomes higher than or lower than a reference value. Specifically, the regulator control circuit 152 has a function of making the regulator 153 generate a lower potential $V_{HM}$ as the operating frequency of the memory device 100 is lower.

The number and values of reference values of the temperature of the memory device 100 and the number and values of reference values of the operating frequency of the memory device 100 can be set freely. The regulator control circuit 152 generates a control signal according to the temperature and the operating frequency of the memory device 100 and outputs the control signal to the regulator 153.

The regulator 153 has a function of generating the potential $V_{HM}$ to be supplied to the row driver 123. Specifically, the regulator 153 has a function of generating the potential $V_{HM}$ used to generate a selection signal, in response to a control signal input from the regulator control circuit 152, and supplying the potential $V_{HM}$ to the row driver 123.

The row driver 123 generates a selection signal with the use of the potential input from the regulator 153. In this manner, a selection signal is generated according to the temperature and operating frequency of the memory device 100.

The oscillator circuit 154 has a function of generating the clock signal CLK. Specifically, the oscillator circuit 154 has a function of generating the clock signal CLK according to the operating frequency of the memory device 100 in response to a signal input from the DVFS control circuit 151. The clock signal CLK generated by the oscillator circuit 154 is output to the memory device 100.

Although the case where the potential $V_{HM}$ is controlled according to both of the temperature and the operating frequency of the memory device 100 is described here, the potential $V_{HM}$ may be controlled according to one of the temperature and the operating frequency of the memory device 100.

With the above structure, the potential $V_{HM}$ used to generate a selection signal can be controlled according to the temperature or the operating frequency of the memory device 100. This can inhibit deterioration of the transistors and reduce power consumption.

The structure, composition, method, and the like described above in this embodiment can be used in appropriate combination with the structures, compositions, methods, and the like described in the other embodiments.

Embodiment 4

A structure example of an OS transistor that can be used as the transistor M1 described in Embodiment 1 will be described below with reference to FIG. 18 to FIG. 20.

Figure 18A:
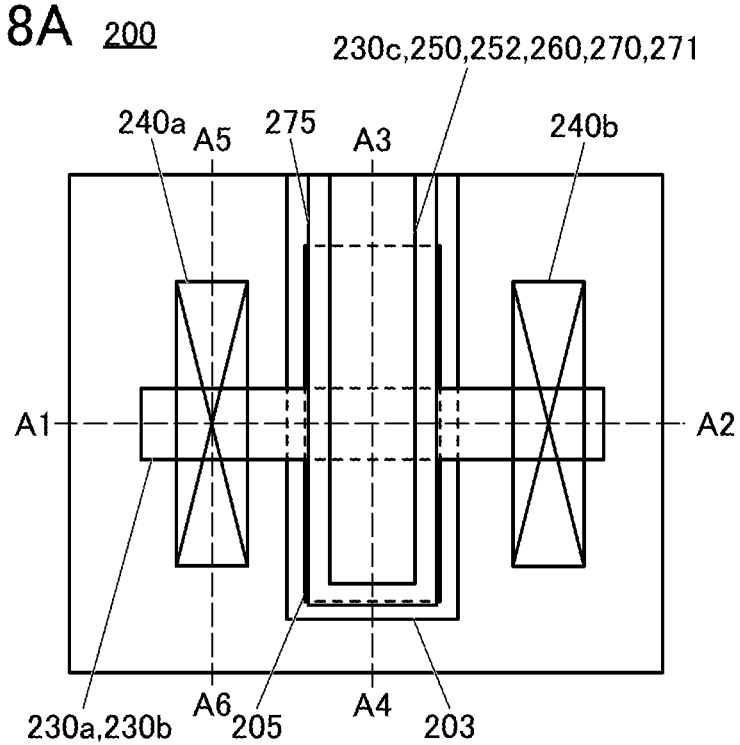
FIGS. 18A and 18B A top view and a cross-sectional view illustrating a structure example of a transistor.
Figure 18B:
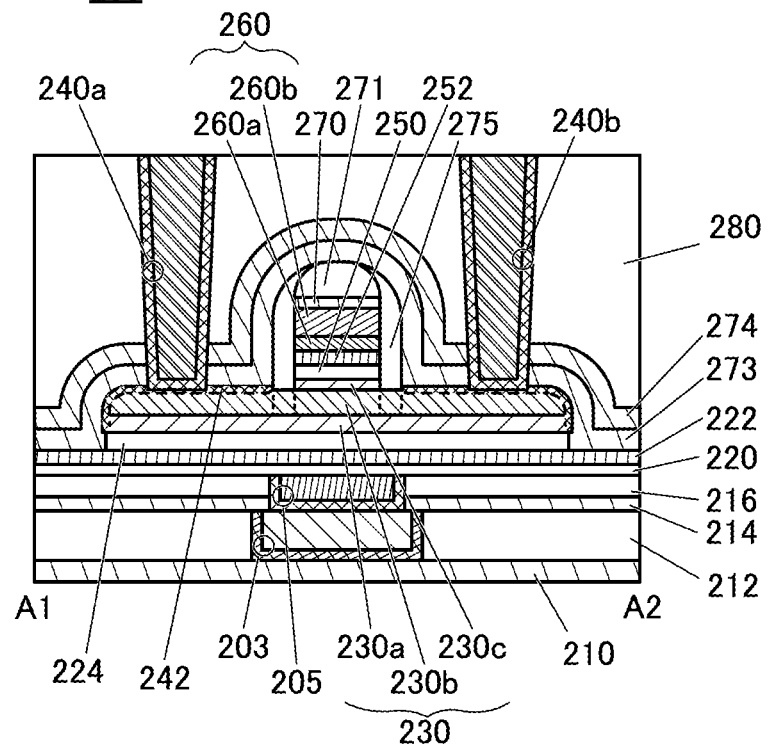
Figure 19A:
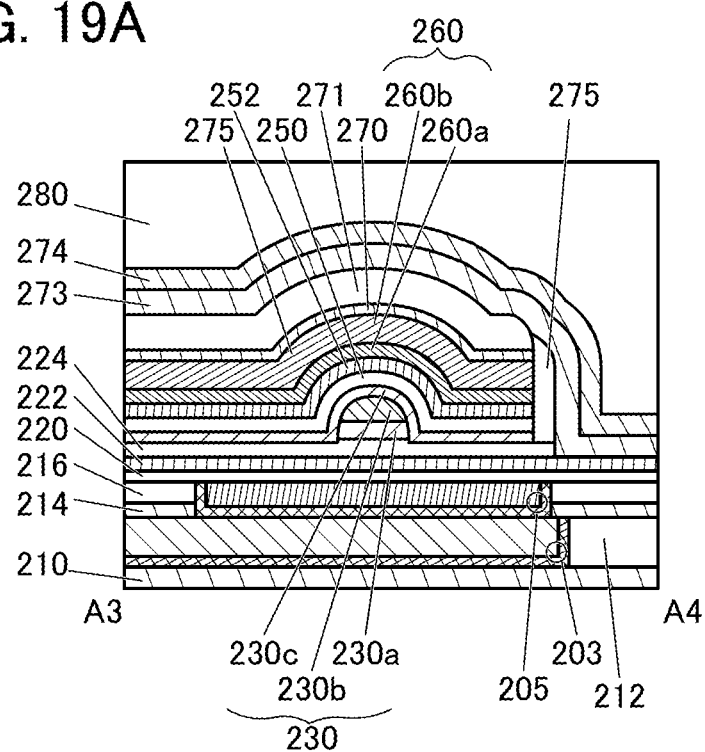
FIGS. 19A and 19B Cross-sectional views illustrating a structure example of a transistor.
Figure 19B:
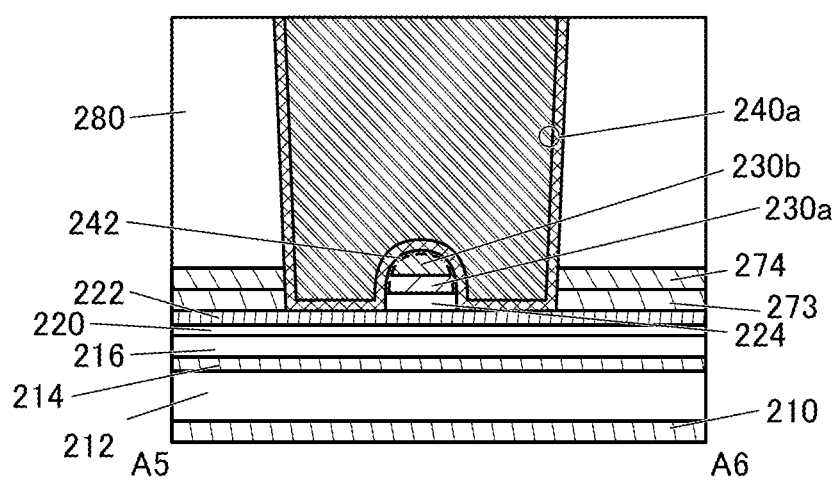

FIG. 18(A) is a top view of a transistor 200. FIG. 18(B), FIGS. 19(A) and 19(B), and FIG. 20 are cross-sectional views of the transistor 200. Here, FIG. 18(B) is a cross-sectional view of a portion indicated by a dashed-dotted line A1-A2 in FIG. 18(A), and is also a cross-sectional view in the channel length direction of the transistor 200. FIG. 19(A) is a cross-sectional view of a portion indicated by a dashed-dotted line A3-A4 in FIG. 18(A), and is also a cross-sectional view in the channel width direction of the transistor 200. FIG. 19(B) is a cross-sectional view of a portion indicated by a dashed-dotted line A5-A6 in FIG. 18(A), and is also a cross-sectional view of a source region or a drain region of the transistor 200. Note that for simplification of the drawing, some components in the top view of FIG. 18(A) are not illustrated.

The transistor 200 is an OS transistor and can be used as the transistor M1 described in Embodiment 1.

An insulator 210, an insulator 212, an insulator 273, an insulator 274, and an insulator 280 function as an interlayer film that protects the transistor 200.

The transistor 200 is electrically connected to a conductor 203 functioning as a wiring and a conductor 240 (a conductor 240a and a conductor 240b) functioning as a plug.

In the conductor 203, a first conductor is formed in contact with an inner wall of an opening in the insulator 212, and a second conductor is formed more inward than the first conductor. The top surfaces of the conductor 203 and the insulator 212 can be substantially level with each other. Although the structure in which the first conductor and the second conductor of the conductor 203 are stacked is described in this embodiment, the present invention is not limited thereto. The conductor 203 may have a single-layer structure or a stacked-layer structure of three or more layers, for example. In the case where a structure body has a stacked-layer structure, the layers may be distinguished by ordinal numbers given according to the formation order.

The insulator 273 is positioned over the transistor 200. The insulator 274 is positioned over the insulator 273. The insulator 280 is positioned over the insulator 274.

The conductor 240 is formed in contact with inner walls of openings in the insulator 273, the insulator 274, and the insulator 280. The top surface of the conductor 240 and the top surface of the insulator 280 can be substantially level with each other. Although the structure in which the conductor 240 has a stacked-layer structure of two layers is described in this embodiment, the present invention is not limited thereto. The conductor 240 may be a single layer or have a stacked-layer structure of three or more layers.

As illustrated in FIG. 18(B), the transistor 200 includes the insulator 214 and the insulator 216 positioned over a substrate (not illustrated), a conductor 205 positioned so as to be embedded in the insulator 214 and the insulator 216, an insulator 220 positioned over the insulator 216 and the conductor 205, an insulator 222 positioned over the insulator 220, an insulator 224 positioned over the insulator 222, an oxide semiconductor 230 (an oxide semiconductor 230a, an oxide semiconductor 230b, and an oxide semiconductor 230c) positioned over the insulator 224, an insulator 250 positioned over the oxide semiconductor 230, a metal oxide 252 positioned over the insulator 250, a conductor 260 (a conductor 260a and a conductor 260b) positioned over the metal oxide 252, an insulator 270 positioned over the conductor 260, an insulator 271 positioned over the insulator 270, an insulator 275 positioned in contact with at least the side surfaces of the oxide semiconductor 230c, the insulator 250, the metal oxide 252, and the conductor 260, and layers 242 formed over the oxide semiconductor 230. The conductor 240a is positioned in contact with one of the layers 242.

In the transistor 200, the one of the layers 242 functions as one of a source and a drain, the other of the layers 242 functions as the other of the source and the drain, the conductor 260 functions as a front gate, and the conductor 205 functions as a back gate.

Although the transistor 200 with a structure in which three layers of the oxide semiconductor 230a, the oxide semiconductor 230b, and the oxide semiconductor 230c are stacked is described, the present invention is not limited thereto. For example, a single-layer structure of the oxide semiconductor 230b, a two-layer structure of the oxide semiconductor 230b and the oxide semiconductor 230a, a two-layer structure of the oxide semiconductor 230b and the oxide semiconductor 230c, or a stacked-layer structure of four or more layers may be employed. Although the transistor 200 with a structure in which the conductor 260a and the conductor 260b are stacked is described, the present invention is not limited thereto.

Next, the details of the oxide semiconductor 230 used for the transistor 200 will be described. In the transistor 200, a metal oxide functioning as an oxide semiconductor (hereinafter also referred to as an oxide semiconductor) is preferably used as the oxide semiconductor 230 (the oxide semiconductor 230a, the oxide semiconductor 230b, and the oxide semiconductor 230c) including a channel formation region.

The transistor 200 using an oxide semiconductor in its channel formation region has an extremely low leakage current in an off state; thus, a memory device with low power consumption can be provided. An oxide semiconductor can be deposited by a sputtering method or the like, and thus can be used for the transistor 200 included in a highly integrated memory device.

For example, as the oxide semiconductor 230, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide semiconductor 230, an In—Ga oxide or an In—Zn oxide may be used.

Besides the constituent element of the oxide semiconductor, a metal element such as aluminum, ruthenium, titanium, tantalum, chromium, or tungsten is added to the oxide semiconductor, whereby the oxide semiconductor forms a metal compound to have reduced resistance. Note that aluminum, titanium, tantalum, tungsten, or the like is preferably used.

To add a metal element to the oxide semiconductor, for example, a metal film, a nitride film containing the metal element, or an oxide film containing the metal element is provided over the oxide semiconductor. By providing the film, some oxygen at the interface of the film and the oxide semiconductor or in the oxide semiconductor in the vicinity of the interface may be absorbed into the film or the like and an oxygen vacancy may be formed, so that the resistance in the vicinity of the interface may be reduced.

After the metal film, the nitride film containing the metal element, or the oxide film containing the metal element is provided over the oxide semiconductor, heat treatment is preferably performed in an atmosphere containing nitrogen. By the heat treatment in an atmosphere containing nitrogen, the metal element contained in the metal film, the nitride film containing the metal element, or the oxide film containing the metal element diffuses into the oxide semiconductor, or the metal element contained in the oxide semiconductor diffuses into the film. Accordingly, the oxide semiconductor forms a metal compound with the film to have reduced resistance. The metal element added to the oxide semiconductor is brought into a relatively stable state when the oxide semiconductor and the metal element form a metal compound; thus, a highly reliable memory device can be provided.

At the interface between the oxide semiconductor and the metal film, the nitride film containing the metal element, or the oxide film containing the metal element, a compound layer (also referred to as another layer) may be formed. Note that the compound layer (another layer) is a layer containing a metal compound containing a component of the metal film, the nitride film containing the metal element, or the oxide film containing the metal element and a component of the oxide semiconductor. For example, as the compound layer, a layer where the metal element of the oxide semiconductor and the metal element added are alloyed may be formed. The alloyed layer is in a relatively stable state; therefore, a highly reliable memory device can be provided.

In the case where hydrogen in the oxide semiconductor diffuses into a low-resistance region of the oxide semiconductor and enters an oxygen vacancy in the low-resistance region, the hydrogen becomes relatively stable. It is known that hydrogen in the oxygen vacancy in the oxide semiconductor is released from the oxygen vacancy by heat treatment at 250° C. or higher, diffuses into a low-resistance region of the oxide semiconductor, enters an oxygen vacancy in the low-resistance region, and becomes relatively stable. Thus, by the heat treatment, the resistance of the low-resistance region of the oxide semiconductor or a region where the metal compound is formed tends to be further reduced, and the oxide semiconductor whose resistance is not reduced tends to be highly purified (reduction of impurities such as water or hydrogen) to have increased resistance.

The oxide semiconductor has an increased carrier density when an impurity element such as hydrogen or nitrogen exists therein. Hydrogen in the oxide semiconductor reacts with oxygen bonded to a metal atom, to be water, and thus, forms an oxygen vacancy in some cases. Entry of hydrogen into the oxygen vacancy increases carrier density. Furthermore, in some cases, part of hydrogen is bonded to oxygen bonded to a metal atom, whereby an electron serving as a carrier is generated. That is, the resistance of an oxide semiconductor containing nitrogen or hydrogen is reduced.

Thus, selective addition of a metal element and an impurity element such as hydrogen and nitrogen to the oxide semiconductor allows a high-resistance region and a low-resistance region to be provided in the oxide semiconductor. In other words, when the resistance of the oxide semiconductor 230 is selectively reduced, a region functioning as a semiconductor having a low carrier density and low-resistance region functioning as the source region or the drain region can be provided in the oxide semiconductor 230 obtained by processing into an island shape.

Figure 20:
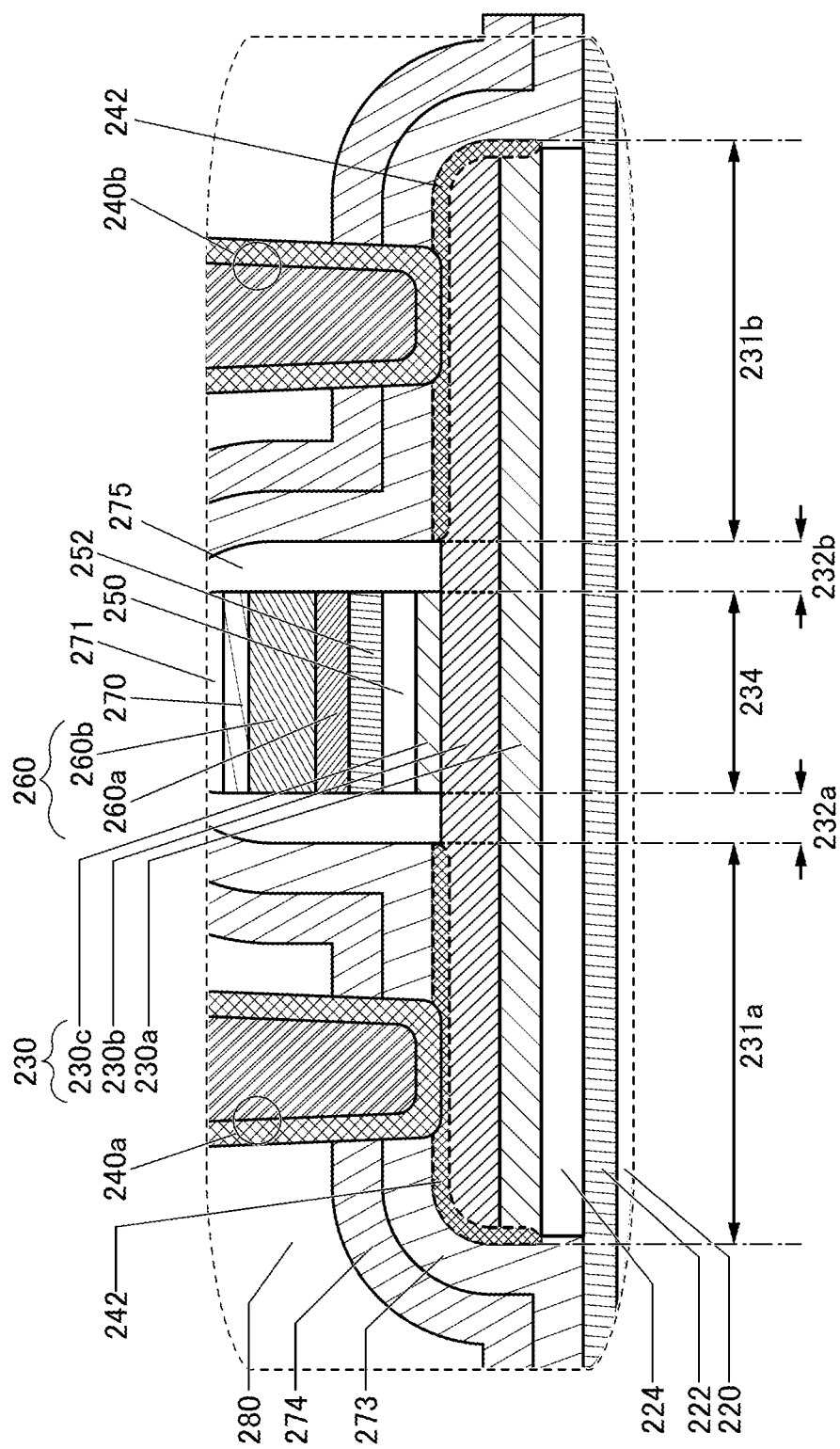
FIG. 20 A cross-sectional view illustrating a structure example of a transistor.

Here, FIG. 20 illustrates an enlarged view of a region including the oxide semiconductor 230b whose resistance is selectively reduced, which is surrounded by a dashed line in FIG. 18(B).

As illustrated in FIG. 20, the oxide semiconductor 230 includes a region 234 functioning as a channel formation region of the transistor, a region 231 (a region 231a and a region 231b) functioning as a source region and a drain region, and a region 232 (a region 232a and a region 232b) provided between the region 234 and the region 231.

The region 231 functioning as the source region or the drain region is a region with a low oxygen concentration and reduced resistance. The region 234 functioning as the channel formation region is a high-resistance region having a higher oxygen concentration and a lower carrier density than the region 231 functioning as the source region or the drain region. The region 232 has a higher oxygen concentration and a lower carrier density than the region 231 functioning as the source region or the drain region and has a lower oxygen concentration and a higher carrier density than the region 234 functioning as the channel formation region.

The concentration of at least one of a metal element and an impurity element such as hydrogen and nitrogen in the region 231 is preferably higher than those in the region 232 and the region 234.

For example, in addition to the oxide semiconductor 230, the region 231 preferably contains one or more metal elements selected from aluminum, titanium, tantalum, tungsten, chromium, and the like.

In order to form the region 231, for example, a film containing the metal element is provided in contact with the region 231 of the oxide semiconductor 230. The film containing the metal element is preferably removed by etching after the region 231 is formed. Note that as the film containing the metal element, a metal film, an oxide film containing a metal element, or a nitride film containing a metal element can be used. In that case, the layer 242 may be formed at the interface between the oxide semiconductor 230 and the film containing the metal element. For example, the layer 242 may be formed on the top surface and the side surface of the oxide semiconductor 230. Note that the layer 242 is a layer containing a metal compound containing a component of the film containing the metal element and a component of the oxide semiconductor 230. Thus, the layer 242 can also be referred to as a compound layer. For example, as the layer 242, a layer in which the metal element of the oxide semiconductor 230 and the metal element added are alloyed may be formed.

Addition of the metal element to the oxide semiconductor 230 can form a metal compound in the oxide semiconductor 230, and the resistance of the region 231 can be reduced.

The region 231 includes a low-resistance region of the layer 242 in some cases. For this reason, at least part of the layer 242 functions as the source region or the drain region of the transistor 200 in some cases.

The region 232 includes a region overlapping with the insulator 275. The concentration of at least one of metal elements such as aluminum, titanium, tantalum, tungsten, and chromium and impurity elements such as hydrogen and nitrogen in the region 232 is preferably higher than that in the region 234. For example, when the film containing the metal element is provided in contact with the region 231 of the oxide semiconductor 230, a component of the film containing the metal element and a component of the oxide semiconductor form a metal compound in some cases. The metal compound attracts hydrogen contained in the oxide semiconductor 230 in some cases. Thus, the hydrogen concentration of the region 232 in the vicinity of the region 231 may be increased.

One or both of the region 232a and the region 232b may have a structure including a region overlapping with the conductor 260.

Although the region 234, the region 231, and the region 232 are formed in the oxide semiconductor 230b in FIG. 20, they are not limited thereto. Alternatively, these regions may also be formed in the layer 242, a compound layer formed between the layer 242 and the oxide semiconductor 230, the oxide semiconductor 230a, and the oxide semiconductor 230c, for example. Furthermore, although the boundaries between the regions are shown substantially perpendicular to the top surface of the oxide semiconductor 230 in FIG. 20, this embodiment is not limited thereto. For example, in some cases, the region 232 projects to the conductor 260 side in the vicinity of the top surface of the oxide semiconductor 230b, and the region 232 recedes to the conductor 240a side or the conductor 240b side in the vicinity of the bottom surface of the oxide semiconductor 230a.

In the oxide semiconductor 230, the boundaries between the regions are difficult to be clearly observed in some cases. The concentration of a metal element and impurity elements such as hydrogen and nitrogen, which is detected in each region, may be gradually changed (such a change is also referred to as gradation) not only between the regions but also in each region. That is, the region closer to the channel formation region preferably has a lower concentration of a metal element and an impurity element such as hydrogen and nitrogen.

In order to selectively reduce the resistance of the oxide semiconductor 230, at least one of an impurity and metal elements that increase conductivity, such as aluminum, titanium, tantalum, tungsten, and chromium, is added to a desired region. As the impurity, an element that forms an oxygen vacancy, an element trapped by an oxygen vacancy, or the like is used. Examples of the element include hydrogen, boron, carbon, nitrogen, fluorine, phosphorus, sulfur, chlorine, and a rare gas. Typical examples of the rare gas element are helium, neon, argon, krypton, and xenon.

When the content of the metal element that increases conductivity, the element that forms an oxygen vacancy, or the element trapped by an oxygen vacancy in the region 231 is increased, the carrier density is increased and the resistance can be reduced.

In order to reduce the resistance of the region 231, for example, the film containing the metal element is preferably formed in contact with the region 231 of the oxide semiconductor 230. As the film containing the metal element, a metal film, an oxide film containing a metal element, a nitride film containing a metal element, or the like can be used. The film containing the metal element is preferably provided over the oxide semiconductor 230 with at least the insulator 250, the metal oxide 252, the conductor 260, the insulator 270, the insulator 271, and the insulator 275 therebetween. Note that the film containing the metal element preferably has a thickness greater than or equal to 10 nm and less than or equal to 200 nm. For example, the film containing the metal element is a film containing a metal element such as aluminum, titanium, tantalum, tungsten, or chromium. Note that the film containing the metal element can be formed by a sputtering method, a CVD method, an MBE method, a PLD method, an ALD method, or the like.

When the oxide semiconductor 230 and the film containing the metal element are in contact with each other, a component of the film containing the metal element and a component of the oxide semiconductor 230 form a metal compound, whereby the region 231 is formed to have low resistance. Oxygen in the oxide semiconductor 230 positioned at or in the vicinity of the interface between the oxide semiconductor 230 and the film containing the metal element is partly absorbed in the layer 242; thus, oxygen vacancies are formed in the oxide semiconductor 230 and the region 231 with reduced resistance is formed, in some cases.

Heat treatment is preferably performed in an atmosphere containing nitrogen in the state where the oxide semiconductor 230 is in contact with the film containing the metal element. By the heat treatment, the metal element which is a component of the film containing the metal element is diffused from the film into the oxide semiconductor 230, or the metal element which is a component of the oxide semiconductor 230 is diffused into the film. As a result, the oxide semiconductor 230 and the film form a metal compound to reduce the resistance of the oxide semiconductor 230. In this manner, the layer 242 is formed between the oxide semiconductor 230 and the film containing the metal element. At this time, the metal element of the oxide semiconductor 230 may be alloyed with the metal element of the film containing the metal element. Thus, the layer 242 may contain an alloy. The alloy is in a relatively stable state, so that a highly reliable memory device can be provided.

The heat treatment is performed, for example, at higher than or equal to 250° C. and lower than or equal to 650° C., preferably higher than or equal to 300° C. and lower than or equal to 500° C., more preferably higher than or equal to 320° C. and lower than or equal to 450° C. The heat treatment is performed in a nitrogen or inert gas atmosphere. Alternatively, the heat treatment may be performed under a reduced pressure. Alternatively, heat treatment may be performed in a nitrogen or inert gas atmosphere, and then, heat treatment may be performed in an atmosphere containing an oxidizing gas.

In the case where hydrogen in the oxide semiconductor 230 diffuses into the region 231 and enters an oxygen vacancy in the region 231, the hydrogen becomes relatively stable. Hydrogen in an oxygen vacancy in the region 234 is released from the oxygen vacancy by heat treatment at 250° C. or higher, diffuses into the region 231, enters an oxygen vacancy in the region 231, and becomes relatively stable. Thus, by the heat treatment, the resistance of the region 231 is further reduced. The region 234 is highly purified (reduction of impurities such as water or hydrogen) and the resistance of the region 234 is further increased.

In contrast, since regions (the region 234 and the region 232) of the oxide semiconductor 230 overlapping with the conductor 260 or the insulator 275 are covered by the conductor 260 and the insulator 275, addition of a metal element to the regions is inhibited. Furthermore, oxygen atoms in the oxide semiconductor 230 are inhibited from being absorbed into the film containing the metal element in the region 234 and the region 232 of the oxide semiconductor 230.

An oxygen vacancy is sometimes formed in the region 231 and the region 232 due to absorption of oxygen in the region 231 of the oxide semiconductor 230 and the region 232 of the oxide semiconductor 230 adjacent to the region 231 into the film containing the metal element. Entry of hydrogen in the oxide semiconductor 230 into the oxygen vacancy increases the carrier density of the region 231 and the region 232. Therefore, the resistance of the region 231 and the region 232 of the oxide semiconductor 230 becomes low.

In the case where the film containing the metal element has a property of absorbing hydrogen, hydrogen in the oxide semiconductor 230 is absorbed into the film. Thus, hydrogen, which is an impurity in the oxide semiconductor 230, can be reduced. The film containing the metal element is removed later by etching; accordingly, a large part of hydrogen absorbed from the oxide semiconductor 230 is removed.

A transistor using an oxide semiconductor is likely to have its electrical characteristics changed by impurities and oxygen vacancies in a channel formation region of the oxide semiconductor, which might affect the reliability. Moreover, when the channel formation region of the oxide semiconductor includes oxygen vacancies, the transistor tends to have normally-on characteristics. Thus, the amount of oxygen vacancies in the region 234 functioning as a channel formation region is preferably reduced as much as possible.

As illustrated in FIG. 20, the insulator 275 whose oxygen content is higher than that in the stoichiometric composition (hereinafter also referred to as excess oxygen) is preferably provided in contact with the insulator 250, the region 232 of the oxide semiconductor 230b, and the oxide semiconductor 230c. That is, excess oxygen contained in the insulator 275 is diffused into the region 234 of the oxide semiconductor 230, whereby the amount of oxygen vacancies in the region 234 of the oxide semiconductor 230 can be reduced.

In order to provide an excess oxygen region in the insulator 275, an oxide is preferably formed by a sputtering method as the insulator 273 in contact with the insulator 275. The oxide formed by a sputtering method can be an insulator containing few impurities such as water or hydrogen. Deposition by a sputtering method is preferably performed with use of a facing-target sputtering apparatus, for example. The facing-target sputtering apparatus is preferred because deposition can be performed without exposing a deposition surface to a high electric field region between facing targets; the film-formation surface is less likely to be damaged due to plasma. Thus, deposition damage to the oxide semiconductor 230 during the deposition of the insulator to be the insulator 273 can be small. A deposition method using the facing-target sputtering apparatus can be referred to as VDSP (Vapor Deposition SP, a registered trademark).

During deposition by a sputtering method, ions and sputtered particles exist between a target and a substrate. For example, a potential $E_0$ is supplied to the target, to which a power source is connected. A potential $E_1$ such as a ground potential is supplied to the substrate. Note that the substrate may be electrically floating. In addition, there is a region at a potential $E_2$ between the target and the substrate. The potential relationship is $E_2 > E_1 > E_0$.

The ions in plasma are accelerated by a potential difference $E_2 - E_0$ and collide with the target, whereby the sputtered particles are ejected from the target. These sputtered particles are attached on a deposition surface and deposited thereon; as a result, a film is formed. Some ions recoil from the target and might pass through the formed film as recoil ions, and be taken into the insulator 275 in contact with the deposition surface. The ions in the plasma are accelerated by a potential difference $E_2-E_1$ and collide with the deposition surface. At this time, some ions reach the inside of the insulator 275. The ions are taken into the insulator 275 so that a region into which the ions are taken is formed in the insulator 275. That is, an excess oxygen region is formed in the insulator 275 in the case where the ions contain oxygen.

Introduction of oxygen into the insulator 275 can form an excess oxygen region in the insulator 275. The excess oxygen in the insulator 275 is supplied to the region 234 of the oxide semiconductor 230 and can compensate for oxygen vacancies in the oxide semiconductor 230.

As the insulator 275, silicon oxide, silicon oxynitride, silicon nitride oxide, or porous silicon oxide is preferably used. An excess oxygen region is likely to be formed in a material such as silicon oxynitride. In contrast, an excess oxygen region is less likely to be formed in the oxide semiconductor 230 than in the aforementioned material such as silicon oxynitride even when an oxide film formed by a sputtering method is formed over the oxide semiconductor 230. Therefore, providing the insulator 275 including an excess oxygen region in the periphery of the region 234 of the oxide semiconductor 230 makes it possible to effectively supply excess oxygen in the insulator 275 to the region 234 of the oxide semiconductor 230.

As the insulator 273, aluminum oxide is preferably used. When heat treatment is performed in the state where aluminum oxide is close to the oxide semiconductor 230, the aluminum oxide may extract hydrogen in the oxide semiconductor 230. When the layer 242 is provided between the oxide semiconductor 230 and the aluminum oxide, hydrogen in the layer 242 is absorbed by the aluminum oxide and the layer 242 with reduced hydrogen may absorb hydrogen in the oxide semiconductor 230. Thus, the hydrogen concentration in the oxide semiconductor 230 can be lowered. When heat treatment is performed in the state where the insulator 273 and the oxide semiconductor 230 are close to each other, oxygen can be supplied from the insulator 273 to the oxide semiconductor 230, the insulator 224, or the insulator 222, in some cases.

When the above structures or the above steps are combined, the resistance of the oxide semiconductor 230 can be selectively reduced.

In formation of a low-resistance region in the oxide semiconductor 230, the resistance of the oxide semiconductor 230 is lowered in a self-aligned manner with use of the conductor 260 functioning as a gate electrode and the insulator 275 as masks. Therefore, when the plurality of transistors 200 are formed simultaneously, variations in electrical characteristics of the transistors can be reduced. The transistor 200 can be miniaturized when the conductor 260 has the minimum feature width.

Thus, by appropriately selecting the areas of the regions, a transistor having electrical characteristics that satisfy requirement for the circuit design can be easily provided.

The details of components of the transistor 200 will be described below.

The conductor 203 extends in the channel width direction as illustrated in FIG. 19(A) and functions as a wiring that applies a potential to the conductor 205. The conductor 203 is preferably provided so as to be embedded in the insulator 212. Note that the extending direction of the conductor 203 is not limited thereto; for example, the conductor 203 may extend in the channel length direction of the transistor 200.

The conductor 205 is positioned so as to overlap with the oxide semiconductor 230 and the conductor 260. The conductor 205 is preferably provided over and in contact with the conductor 203. Furthermore, the conductor 205 is preferably provided so as to be embedded in the insulator 214 and the insulator 216.

Here, the conductor 260 functions as a first gate (also referred to as a front gate) electrode, and the conductor 205 functions as a second gate (also referred to a back gate) electrode, in some cases.

The conductor 205 is positioned so as to overlap with the oxide semiconductor 230 and the conductor 260 as described above. The conductor 205 is preferably provided larger than the region 234 of the oxide semiconductor 230. In particular, as illustrated in FIG. 19(A), it is preferable that the conductor 205 also extend beyond the end portion of the region 234 of the oxide semiconductor 230, which intersects with the channel width direction. That is, the conductor 205 and the conductor 260 preferably overlap with each other with the insulator therebetween in the side surface of the oxide semiconductor 230 in the channel width direction.

With the above structure, in the case where potentials are applied to the conductor 260 and the conductor 205, an electric field generated from the conductor 260 and an electric field generated from the conductor 205 are connected, so that the channel formation region in the oxide semiconductor 230 can be covered.

That is, a channel formation region of the region 234 can be electrically surrounded by the electric field of the conductor 260 having a function of a first gate electrode and the electric field of the conductor 205 having a function of a second gate electrode.

In the conductor 205, a first conductor is formed in contact with an inner wall of an opening in the insulator 214 and the insulator 216 and a second conductor is formed more inward than the first conductor. The top surfaces of the first conductor and the second conductor can be substantially level with the top surface of the insulator 216. Although the first conductor of the conductor 205 and the second conductor of the conductor 205 are stacked in the transistor 200, the present invention is not limited thereto. For example, the conductor 205 may have a single-layer structure or a stacked-layer structure of three or more layers.

For the first conductor of the conductor 205 or the first conductor of the conductor 203, a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, a conductive material through which the above impurities are less likely to pass is preferably used. Alternatively, a conductive material having a function of inhibiting diffusion of at least one kind of oxygen such as oxygen atoms and oxygen molecules, that is, a conductive material through which the above oxygen is less likely to pass is preferably used. Note that in this specification, a function of inhibiting diffusion of impurities or oxygen means a function of inhibiting diffusion of any one or all of the above impurities and the above oxygen.

When the first conductor of the conductor 205 or the first conductor of the conductor 203 has a function of inhibiting diffusion of oxygen, the conductivity of the second conductor of the conductor 205 or the second conductor of the conductor 203 can be inhibited from being lowered because of oxidization. As a conductive material having a function of inhibiting diffusion of oxygen, for example, tantalum, tantalum nitride, ruthenium, ruthenium oxide is preferably used. Thus, the first conductor of the conductor 205 or the first conductor of the conductor 203 may be a single layer or a stack of the above conductive materials. Thus, impurities such as water and hydrogen can be inhibited from being diffused into the transistor 200 side through the conductor 203 and the conductor 205.

A conductive material containing tungsten, copper, or aluminum as its main component is preferably used for the second conductor of the conductor 205. Note that the second conductor of the conductor 205 is a single layer in the drawing but may have a stacked-layer structure; for example, the second conductor of the conductor 205 may be a stack of the above conductive material and titanium or titanium nitride.

The second conductor of the conductor 203 functions as a wiring, and thus, a conductor having higher conductivity than the second conductor of the conductor 205 is preferably used. For example, a conductive material containing copper or aluminum as its main component can be used. The second conductor of the conductor 203 may have a stacked-layer structure; for example, the second conductor of the conductor 203 may be a stack of the above conductive material and titanium or titanium nitride.

It is preferable to use copper for the conductor 203. Copper is preferably used for the wiring and the like because of its low resistance. However, copper is easily diffused; copper may reduce the electrical characteristics of the transistor 200 when diffused into the oxide semiconductor 230. In view of the above, for example, a material such as aluminum oxide or hafnium oxide through which copper is hardly allowed to pass is used for the insulator 214, whereby diffusion of copper can be inhibited.

The conductor 205, the insulator 214, and the insulator 216 are not necessarily provided. In this case, part of the conductor 203 can function as the second gate electrode.

The insulator 210 and the insulator 214 preferably function as barrier insulating films for inhibiting impurities such as water or hydrogen from entering the transistor 200 from the substrate side. Thus, for the insulator 210 and the insulator 214, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, an insulating material through which the above impurities are less likely to pass is preferably used. Alternatively, an insulating material having a function of inhibiting diffusion of at least one kind of oxygen such as oxygen atoms and oxygen molecules, that is, an insulating material through which the above oxygen is less likely to pass is preferably used. Furthermore, an insulator functioning as a barrier insulating film similar to the insulator 210 or the insulator 214 may be provided over the insulator 280. This can inhibit impurities such as water or hydrogen from entering the transistor 200 from above the insulator 280.

For example, it is preferable that aluminum oxide or the like be used for the insulator 210 and silicon nitride or the like be used for the insulator 214. This can inhibit impurities such as hydrogen and water from diffusing to the transistor 200 side from the substrate side of the insulator 210 and the insulator 214. Oxygen contained in the insulator 224 and the like can be inhibited from diffusing to the substrate side of the insulator 210 and the insulator 214.

Furthermore, with the structure in which the conductor 205 is stacked over the conductor 203, the insulator 214 can be provided between the conductor 203 and the conductor 205. Here, even when a metal that is easily diffused, such as copper, is used as the second conductor of the conductor 203, silicon nitride or the like provided as the insulator 214 can inhibit diffusion of the metal to a layer above the insulator 214.

The dielectric constants of the insulator 212, the insulator 216, and the insulator 280 functioning as interlayer films are preferably lower than that of the insulator 210 or the insulator 214. When a material with a low dielectric constant is used for an interlayer film, the parasitic capacitance generated between wirings can be reduced.

For example, for the insulator 212, the insulator 216, and the insulator 280, a single layer or a stack of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or (Ba, Sr)$TiO_3$ (BST) can be used. In addition, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulators.

The insulator 220, the insulator 222, and the insulator 224 have a function of a gate insulator.

For the insulator 224 in contact with the oxide semiconductor 230, an insulator whose oxygen content is higher than that in the stoichiometric composition is preferably used. That is, an excess oxygen region is preferably formed in the insulator 224. When such an insulator containing excess oxygen is provided in contact with the oxide semiconductor 230, the amount of oxygen vacancies in the oxide semiconductor 230 can be reduced, whereby the reliability of the transistor 200 can be improved.

As the insulator including an excess oxygen region, specifically, an oxide material from which part of oxygen is released by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, more preferably $2.0 \times 10^{19}$ atoms/cm$^3$ or greater than or equal to $3.0 \times 10^{20}$ atoms/cm$^3$ in thermal desorption spectroscopy (TDS) analysis. Note that the temperature range of the film surface in the TDS analysis is preferably higher than or equal to 100° C. and lower than or equal to 700° C. or higher than or equal to 100° C. and lower than or equal to 400° C.

In the case where the insulator 224 includes an excess oxygen region, it is preferable that the insulator 222 have a function of inhibiting diffusion of at least one kind of oxygen such as oxygen atoms and oxygen molecules, that is, the oxygen be less likely to pass through the insulator 222.

When the insulator 222 has a function of inhibiting diffusion of oxygen, oxygen in the excess oxygen region of the insulator 224 is not diffused into the insulator 220 side and thus can be supplied to the oxide semiconductor 230 efficiently. Moreover, the conductor 205 can be inhibited from reacting with oxygen in the excess oxygen region of the insulator 224.

For the insulator 222, a single layer or a stack of an insulator containing a so-called high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) is preferably used, for example. As miniaturization and high integration of a transistor proceed, a problem such as leakage current may arise because of a reduction in the thickness of the gate insulator. When a high-k material is used for an insulator functioning as the gate insulator, a gate potential at the time of operating the transistor can be reduced while the physical thickness of the gate insulator is kept.

In particular, an insulator containing one or both of an oxide of aluminum and an oxide of hafnium, which is an insulating material having a function of inhibiting diffusion of impurities, oxygen, and the like, that is, an insulating material through which the oxygen is less likely to pass is preferably used. For the insulator containing one or both of an oxide of aluminum and an oxide of hafnium, aluminum oxide, hafnium oxide, an oxide containing aluminum and hafnium (hafnium aluminate), or the like is preferably used. When the insulator 222 formed using such a material, the insulator 222 functions as a layer that inhibits release of oxygen from the oxide semiconductor 230 and entry of impurities such as hydrogen from the periphery of the transistor 200 into the oxide semiconductor 230.

Alternatively, to these insulators, aluminum oxide, bismuth oxide, germanium oxide, niobium oxide, silicon oxide, titanium oxide, tungsten oxide, yttrium oxide, or zirconium oxide may be added, for example. Alternatively, these insulators may be subjected to nitriding treatment. Silicon oxide, silicon oxynitride, or silicon nitride may be stacked over the insulator.

It is preferable that the insulator 220 be thermally stable. For example, as silicon oxide and silicon oxynitride have thermal stability, combination of an insulator with a high-k material and the insulator 220 allows the stacked-layer structure to be thermally stable and have a high dielectric constant.

Note that the insulator 220, the insulator 222, and the insulator 224 may each have a stacked-layer structure of two or more layers. In that case, the stacked layers are not necessarily formed from the same material and may be formed from different materials.

The oxide semiconductor 230 includes the oxide semiconductor 230a, the oxide semiconductor 230b over the oxide semiconductor 230a, and the oxide semiconductor 230c over the oxide semiconductor 230b. When the oxide semiconductor 230a is provided below the oxide semiconductor 230b, impurities can be inhibited from being diffused into the oxide semiconductor 230b from the structures formed below the oxide semiconductor 230a. When the oxide semiconductor 230c is provided over the oxide semiconductor 230b, impurities can be inhibited from being diffused into the oxide semiconductor 230b from the structures formed above the oxide semiconductor 230c.

The oxide semiconductor 230 preferably has a stacked-layer structure of oxides whose atomic ratio of metal elements is different. Specifically, the atomic ratio of the element M to constituent elements in the metal oxide used as the oxide semiconductor 230a is preferably greater than that in the metal oxide used as the oxide semiconductor 230b. Moreover, the atomic ratio of the element M to In in the metal oxide used as the oxide semiconductor 230a is preferably greater than that in the metal oxide used as the oxide semiconductor 230b. Moreover, the atomic ratio of In to the element M in the metal oxide used as the oxide semiconductor 230b is preferably greater than that in the metal oxide used as the oxide semiconductor 230a. As the oxide semiconductor 230c, a metal oxide which can be used as the oxide semiconductor 230a or the oxide semiconductor 230b can be used.

The energy of the conduction band minimum of the oxide semiconductor 230a and the oxide semiconductor 230c is preferably higher than that of the oxide semiconductor 230b. In other words, the electron affinity of the oxide semiconductor 230a and the oxide semiconductor 230c is preferably lower than that of the oxide semiconductor 230b.

The conduction band minimum gradually changes at a junction portion of the oxide semiconductor 230a, the oxide semiconductor 230b, and the oxide semiconductor 230c. In other words, the conduction band minimum at a junction portion of the oxide semiconductor 230a, the oxide semiconductor 230b, and the oxide semiconductor 230c continuously changes or is continuously connected. To obtain this, the density of defect states in a mixed layer formed at an interface between the oxide semiconductor 230a and the oxide semiconductor 230b, and an interface between the oxide semiconductor 230b and the oxide semiconductor 230c is preferably made low.

Specifically, when the oxide semiconductor 230a and the oxide semiconductor 230b or the oxide semiconductor 230b and the oxide semiconductor 230c contain the same element (as a main component) in addition to oxygen, a mixed layer with a low density of defect states can be formed. For example, when the oxide semiconductor 230b is an In—Ga—Zn oxide, it is preferable to use an In—Ga—Zn oxide, a Ga—Zn oxide, gallium oxide, or the like as the oxide semiconductor 230a and the oxide semiconductor 230c.

At this time, the oxide semiconductor 230b serves as a main carrier path. When the oxide semiconductor 230a and the oxide semiconductor 230c have the above structure, the density of defect states at the interface between the oxide semiconductor 230a and the oxide semiconductor 230b and the interface between the oxide semiconductor 230b and the oxide semiconductor 230c can be made low. Thus, the influence of interface scattering on carrier conduction is small, and the transistor 200 can have a high on-state current.

The oxide semiconductor 230 includes the region 231, the region 232, and the region 234. At least part of the region 231 includes a region close to the insulator 273. The region 232 includes at least a region overlapping with the insulator 275.

When the transistor 200 is brought to be an on state, the region 231a or the region 231b functions as the source region or the drain region. On the other hand, at least part of the region 234 functions as a channel formation region. When the region 232 is provided between the region 231 and the region 234, the transistor 200 can have a high on-state current and a low off-state current.

When the region 232 is provided in the transistor 200, high-resistance regions are not formed between the region 231 functioning as the source region and the drain region and the region 234 functioning as a channel formation region, so that the on-state current and the mobility of the transistor can be increased. The conductor 260 functioning as the first gate electrode does not overlap with the source region and the drain region in the channel length direction owing to the region 232; thus, formation of unnecessary capacitance between them can be suppressed. Furthermore, off-state current can be reduced owing to the region 232.

For example, as an oxide semiconductor to be the region 234, an oxide semiconductor having a band gap of 2 eV or more, preferably 2.5 eV or more, is preferably used. With the use of an oxide semiconductor having such a wide band gap, the off-state current of the transistor can be reduced.

The insulator 250 functions as a gate insulator. The insulator 250 is preferably positioned in contact with the top surface of the oxide semiconductor 230c. The insulator 250 is preferably formed using an insulator from which oxygen is released by heating. The insulator 250 is an oxide film of which the amount of released oxygen converted into oxygen molecules is greater than or equal to $1.0\times10^{18}$ atoms/cm$^3$, preferably greater than or equal to $1.0\times10^{19}$ atoms/cm$^3$, more preferably $2.0\times10^{19}$ atoms/cm$^3$ or $3.0\times10^{20}$ atoms/cm$^3$ in thermal desorption spectroscopy (TDS analysis), for example. Note that the temperature of the film surface in the TDS analysis is preferably higher than or equal to 100° C. and lower than or equal to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator from which oxygen is released by heating is provided, as the insulator 250, in contact with the top surface of the oxide semiconductor 230c, oxygen can be effectively supplied from the insulator 250 to the region 234 of the oxide semiconductor 230b. As in the insulator 224, the concentration of impurities such as water and hydrogen in the insulator 250 is preferably lowered. The thickness of the insulator 250 is preferably greater than or equal to 1 nm and less than or equal to 20 nm.

Furthermore, in order to supply excess oxygen of the insulator 250 to the oxide semiconductor 230 efficiently, the metal oxide 252 may be provided. Therefore, the metal oxide 252 preferably inhibits diffusion of oxygen from the insulator 250. Provision of the metal oxide 252 that inhibits diffusion of oxygen inhibits diffusion of excess oxygen from the insulator 250 to the conductor 260. That is, reduction in the amount of excess oxygen that is supplied to the oxide semiconductor 230 can be inhibited. Moreover, oxidization of the conductor 260 due to excess oxygen can be suppressed.

Note that the metal oxide 252 may function as part of the first gate electrode. For example, an oxide semiconductor that can be used as the oxide semiconductor 230 can be used as the metal oxide 252. In this case, when the conductor 260 is formed by a sputtering method, the metal oxide 252 can have a reduced electric resistance to be a conductor. Such a conductor can be referred to as an OC (Oxide Conductor) electrode.

Note that the metal oxide 252 has a function of a part of the gate insulator in some cases. Therefore, when silicon oxide, silicon oxynitride, or the like is used for the insulator 250, a metal oxide that is a high-k material with a high dielectric constant is preferably used as the metal oxide 252. Such a stacked-layer structure can be thermally stable and can have a high dielectric constant. Thus, a gate potential that is applied during operation of the transistor can be reduced while the physical thickness is kept. In addition, the equivalent oxide thickness (EOT) of an insulator functioning as the gate insulator can be reduced.

Although the metal oxide 252 in the transistor 200 is shown as a single layer, the metal oxide 252 may have a stacked-layer structure of two or more layers. For example, a metal oxide functioning as part of a gate electrode and a metal oxide functioning as part of a gate insulator may be stacked.

With the metal oxide 252 functioning as a gate electrode, the on-state current of the transistor 200 can be increased without a reduction in the influence of the electric field generated from the conductor 260. With the metal oxide 252 functioning as a gate insulator, the distance between the conductor 260 and the oxide semiconductor 230 is kept by the physical thicknesses of the insulator 250 and the metal oxide 252, so that leakage current between the conductor 260 and the oxide semiconductor 230 can be reduced. Thus, with the stacked-layer structure of the insulator 250 and the metal oxide 252, the physical distance between the conductor 260 and the oxide semiconductor 230 and the intensity of electric field applied from the conductor 260 to the oxide semiconductor 230 can be easily adjusted as appropriate.

Specifically, a metal oxide obtained by reducing the resistance of an oxide semiconductor that can be used as the oxide semiconductor 230 can be used as the metal oxide 252. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulator containing one or both of an oxide of aluminum and an oxide of hafnium, for example, aluminum oxide, hafnium oxide, or an oxide containing aluminum and hafnium (hafnium aluminate). In particular, hafnium aluminate has higher heat resistance than hafnium oxide. Thus, it is preferable as it is less likely to be crystallized by a thermal budget in a later step. Note that the metal oxide 252 is not an essential structure. Design is appropriately set in consideration of required transistor characteristics.

The conductor 260 functioning as the first gate electrode includes the conductor 260a and the conductor 260b over the conductor 260a. A conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom is preferably used for the conductor 260a, like the first conductor of the conductor 205. Alternatively, a conductive material having a function of inhibiting diffusion of at least one kind of oxygen such as oxygen atoms and oxygen molecules is preferably used.

When the conductor 260a has a function of inhibiting diffusion of oxygen, the conductivity of the conductor 260b can be inhibited from being lowered because of oxidization due to excess oxygen contained in the insulator 250 and the metal oxide 252. As a conductive material having a function of inhibiting diffusion of oxygen, for example, tantalum, tantalum nitride, ruthenium, ruthenium oxide, or the like is preferably used.

Furthermore, for the conductor 260b, a conductive material including tungsten, copper, or aluminum as its main component is preferably used. The conductor 260 functions as a wiring, and thus, a conductor having high conductivity is preferably used. For example, a conductive material containing tungsten, copper, or aluminum as its main component can be used. The conductor 260b may have a stacked-layer structure; for example, a stack of the above conductive material and titanium or titanium nitride may be employed.

In the case where the conductor 205 extends beyond the end portion of the oxide semiconductor 230, which intersects with the channel width direction as illustrated in FIG. 19(A), the conductor 260 preferably overlaps with the conductor 205 with the insulator 250 therebetween in the region. That is, a stacked-layer structure of the conductor 205, the insulator 250, and the conductor 260 is preferably formed outside the side surface of the oxide semiconductor 230.

With the above structure, in the case where potentials are applied to the conductor 260 and the conductor 205, an electric field generated from the conductor 260 and an electric field generated from the conductor 205 are connected, so that the channel formation region in the oxide semiconductor 230 can be covered.

That is, the region 234 functioning as a channel formation region can be electrically surrounded by the electric field of the conductor 260 having a function of the first gate electrode and the electric field of the conductor 205 having a function of the second gate electrode.

Furthermore, the insulator 270 functioning as a barrier film may be positioned over the conductor 260b. For the insulator 270, an insulating material having a function of inhibiting the passage of oxygen and impurities such as water or hydrogen is preferably used. For example, aluminum oxide or hafnium oxide is preferably used. Thus, oxidization of the conductor 260 due to oxygen above the insulator 270 can be inhibited. Moreover, entry of impurities such as water or hydrogen from above the insulator 270 into the oxide semiconductor 230 through the conductor 260 and the insulator 250 can be inhibited.

The insulator 271 functioning as a hard mask is preferably positioned over the insulator 270. By providing the insulator 271, the conductor 260 can be processed to have the side surface that is substantially vertical; specifically, an angle formed by the side surface of the conductor 260 and a surface of the substrate can be greater than or equal to 75° and less than or equal to 100°, preferably greater than or equal to 80° and less than or equal to 95°. When the conductor 260 is processed into such a shape, the insulator 275 that is subsequently formed can be formed into a desired shape.

An insulating material having a function of inhibiting the passage of oxygen and impurities such as water or hydrogen may be used for the insulator 271 so that the insulator 271 also functions as a barrier film. In that case, the insulator 270 does not have to be provided.

The insulator 275 functioning as a buffer layer is provided in contact with the side surface of the oxide semiconductor 230c, the side surface of the insulator 250, the side surface of the metal oxide 252, the side surface of the conductor 260, and the side surface of the insulator 270.

For example, as the insulator 275, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably included. In particular, silicon oxide and silicon oxynitride, which have thermal stability, are preferable. In particular, silicon oxide and porous silicon oxide, in which an excess oxygen region can be formed easily in a later step, are preferable.

The insulator 275 preferably includes an excess oxygen region. When an insulator from which oxygen is released by heating is provided as the insulator 275 in contact with the oxide semiconductor 230c and the insulator 250, oxygen can be effectively supplied from the insulator 250 to the region 234 of the oxide semiconductor 230b. The concentration of impurities such as water or hydrogen in the film of the insulator 275 is preferably lowered.

The insulator 273 is provided over at least the layer 242 and the insulator 275. When the insulator 273 is formed by a sputtering method, an excess oxygen region can be provided in the insulator 275. Therefore, oxygen can be supplied from the excess oxygen region to the oxide semiconductor 230. When the insulator 273 is provided over the layer 242 of the oxide semiconductor 230, hydrogen in the oxide semiconductor 230 can be extracted to the insulator 273.

For example, a metal oxide containing one kind or two or more kinds selected from hafnium, aluminum, gallium, yttrium, zirconium, tungsten, titanium, tantalum, nickel, germanium, magnesium, and the like can be used as the insulator 273.

In particular, aluminum oxide has a high barrier property, so that even a thin aluminum oxide film having a thickness of greater than or equal to 0.5 nm and less than or equal to 3.0 nm can inhibit diffusion of hydrogen and nitrogen.

The insulator 274 is provided over the insulator 273. For the insulator 274, a film having a barrier property and a reduced hydrogen concentration is preferably used. For example, silicon nitride oxide, silicon nitride, silicon oxide to which fluorine is added, or the like is preferably used for the insulator 274. By providing the insulator 273 having a barrier property and the insulator 274 having a barrier property, impurities can be inhibited from diffusing into the transistor 200 from another structure body such as an interlayer film.

The insulator 280 functioning as an interlayer film is preferably provided over the insulator 274. As in the insulator 224 or the like, the concentration of impurities such as water or hydrogen in the film of the insulator 280 is preferably lowered. Note that an insulator similar to the insulator 210 may be provided over the insulator 280. When the insulator is formed by a sputtering method, the amount of impurities in the insulator 280 can be reduced.

The conductor 240a is formed in contact with inner walls of the openings in the insulator 280, the insulator 274, and the insulator 273. Here, the conductor 240a preferably includes a region overlapping with the side surface of the oxide semiconductor 230b as illustrated in FIG. 19(B). It is particularly preferable that the conductor 240a include a region overlapping with one or both of the side surface of the oxide semiconductor 230b on the A5 side and the side surface of the oxide semiconductor 230b on the A6 side, which intersect with the channel width direction of the oxide semiconductor 230b. Moreover, the conductor 240a may have a structure overlapping with the side surface of the oxide semiconductor 230b on the A1 side (A2 side), which intersects with the channel length direction of the oxide semiconductor 230b. With such a structure in which the conductor 240a includes a region overlapping with the side surface of the oxide semiconductor 230b, the contact area of a contact portion between the conductor 240a and the transistor 200 can be increased without increasing the projected area of the contact portion, so that the contact resistance between the conductor 240a and the transistor 200 can be reduced. Accordingly, the transistor can have a higher on-state current. The same applies to the conductor 240b.

For the conductor 240a and the conductor 240b, a conductive material containing tungsten, copper, or aluminum as its main component is preferably used. The conductor 240a and the conductor 240b may have a stacked-layer structure.

When openings are formed in the insulator 280, the insulator 274, and the insulator 273, for example, the low-resistance region in the region 231 of the oxide semiconductor 230 is removed and the oxide semiconductor 230 whose resistance is not lowered is exposed in some cases. In that case, as a conductor used as a conductor of the conductor 240 that is in contact with the oxide semiconductor 230 (hereinafter also referred to as a first conductor of the conductor 240), a metal film, a nitride film containing a metal element, or an oxide film containing a metal element is preferably used. When the oxide semiconductor 230 whose resistance is not lowered is in contact with the first conductor of the conductor 240, oxygen vacancies are formed in the metal compound or the oxide semiconductor 230, whereby the resistance of the region 231 of the oxide semiconductor 230 is reduced. The reduction in the resistance of the oxide semiconductor 230 that is in contact with the first conductor of the conductor 240 can reduce contact resistance between the oxide semiconductor 230 and the conductor 240. Therefore, the first conductor of the conductor 240 preferably contains a metal element such as aluminum, titanium, tantalum, or tungsten.

In the case where the conductor 240 has a stacked-layer structure, a conductive material having a function of inhibiting the passage of impurities such as water or hydrogen is preferably used for a conductor in contact with the insulator 280, the insulator 274, and the insulator 273, like the first conductor of the conductor 205, for example. For example, tantalum, tantalum nitride, titanium, titanium nitride, ruthenium, ruthenium oxide, or the like is preferably used. The conductive material having a function of inhibiting the passage of impurities such as water or hydrogen may be used as a single layer or a stack. With use of the conductive material, impurities such as hydrogen or water can be inhibited from entering the oxide semiconductor 230 through the conductor 240 from a layer above the insulator 280.

As a substrate over which the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. Moreover, a semiconductor substrate in which an insulator region is included in the above semiconductor substrate, e.g., an SOI (Silicon On Insulator) substrate or the like is given. Examples of the conductor substrate include a graphite substrate, a metal substrate, an alloy substrate, and a conductive resin substrate. A substrate including a metal nitride, a substrate including a metal oxide, or the like is given. Moreover, an insulator substrate provided with a conductor or a semiconductor, a semiconductor substrate provided with a conductor or an insulator, a conductor substrate provided with a semiconductor or an insulator, and the like are given. Alternatively, any of these substrates over which an element is provided may be used. Examples of the element provided over the substrate include a capacitor, a resistor, a switching element, a light-emitting element, and a memory element.

Alternatively, a flexible substrate may be used as the substrate. Note that as a method for providing a transistor over a flexible substrate, there is a method in which a transistor is fabricated over a non-flexible substrate and then is separated from the non-flexible substrate and transferred to the substrate that is a flexible substrate. In that case, a separation layer is preferably provided between the non-flexible substrate and the transistor. In addition, the substrate may have elasticity. Furthermore, the substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate has a small thickness, the weight of the memory device including the transistor can be reduced. Moreover, when the substrate has a small thickness, even in the case of using glass or the like, the substrate may have elasticity or a property of returning to its original shape when bending or pulling is stopped. Thus, an impact applied to a memory device over the substrate, which is caused by dropping or the like, can be reduced. That is, a durable memory device can be provided.

For the substrate that is a flexible substrate, for example, a metal, an alloy, a resin, glass, or fiber thereof can be used. Note that as the substrate, a sheet, a film, a foil or the like that contains a fiber may be used. The substrate that is a flexible substrate preferably has a lower coefficient of linear expansion because deformation due to an environment is inhibited. For the substrate that is a flexible substrate, for example, a material whose coefficient of linear expansion is lower than or equal to $1\times10^{-3}$/K, lower than or equal to $5\times10^{-5}$/K, or lower than or equal to $1\times10^{-5}$/K is used. Examples of the resin include polyester, polyolefin, polyamide (nylon, aramid, or the like), polyimide, polycarbonate, and acrylic. In particular, aramid is suitable for the flexible substrate because of its low coefficient of linear expansion.

The structure, composition, method, and the like described above in this embodiment can be used in appropriate combination with the structures, compositions, methods, and the like described in the other embodiments.

Embodiment 5

In this embodiment, examples of electronic components and electronic devices that include the memory device described in the above embodiment will be described.

<Electronic Components>

First, examples of electronic components including the memory device 100 will be described with reference to FIGS. 21(A) and 21(B).

Figure 21A:
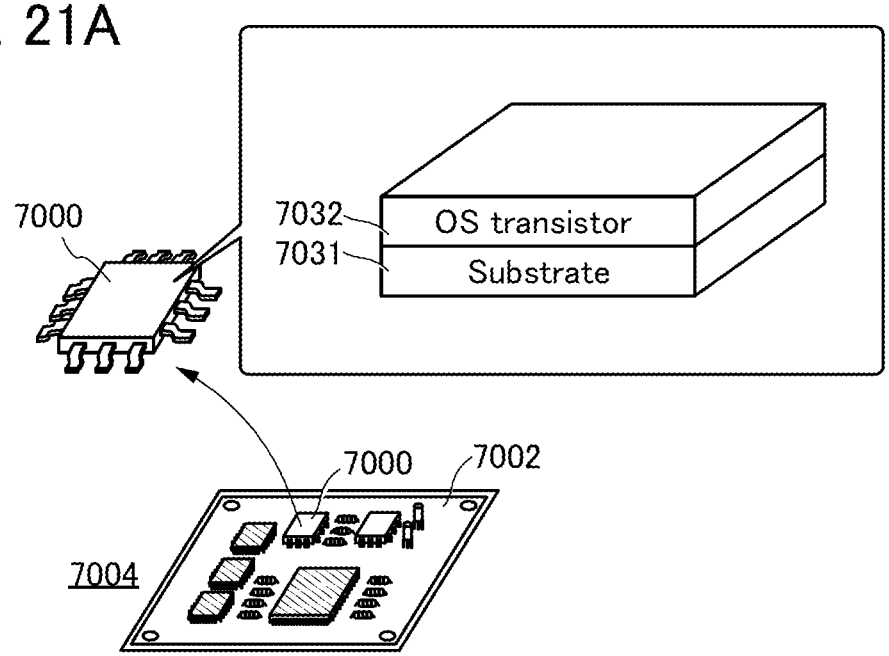
FIGS. 21A and 21B Schematic views illustrating examples of electronic components.

An electronic component 7000 illustrated in FIG. 21(A) is an IC chip and includes a lead and a circuit portion. The electronic component 7000 is mounted on a printed circuit board 7002, for example. A plurality of such IC chips are combined and electrically connected to each other on the printed circuit board 7002, whereby a mounting board 7004, a substrate on which electronic components are mounted, is completed.

The circuit portion of the electronic component 7000 is formed of a stack of a substrate 7031 and a layer 7032.

A material that can be used for the substrate where the transistor 200 described in Embodiment 2 is formed is used for the substrate 7031. In the case where a semiconductor substrate of silicon or the like is used as the substrate 7031, an integrated circuit may be formed on the substrate 7031, and the layer 7032 including an OS transistor may be formed thereover.

The layer 7032 includes the OS transistor described in the above embodiment. For example, the memory device 100 described in Embodiment 1 can be provided over the substrate 7031 and the layer 7032.

An OS transistor can be provided by being stacked over other semiconductor elements, and thus the electronic component 7000 can be reduced in size.

A memory such as a ReRAM (Resistive Random Access Memory), an MRAM (Magnetoresistive Random Access Memory), a PRAM (Phase change RAM), or an FeRAM (Ferroelectric RAM) may be provided above the layer 7032 of the electronic component 7000.

Although a QFP (Quad Flat Package) is used as a package of the electronic component 7000 in FIG. 21(A), the embodiment of the package is not limited thereto.

Figure 21B:
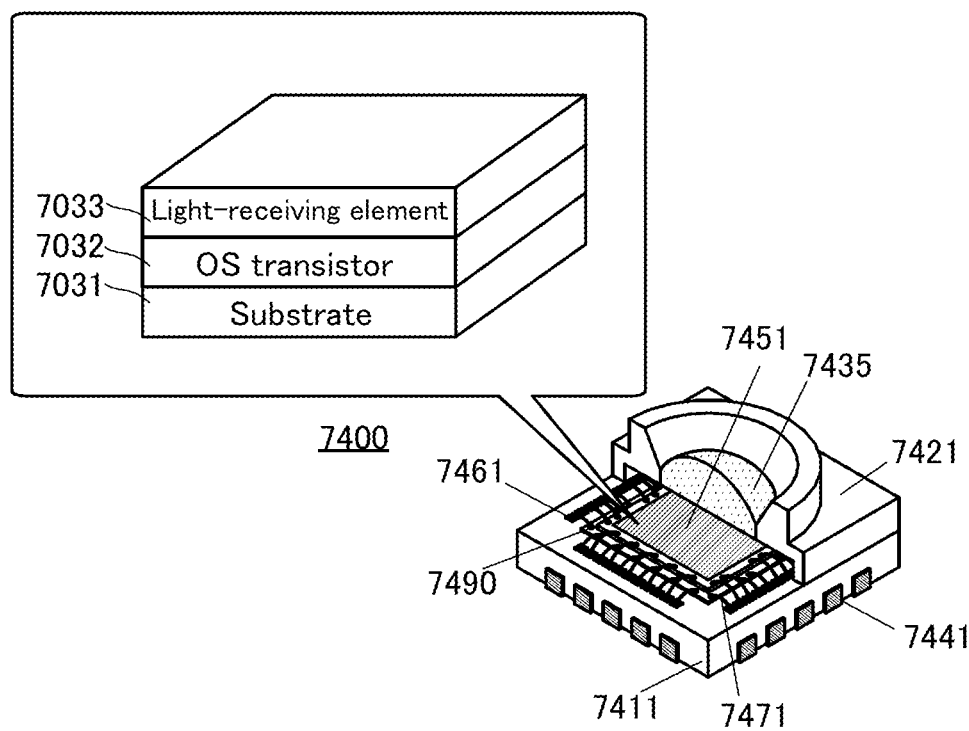

FIG. 21(B) is a schematic view of an electronic component 7400. The electronic component 7400 is a camera module and includes an image sensor chip 7451. The electronic component 7400 includes a package substrate 7411 to which an image sensor chip 7451 is fixed, a lens cover 7421, a lens 7435, and the like. Furthermore, an IC chip 7490 having functions of a driver circuit, a signal conversion circuit, and the like of an imaging device is provided between the package substrate 7411 and the image sensor chip 7451; thus, the structure as an SiP (System in Package) is included. The lands 7441 are electrically connected to electrode pads 7461, and the electrode pads 7461 are electrically connected to the image sensor chip 7451 or the IC chip 7490 through wires 7471. Parts of the lens cover 7421 and the lens 7435 are not illustrated in FIG. 21(B) to illustrate the inside of the electronic component 7400.

The circuit portion of the image sensor chip 7451 is formed of a stack of the substrate 7031, the layer 7032, and the layer 7033.

Refer to the description of the electronic component 7000 for the details of the substrate 7031 and the layer 7032.

The layer 7033 includes a light-receiving element. As the light-receiving element, for example, a pn-junction photodiode using a selenium-based material for a photoelectric conversion layer, or the like can be used. A photoelectric conversion element using a selenium-based material has high external quantum efficiency with respect to visible light; thus, an optical sensor with high sensitivity can be obtained.

A selenium-based material can be used as a p-type semiconductor. As a selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor of the pn-junction photodiode is preferably formed with a material having a wide band gap and a visible-light-transmitting property. For example, zinc oxide, gallium oxide, indium oxide, tin oxide, or a mixed oxide thereof can be used.

As the light-receiving element included in the layer 7033, a pn-junction photodiode using a p-type silicon semiconductor and an n-type silicon semiconductor may be used. The light-receiving element may be a pin-junction photodiode in which an i-type silicon semiconductor layer is provided between a p-type silicon semiconductor and an n-type silicon semiconductor.

The photodiode using silicon can be formed using single crystal silicon. In that case, electrical bonding between the layer 7032 and the layer 7033 is preferably obtained through a bonding process. The photodiode using silicon can also be formed using a thin film of amorphous silicon, microcrystalline silicon, polycrystalline silicon, or the like.

<Electronic Devices>

Next, examples of electronic devices including the above electronic components will be described with reference to FIG. 22 and FIG. 23.

Figure 22A:
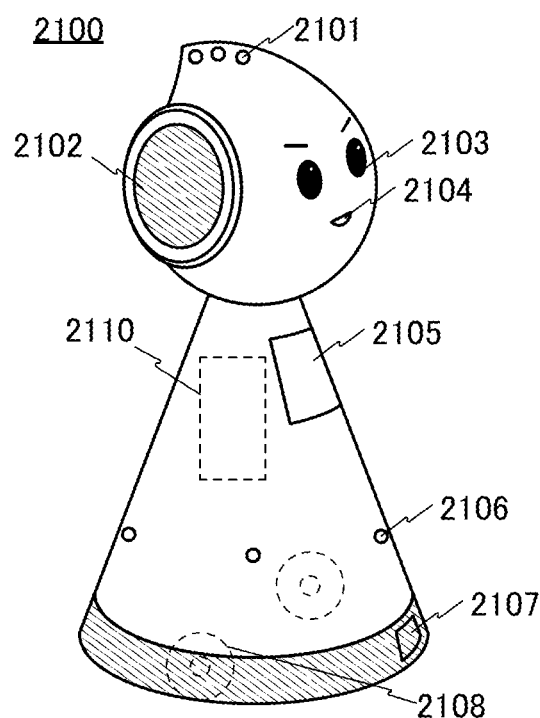
FIGS. 22A-22E Schematic views illustrating examples of electronic devices.

A robot 2100 illustrated in FIG. 22(A) includes an arithmetic logic unit 2110, an illuminance sensor 2101, a microphone 2102, an upper camera 2103, a speaker 2104, a display 2105, a lower camera 2106, an obstacle sensor 2107, and a moving mechanism 2108.

The above electronic components can be used for the arithmetic logic unit 2110, the illuminance sensor 2101, the upper camera 2103, the display 2105, the lower camera 2106, the obstacle sensor 2107, and the like of the robot 2100.

The microphone 2102 has a function of detecting a speaking voice of a user, an environmental sound, and the like. The speaker 2104 has a function of outputting sound. The robot 2100 can interact with a user using the microphone 2102 and the speaker 2104.

The display 2105 has a function of displaying various kinds of information. The robot 2100 can display information desired by a user on the display 2105. The display 2105 may be provided with a touch panel.

The upper camera 2103 and the lower camera 2106 have a function of shooting an image of the surroundings of the robot 2100. The obstacle sensor 2107 can detect an obstacle in the direction where the robot 2100 advances with the moving mechanism 2108. The robot 2100 can move safely by recognizing the surrounding environment with the upper camera 2103, the lower camera 2106, and the obstacle sensor 2107.

Figure 22B:
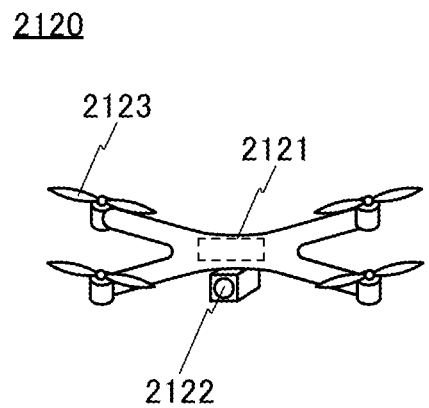

A flying object 2120 illustrated in FIG. 22(B) includes an arithmetic device 2121, a propeller 2123, and a camera 2122 and has a function of flying autonomously.

The above electronic component can be used for the arithmetic device 2121 and the camera 2122 of the flying object 2120.

Figure 22C:
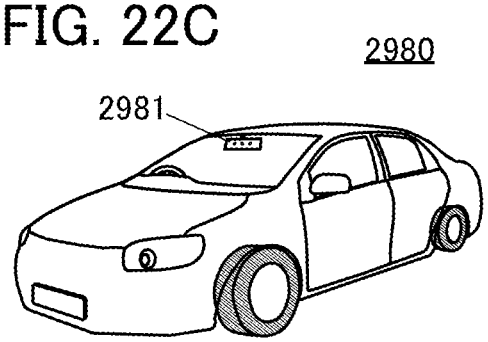

FIG. 22(C) is an external view illustrating an example of an automobile. An automobile 2980 includes a camera 2981 and the like. The automobile 2980 also includes various kinds of sensors and the like such as an infrared radar, a millimeter wave radar, and a laser radar. The automobile 2980 can analyze an image shot by the camera 2981 to determine traffic condition therearound, such as the presence of a pedestrian, and thus can perform automatic driving.

In the automobile 2980, the electronic component described above can be used for the camera 2981.

Figure 22D:
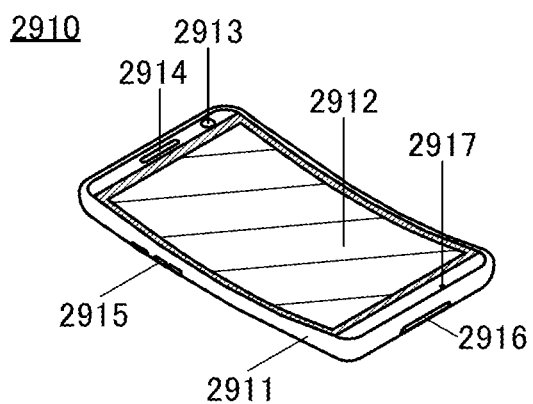

An information terminal 2910 illustrated in FIG. 22(D) includes a housing 2911, a display portion 2912, a microphone 2917, a speaker portion 2914, a camera 2913, an external connection portion 2916, an operation switch 2915, and the like. The display portion 2912 includes a display panel and a touch screen that use a flexible substrate. The information terminal 2910 also includes an antenna, a battery, and the like inside the housing 2911. The information terminal 2910 can be used as, for example, a smartphone, a mobile phone, a tablet information terminal, a tablet personal computer, or an e-book reader. The above electronic components can be used for a memory device and the camera 2913 inside the information terminal 2910.

Figure 22E:
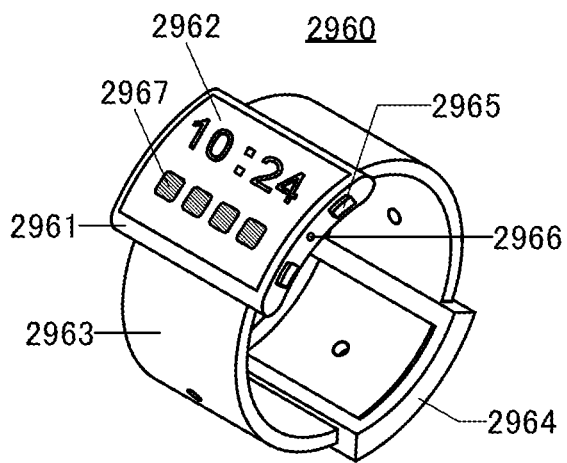

FIG. 22(E) illustrates an example of a watch-type information terminal. An information terminal 2960 includes a housing 2961, a display portion 2962, a band 2963, a buckle 2964, operation switches 2965, an input-output terminal 2966, and the like. The information terminal 2960 also includes an antenna, a battery, and the like inside the housing 2961. The information terminal 2960 is capable of executing a variety of applications such as mobile phone calls, e-mailing, viewing and editing text, music reproduction, Internet communication, and a computer game. The above electronic components can be used for a memory device inside the information terminal 2960.

Figure 23:
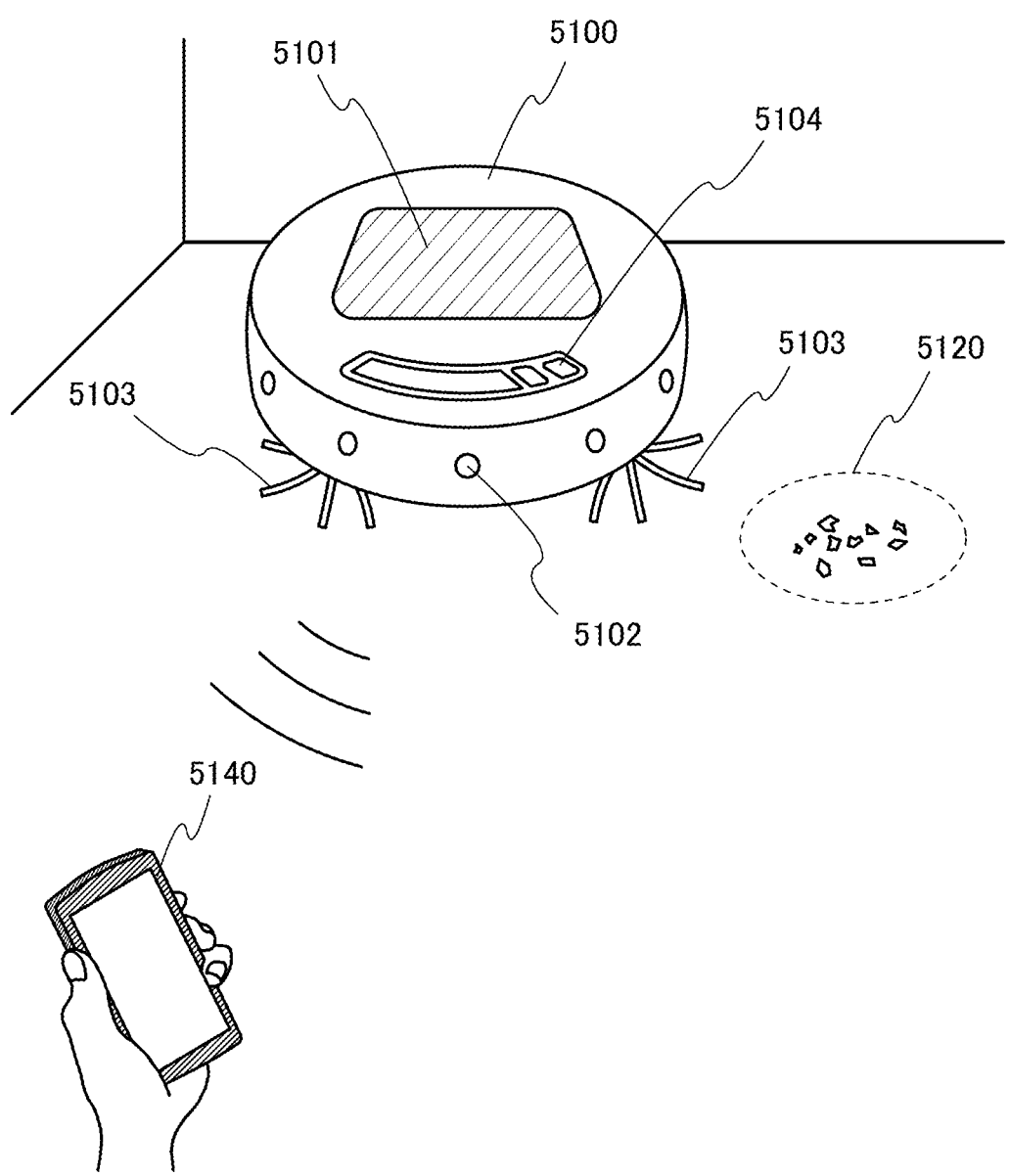
FIG. 23 A schematic view illustrating an example of an electronic device.

FIG. 23 is a schematic view illustrating an example of a cleaning robot.

A cleaning robot 5100 includes a display 5101 placed on its top surface, a plurality of cameras 5102 placed on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The above electronic components can be used for the cameras 5102.

The cleaning robot 5100 is self-propelled, detects dust 5120, and sucks up the dust through the inlet provided on the bottom surface.

The cleaning robot 5100 can detect an obstacle such as a wall, furniture, or a step by analyzing images shot by the cameras 5102. When an object that is likely to be caught in the brush 5103, such as a wire, is detected by image analysis, the rotation of the brush 5103 can be stopped.

The display 5101 can display the remaining capacity of a battery, the amount of collected dust, and the like. The display 5101 may display a path on which the cleaning robot 5100 has run. The display 5101 may be a touch panel, and the operation buttons 5104 may be provided on the display 5101.

The cleaning robot 5100 can interact with a portable electronic device 5140 such as a smartphone. The portable electronic device 5140 can display images shot by the cameras 5102. Accordingly, an owner of the cleaning robot 5100 can monitor the room even from the outside.

Embodiment 6

Figure 24:
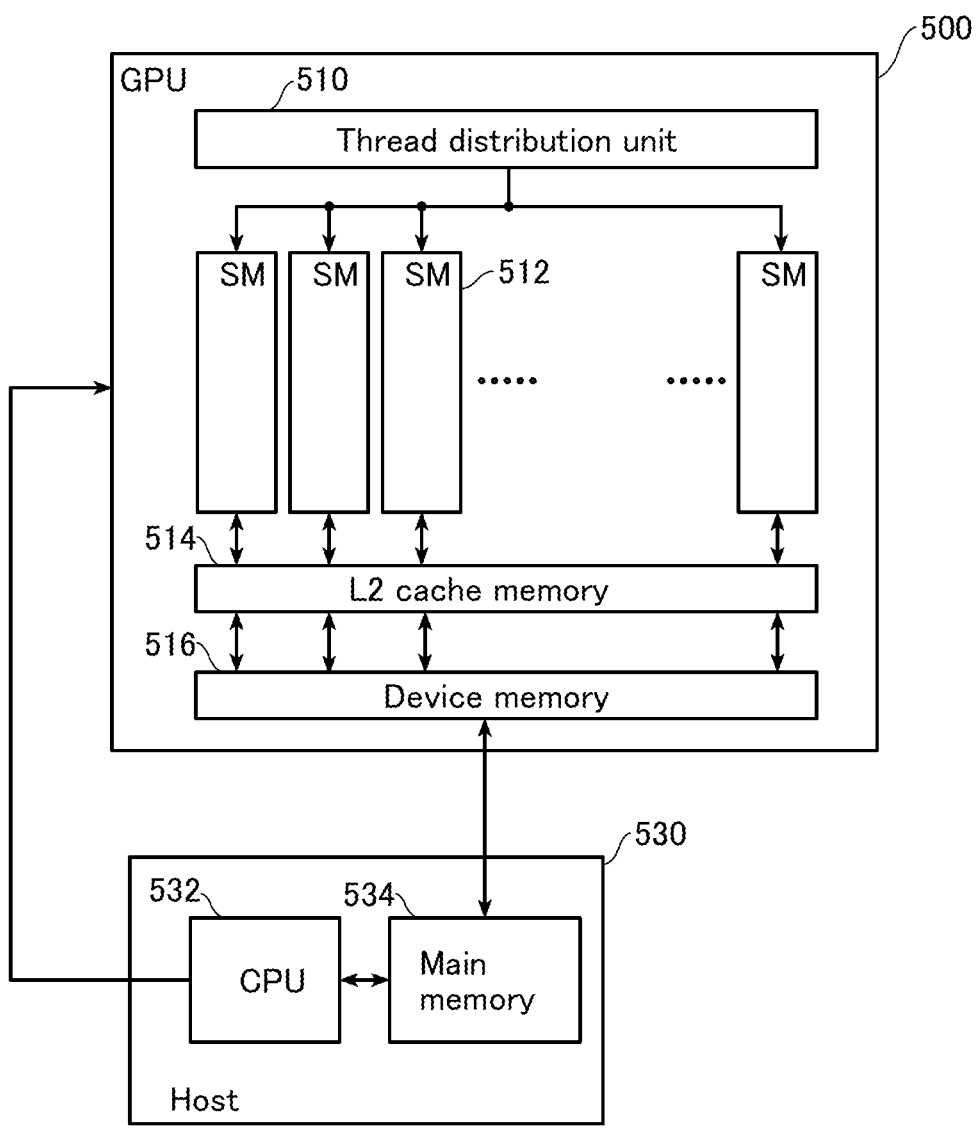
FIG. 24 A functional block diagram illustrating a configuration example of a GPU.

This embodiment will describe a GPU (Graphics Processing Unit) including the memory device 100 described in Embodiment 1. FIG. 24 is a functional block diagram illustrating a configuration example of a GPU.

The GPU 500 illustrated in FIG. 24 includes a thread distribution unit 510, a plurality of streaming multiprocessors (SMs) 512, an L2 (level 2) cache memory 514, and a device memory 516.

The memory device 100 described above is used as the device memory 516. The device memory 516 stores a program (also referred to as kernel or a kernel program) executed by the GPU 500 and data processed by the GPU 500. In response to an instruction of a CPU 532 included in a host 530, the GPU 500 starts kernel and processes data. Data processed by the GPU 500 is written to the device memory 516 and transferred to a main memory 534 of the CPU 532. Data transfer between the main memory 534 and the device memory 516 is controlled by the CPU 532.

The memory device 100 described above may be used as the main memory 534.

The thread distribution unit 510 assigns a thread block composed of a plurality of threads to an available SM 512. Here, thread means the minimum executable unit in kernel.

The SMs 512 can execute a number of threads concurrently. For example, the SMs 512 include an L1 cache memory, a shared memory, a register, an instruction issuing unit, a plurality of processor cores (also referred to as streaming processor cores), and a plurality of transcendental function arithmetic units. To make use of a massively parallel arithmetic processing function of the GPU 500, the SMs 512 may be provided with a plurality of arithmetic units for deep learning.

The L2 cache memory 514 is shared by the SMs 512 in the GPU 500. Data loading and data storing are performed between the L2 cache memory 514 and the L1 caches of the SMs 512. The L2 cache memory 514 is provided as appropriate. In the case where the L2 cache memory 514 is not provided, data loading and data storing are performed between the device memory 516 and the L1 caches.

The use of the memory device 100 described above for the GPU can reduce the power consumption of the GPU. For example, in the case where a large-scale calculation of an artificial neural network or the like is performed in the GPU, the GPU requires high power, and thus, a chip generates high-temperature heat. The use of the memory device 100 described above for the GPU can reduce power and inhibit heat generation of the chip.

The structure described above in this embodiment can be used in combination with the structures described in the other embodiments as appropriate.

Unless otherwise specified, an on-state current in this specification refers to the drain current of a transistor in an on state. Unless otherwise specified, the on state (abbreviated as on in some case) of an n-channel transistor means that the voltage ($V_G$) between its gate and source is higher than or equal to the threshold voltage ($V_{th}$), and the on state of a p-channel transistor means that $V_G$ is lower than or equal to $V_{th}$. For example, the on-state current of an n-channel transistor refers to a drain current that flows when $V_G$ is higher than or equal to $V_{th}$. Furthermore, the on-state current of a transistor depends on voltage between a drain and a source ($V_D$) in some cases.

Unless otherwise specified, an off-state current in this specification refers to the drain current of a transistor in an off state. Unless otherwise specified, the off state (abbreviated as off in some cases) of an n-channel transistor means that $V_G$ is lower than $V_{th}$, and the off state of a p-channel transistor means that $V_G$ is higher than $V_{th}$. For example, the off-state current of an n-channel transistor refers to a drain current that flows when $V_G$ is lower than $V_{th}$. The off-state current of a transistor depends on $V_G$ in some cases. Thus, the off-state current of a transistor lower than $10^{-21}$ A may mean that there is $V_G$ at which the off-state current of the transistor is lower than $10^{-21}$ A.

Furthermore, the off-state current of a transistor depends on $V_D$ in some cases. Unless otherwise specified, an off-state current in this specification may refer to an off-state current at $V_D$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may refer to an off-state current at $V_D$ used in a semiconductor device or the like including the transistor.

In this specification and the like, voltage and potential can be interchanged with each other as appropriate. Voltage refers to a potential difference from a reference potential; when the reference potential is a ground potential, for example, voltage can be replaced with potential. The ground potential does not necessarily mean 0 V. Potentials are relative values, and the potential applied to a wiring or the like is changed depending on the reference potential, in some cases.

In this specification and the like, when there is an explicit description, X and Y are connected to each other, the case where X and Y are electrically connected to each other and the case where X and Y are directly connected to each other are regarded as being disclosed in this specification and the like.

Here, X and Y denote an object (e.g., a device, an element, a circuit, a wiring, an electrode, a terminal, a conductor, or a layer).

An example of the case where X and Y are directly connected to each other is the case where X and Y are connected to each other without an element that enables an electrical connection between X and Y (e.g., a switch, a transistor, a capacitor, an inductor, a resistor, a diode, a display element, a light-emitting element, or a load).

An example of the case where X and Y are electrically connected to each other is the case where one or more elements that enable an electrical connection between X and Y (e.g., a switch, a transistor, a capacitor, an inductor, a resistor, a diode, a display element, a light-emitting element, or a load) are connected between X and Y. Note that a switch has the function of determining whether current flows or not by being turned on or off.

Alternatively, the switch has a function of selecting and changing a current path. Note that the case where X and Y are electrically connected to each other includes the case where X and Y are directly connected to each other.

REFERENCE NUMERALS

1a: memory cell array, 1b: memory cell array, 1c: memory cell array, 1d: memory cell array, 1e: memory cell array, 1f: memory cell array, 1g: memory cell array, 1h: memory cell array, 2a: memory cell, 2b: memory cell, 2c: memory cell, 2d: memory cell, 3a: switch, 3b: switch, 3c: switch, 3d: switch, 4a: switch, 4b: switch, 4c: switch, 4d: switch, 5a: transistor, 5b: transistor, 5c: transistor, 5d: transistor, 6a: transistor, 6b: transistor, 6c: transistor, 6d: transistor, 10: cell, 20: circuit, 21: transistor, 22: transistor, 23: transistor, 24: transistor, 25: transistor, 26: transistor, 27: switch, 28: switch, 30: sense amplifier, 31: inverter, 32: inverter, 40a: transistor, 40b: transistor, 40c: transistor, 40d: transistor, 50: sense amplifier, 60: precharge circuit, 61: transistor, 62: transistor, 63: transistor, 70: amplifier circuit, 71: transistor, 72: transistor, 73: transistor, 74: transistor, 100: memory device, 110: cell array, 111: peripheral circuit, 112: control circuit, 115: peripheral circuit, 121: row decoder, 122: column decoder, 123: row driver, 124: column driver, 125: input circuit, 126: output circuit, 127: potential generation circuit, 141: PSW, 142: PSW, 150: power supply control portion, 151: DVFS control circuit, 152: regulator control circuit, 153: regulator, 154: oscillator circuit, 160: sensing circuit, 200: transistor, 203: conductor, 205: conductor, 210: insulator, 212: insulator, 214: insulator, 216: insulator, 220: insulator, 222: insulator, 224: insulator, 230: oxide semiconductor, 230a: oxide semiconductor, 230b: oxide semiconductor, 230c: oxide semiconductor, 231: region, 231a: region, 231b: region, 232: region, 232a: region, 232b: region, 234: region, 240: conductor, 240a: conductor, 240b: conductor, 242: layer, 250: insulator, 252: metal oxide, 260: conductor, 260a: conductor, 260b: conductor, 270: insulator, 271: insulator, 273: insulator, 274: insulator, 275: insulator, 280: insulator, 500: GPU, 510: thread distribution unit, 512: SM, 514: cache memory, 516: device memory, 530: host, 532: CPU, 534: main memory, 2100: robot, 2101: illuminance sensor, 2102: microphone, 2103: upper camera, 2104: speaker, 2105: display, 2106: lower camera, 2107: obstacle sensor, 2108: moving mechanism, 2110: arithmetic logic unit, 2120: flying object, 2121: arithmetic logic unit, 2122: camera, 2123: propeller, 2910: information terminal, 2911: housing, 2912: display portion, 2913: camera, 2914: speaker portion, 2915: operation switch, 2916: external connection portion, 2917: microphone, 2960: information terminal, 2961: housing, 2962: display portion, 2963: band, 2964: buckle, 2965: operation switch, 2966: input-output terminal, 2980: automobile, 2981: camera, 5100: cleaning robot, 5101: display, 5102: camera, 5103: brush, 5104: operation button, 5120: dust, 5140: portable electronic device, 7000: electronic component, 7002: printed circuit board, 7004: mounting board, 7031: substrate, 7032: layer, 7033: layer, 7400: electronic component, 7411: package substrate, 7421: lens cover, 7435: lens, 7441: land, 7451: image sensor chip, 7461: electrode pad, 7471: wire, 7490: IC chip

The invention claimed is:

1. A semiconductor device comprising:
a first layer; and
a second layer over the first layer,
wherein a memory cell comprises a first transistor and a capacitor;
wherein a switch comprises a third transistor;
wherein one of a source and a drain of the first transistor is electrically connected to the capacitor,
wherein the other of the source and the drain of the first transistor is electrically connected to a sense amplifier through the switch,
wherein the other of the source and the drain of the first transistor is electrically connected to a gate of a second transistor,
wherein the gate of the second transistor is electrically connected to one of a source and a drain of the second transistor through the switch,
wherein one of a source and a drain of the third transistor is electrically connected to the gate of the second transistor,
wherein the other of the source and the drain of the third transistor is electrically connected to the one of the source and the drain of the second transistor,
wherein the first layer comprises the switch, the second transistor, and the sense amplifier, and
wherein the second layer comprises the memory cell.

2. A semiconductor device comprising:
a first layer; and
a second layer over the first layer,
wherein the second layer comprises a memory cell comprising a first transistor and a capacitor,
wherein one of a source and a drain of the first transistor is electrically connected to the capacitor,
wherein the other of the source and the drain of the first transistor is electrically connected to a first wiring,
wherein the first layer comprises a second transistor and a third transistor,
wherein a gate of the second transistor is electrically connected to the first wiring, and
wherein one of a source and a drain of the second transistor is electrically connected to one of a source and a drain of the third transistor.

3. The semiconductor device according to claim 2, wherein the first layer comprises a sense amplifier.

* * * * *